(12) United States Patent
Muto et al.

(10) Patent No.: US 10,811,345 B2
(45) Date of Patent: Oct. 20, 2020

(54) SEMICONDUCTOR DEVICE AND METHOD OF MANUFACTURING THE SAME

(71) Applicant: RENESAS ELECTRONICS CORPORATION, Tokyo (JP)

(72) Inventors: Kuniharu Muto, Tokyo (JP); Hideyuki Nishikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/410,768

(22) Filed: May 13, 2019

(65) Prior Publication Data
US 2019/0378785 A1 Dec. 12, 2019

(30) Foreign Application Priority Data
Jun. 7, 2018 (JP) .................. 2018-109292

(51) Int. Cl.
*H01L 23/495* (2006.01)
*H01L 23/31* (2006.01)
(Continued)

(52) U.S. Cl.
CPC ...... *H01L 23/49562* (2013.01); *H01L 21/565* (2013.01); *H01L 23/315* (2013.01); *H01L 23/3121* (2013.01); *H01L 23/49537* (2013.01); *H01L 23/49575* (2013.01); *H01L 23/544* (2013.01); *H01L 24/33* (2013.01); *H01L 24/73* (2013.01); *H01L 24/83* (2013.01); *H01L 24/85* (2013.01); *H01L 24/92* (2013.01); *H01L 25/18* (2013.01); *H01L 25/50* (2013.01); *H01L 24/45* (2013.01); *H01L 2223/54406* (2013.01); *H01L 2224/32245* (2013.01); *H01L 2224/33181* (2013.01); *H01L 2224/45124* (2013.01); *H01L 2224/48091* (2013.01); *H01L 2224/48106* (2013.01); *H01L 2224/48245* (2013.01); *H01L 2224/73215* (2013.01); *H01L 2224/73265* (2013.01); *H01L 2224/92247* (2013.01); (Continued)

(58) Field of Classification Search
CPC ................................... H01L 23/49562
USPC ........................................ 257/676
See application file for complete search history.

(56) References Cited

U.S. PATENT DOCUMENTS

| 7,728,413 B2 | 6/2010 | Iwade et al. | |
| 7,759,778 B2* | 7/2010 | Lowry | H01L 23/4334 257/675 |
| 2009/0096072 A1* | 4/2009 | Balakrishnan | H01L 23/49551 257/670 |

FOREIGN PATENT DOCUMENTS

| JP | 2007-073743 A | 3/2007 |
| JP | 2015-138843 A | 7/2015 |

* cited by examiner

*Primary Examiner* — Ajay Arora
(74) *Attorney, Agent, or Firm* — McDermott Will & Emery LLP

(57) ABSTRACT

Assembly of the semiconductor device includes the following steps: (a) mounting a semiconductor chip on the bottom electrode 40; (b) mounting the top electrode 30 on the semiconductor chip; (c) forming a sealing body 70 made of resin and provided with a convex portion 74 so as to cover the semiconductor chip; and (d) exposing the electrode surface 31 of the top electrode 30 on the top surface of the sealing body 70 and exposing the electrode surface 41 of the bottom electrode 40 on the back surface of the sealing body 70. In the step (d), at least one of the electrode surface 31 and the electrode surface 41 is exposed from the sealing body 70 by irradiating at least one of the front surface and the back surface of the sealing body 70 with the laser 110.

15 Claims, 38 Drawing Sheets

(51) Int. Cl.
- *H01L 23/00* (2006.01)
- *H01L 21/56* (2006.01)
- *H01L 25/18* (2006.01)
- *H01L 25/00* (2006.01)
- *H01L 23/544* (2006.01)
- H02M 7/5387 (2007.01)

(52) U.S. Cl.
CPC ............... *H01L 2924/1203* (2013.01); *H01L 2924/13055* (2013.01); *H01L 2924/13091* (2013.01); *H02M 7/5387* (2013.01)

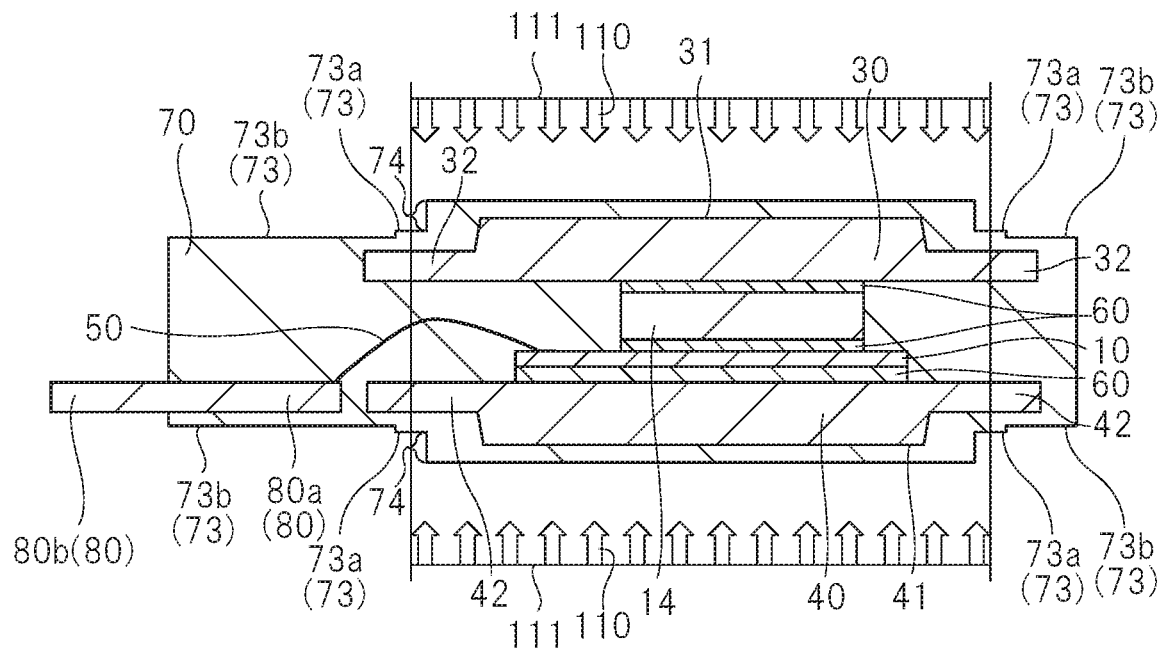
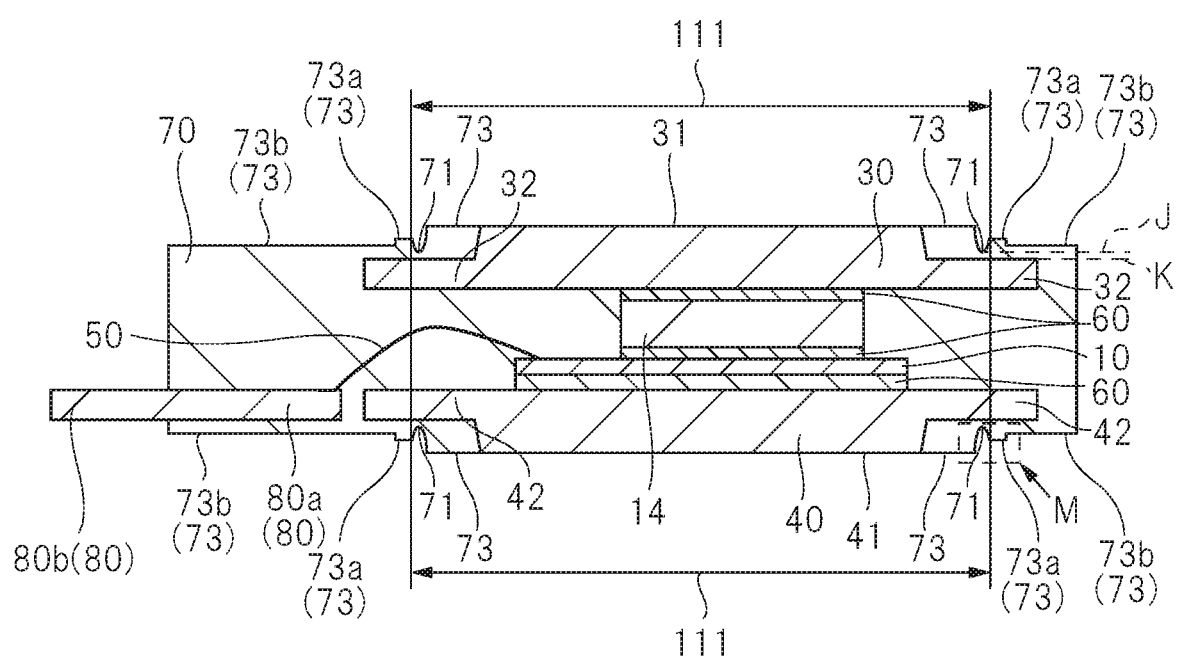

SEMICONDUCTOR DEVICE AND METHOD OF MANUFACTURING THE SAME

CROSS-REFERENCE TO RELATED APPLICATIONS

The disclosure of Japanese Patent Application No. 2018-109292 filed on Jun. 7, 2018 including the specification, drawings and abstract is incorporated herein by reference in its entirety.

BACKGROUND

The present invention relates to, for example, a semiconductor device having a structure in which electrodes are exposed on the front surface and the back surface of a resin sealing body, and a method of manufacturing the same.

Japanese unexamined Patent Application publications No. 2007-73743 discloses a semiconductor device of a resin mold type in which a concavo-convex portion for increasing a creepage distance between a heat dissipation surface on a surface of a mold resin and a part of a terminal is provided in a portion between a heat dissipation surface exposed from the mold resin and a part of a terminal on a surface of the mold resin.

Japanese unexamined Patent Application publications No. 2015-138843 discloses a structure including a heat generating element, a sealing resin body sealing the heat generating element, and a heat sink thermally connected to the heat generating element, wherein a side surface of the resin sealing body has a first flat portion parallel to the first heat dissipating surface for pressing in a thickness direction when exposing the first heat dissipating surface by cutting the resin sealing body.

SUMMARY

In the semiconductor devices disclosed in Japanese unexamined Patent Application publications No. 2007-73743 and No. 2015-138843, a cutting process is disclosed as a technique for exposing a heat sink and an electrode from a resin sealing body. However, when cutting is employed, running costs are high due to the price and replacement frequency of a cutting blade such as a grindstone, and it is difficult to apply the method to the development of a semiconductor device in recent years. Further, when the above-described cutting process is applied, the mass productivity of the semiconductor device cannot be improved.

Other objects and novel features become apparent from the description of this specification and the accompanying drawings.

The semiconductor device of one embodiment has a semiconductor chip in which connection electrodes are disposed on the front surface and the back surface, a first plate-shaped conductor portion electrically connected to the connection electrode on the back surface side of the semiconductor chip and disposed on the back surface side, a second plate-shaped conductor portion electrically connected to the connection electrode on the front surface side of the semiconductor chip and disposed on the front surface side, and a sealing body made of resin covering the semiconductor chip and the first and second plate-shaped conductor portions. The first plate-shaped conductor portion has a first electrode surface exposed on the back surface of the sealing body, and the second plate-shaped conductor portion has a second electrode surface exposed on the front surface of the sealing body. Further, on at least one of the front surface and the back surface of the sealing body, a groove is formed so as to surround the first or second electrode surface in plan view, and a flat surface of the sealing body is formed on the inner side and the outer side of the groove, and the flat surface on the outer side of the groove is disposed closer to the center in the thickness direction of the sealing body than the flat surface on the inner side of the groove.

In addition, the semiconductor device of one embodiment has a semiconductor chip in which connection electrodes are disposed on the front surface and the back surface, a first plate-shaped conductor portion electrically connected to the connection electrodes on the back surface side of the semiconductor chip and disposed on the back surface side, a second plate-shaped conductor portion electrically connected to the connection electrodes on the front surface side of the semiconductor chip and disposed on the front surface side, and a sealing body made of resin covering the semiconductor chip and the first and second plate-shaped conductor portions. The first plate-shaped conductor portion has a first electrode surface exposed on the back surface of the sealing body, and the second plate-shaped conductor portion has a second electrode surface exposed on the front surface of the sealing body. Further, a groove is formed on at least one of the front surface and the back surface of the sealing body along a part of the first or second electrode surface in plan view, and a part of the first or second plate-shaped conductor portion is disposed below or above the groove.

The method of manufacturing a semiconductor device according to the embodiment further includes the steps of (a) mounting a semiconductor chip on the first plate-shaped conductor portion, (b) mounting a second plate-shaped conductor portion on the semiconductor chip, and (c) forming a sealing body made of resin so as to cover the first plate-shaped conductor portion, the semiconductor chip, and the second plate-shaped conductor portion. In the step (d), at least one of the first and second plate-shaped conductor portions is exposed from the sealing body by irradiating a laser on at least one surface of the sealing body and the back surface of the sealing body, while (d) exposing a part of the second plate-shaped conductor portion on the front surface of the sealing body and exposing a part of the first plate-shaped conductor portion on the back surface of the sealing body.

According to the above embodiment, the running cost in manufacturing the semiconductor device can be reduced, and the mass productivity of the semiconductor device can be improved.

BRIEF DESCRIPTION OF THE DRAWINGS

FIG. 52 is a cross-sectional view illustrating a structure prior to laser irradiation in the assembly of a semiconductor device according to an embodiment.

FIG. 53 is a cross-sectional view illustrating a structure after laser irradiation in the assembly of a semiconductor device according to an embodiment.

DETAILED DESCRIPTION

Figure 1:
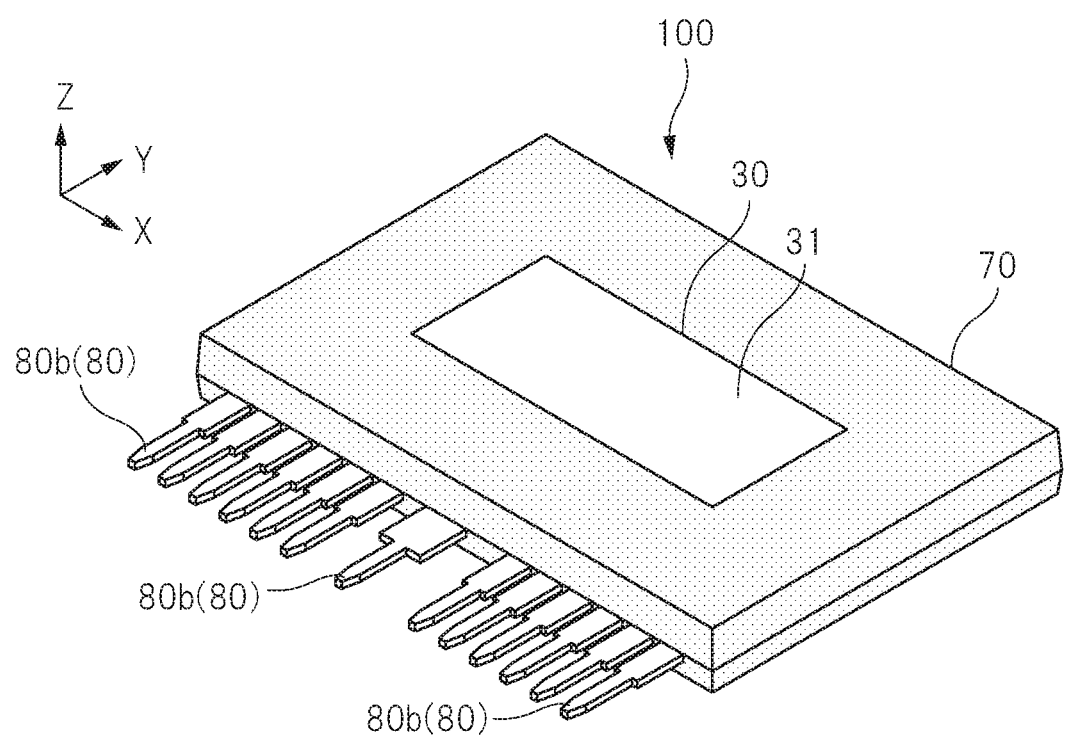
FIG. 1 is a perspective view showing an example of a structure of a semiconductor device according to a first embodiment.

In the following embodiments, descriptions of the same or similar parts are not repeated in principle except when particularly necessary.

Further, in the following embodiments, when it is necessary for convenience, the description is made by dividing into a plurality of sections or embodiments, but except for the case where it is specifically specified, they are not independent of each other, and one of them is related to some or all of modifications, details, supplementary description, and the like of the other.

In addition, in the following embodiments, when referring to the number of elements or the like (including the number, the number, the amount, the range, and the like), the number is not limited to the specific number except the case where it is specified in particular or the case where it is clearly limited to the specific number in principle, and the number may be equal to or greater than or equal to the specific number, or may be equal to or less than the specific number.

In addition, in the following embodiments, it is needless to say that the constituent elements (including element steps and the like) are not necessarily indispensable except for the case where they are specifically specified and the case where they are considered to be obviously indispensable in principle.

In the following embodiments, it is needless to say that the terms "having" and "including A" with respect to the constituent elements and the like do not exclude other elements except for the case where it is clearly indicated that the constituent elements and the like are only those elements. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments of the present invention are described in detail with reference to the drawings. In all the drawings for explaining the embodiments, members having the same functions are denoted by the same reference numerals, and repetitive descriptions thereof are omitted. In order to make the drawings easier to understand, hatching may be added even in a plan view.

In the present specification, the "power transistor" means an aggregate of unit transistors which realize the function of the unit transistor even at a current larger than the allowable current of the unit transistor by connecting a plurality of unit transistors (cell transistors) in parallel (for example, connecting thousands to tens of thousands of unit transistors in parallel). For example, when the unit transistor functions as a switching element, the "power transistor" is a switching element that can be applied to a current larger than the allowable current of the unit transistor. IGBT (Insulated Gate Bipolar Transistor) and a power MOSFET can be exemplified as the "power transistor" constituting the switching device. In this specification, the term "power transistor" is used as a phrase indicating a generic term including, for example, both "power MOSFET" and "IGBT".

First Embodiment

Figure 2:
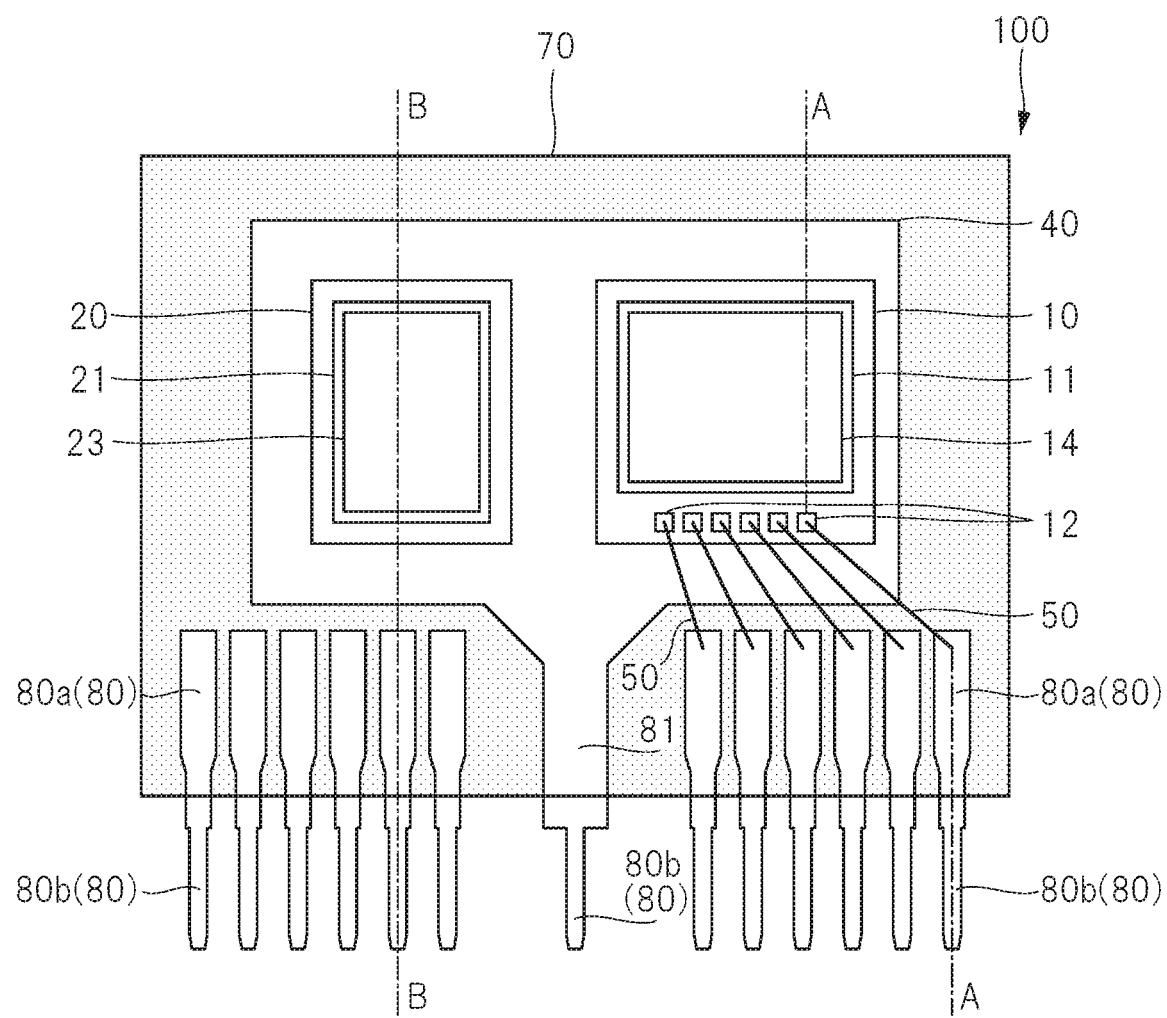
FIG. 2 is a plan view illustrating an internal structure of the FIG. 1's semiconductor device in which a sealing body is transmitted.
Figure 3:
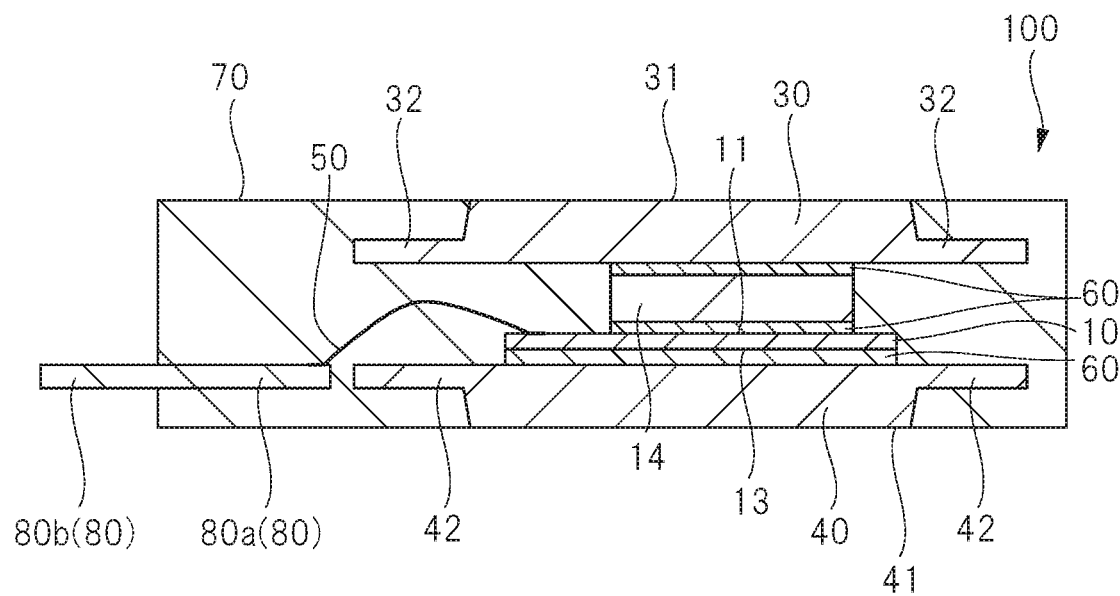
FIG. 3 is a sectional view showing the structure cut along the A-A line in FIG. 2.
Figure 4:
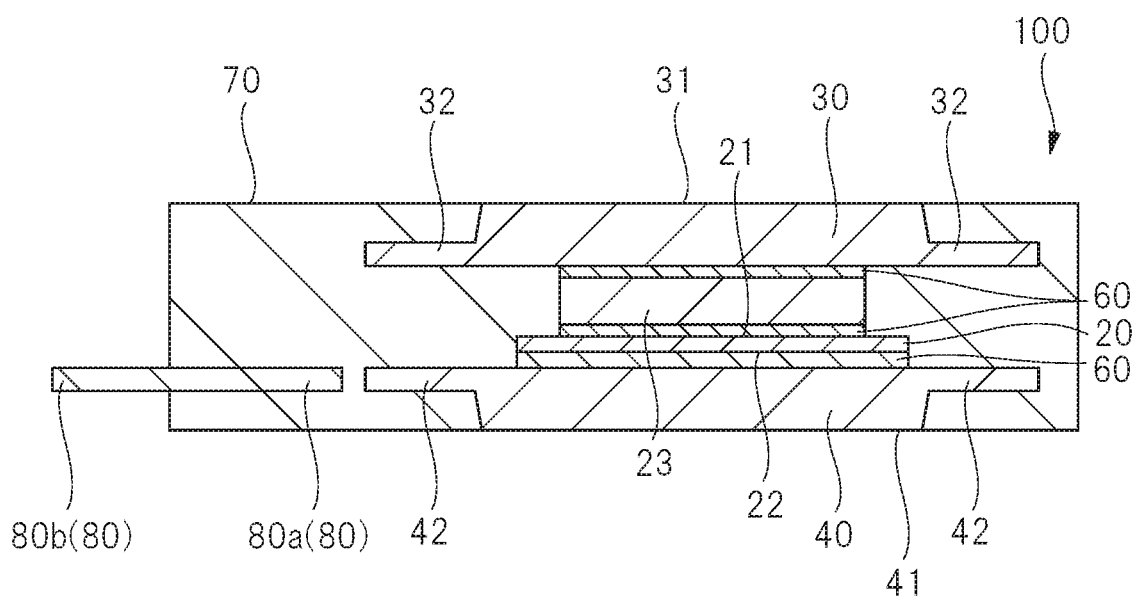
FIG. 4 is a cross-sectional view showing the structure cut along the B-B line in FIG. 2.

FIG. 1 is a perspective view showing an example of the structure of the semiconductor device of the First Embodiment, FIG. 2 is a plan view showing the internal structure of the semiconductor device of FIG. 1 through a sealing body, FIG. 3 is a cross-sectional view showing the structure of FIG. 2 taken along line A-A, and FIG. 4 is a cross-sectional view showing the structure of FIG. 2 taken along line B-B.

The semiconductor device according to the first embodiment shown in FIGS. 1 to 4 is used in a driving circuit of a three-phase induction motor used in, for example, an air conditioner. Specifically, the driving circuit includes an inverter circuit, and the inverter circuit is a circuit having a function of converting DC power into AC power.

In the first embodiment, the power transistor incorporated in the semiconductor device is IGBT (Insulated Gate Bipolar Transistor, and each of the plurality of semiconductor chips on which the IGBT constituting the inverter circuit is formed is referred to as an "IGBT chip 10". Similarly, each of the plurality of semiconductor chips on which the diodes constituting the inverter circuit are formed is referred to as a "diode chip 20". In the first embodiment, an MCP (Multi-Chip Package) 100 having a structure in which one IGBT chip 10 and one diode chip 20 are mounted side by side and an electrode surface is exposed on the front surface and the back surface of the sealing body 70 is described as an example of the semiconductor device.

The configuration of the MCP 100 of the first embodiment is described with reference to FIGS. 1 to 4.

As shown in FIG. 2, an IGBT chip (first semiconductor chip) 10 and a diode chip (second semiconductor chip) 20 are incorporated in the MCP 100. The diode chip 20 is, for example, a fast recovery diode. The IGBT chip 10 and the diode chip 20 are mounted side by side on the lower electrode 40 as a chip mounting portion.

The bottom electrode 40 is a plate-shaped conductor portion, and the main portion has a substantially rectangular shape in plan view. A suspended lead 81 is connected to one side surface in the longitudinal direction. In plan view, a plurality of leads 80 are disposed on both sides of the suspended lead 81.

As shown in FIG. 3, the IGBT chip 10 is mounted on the lower electrodes 40 via an conductive bonding material 60. Further, a spacer 14 made of a conductive member is mounted on the IGBT chip 10 via the conductive bonding material 60. The top electrode (the second plate-shaped conductor portion) 30 is mounted on the spacer 14 via the conductive bonding material 60.

On the other hand, at a lateral position of the IGBT chip 10 shown in FIG. 2, as shown in FIG. 4, the diode chip 20 mounted on the bottom electrode 40 via the conductive bonding material 60 is disposed. Further, a spacer 23 made of a conductor member is mounted on the diode chip 20 via a conductive bonding material 60. A top electrode 30 is mounted on the spacer 23 with a conductive bonding material 60 interposed therebetween.

The conductive bonding material 60 is, for example, a brazing material such as sintered Ag.

The IGBT chip 10, the diode chip 20, the spacer 14, the spacer 23, a part of the lower electrode 40, and a part of the upper electrode 30 are covered with a resin-made sealing body 70. Each of the inner leads 80a of the plurality of leads 80 is embedded in the sealing body 70. Accordingly, each of the plurality of leads 80 includes an inner lead 80a embedded in the sealing body 70, and an outer lead 80b connected to each of the plurality of inner leads 80a and exposed to the outside of the sealing body 70.

As illustrated in FIG. 2, the IGBT chip 10 includes an electrode pad (emitter electrode) 11, which is an electrode for connection having a large area on its surface, and an electrode pad (gate electrode) 12, which is a plurality of electrode for connection having a smaller area than the electrode pad 11. Further, as illustrated in FIG. 3, an electrode pad (collector electrode) 13, which is an electrode for connection, is formed (disposed) on the back side opposite to the surface.

Each of the plurality of electrode pads 12 formed on the surfaces of the IGBT chip 10 is electrically connected to each of the inner leads 80a of the plurality of leads 80 corresponding to each of the electrode pads 12 via the aluminum wire 50.

Meanwhile, as shown in FIG. 2, an electrode pad (anode electrode) 21, which is an electrode for connection to the surface of the diode chip 20, is formed (disposed) and an electrode pad (cathode electrode) 22, which is an electrode for connection, is formed (disposed) on the back surface opposite to the surface, as shown in FIG. 4.

As shown in FIG. 3, the electrode pads 11 formed on the surface of the IGBT chip 10 are electrically connected to the upper electrode 30 via the conductive bonding material 60 and the spacers 14. Further, an electrode pad 13 formed on the back surface of the IGBT chip 10 is electrically connected to the lower electrode 40 via the conductive bonding material 60.

On the other hand, as shown in FIG. 4, the electrode pad 21 formed on the surface of the diode chip 20 is electrically connected to the upper electrode 30 via the conductive bonding material 60 and the spacer 23. Further, the electrode pad 22 formed on the back surface of the diode chip 20 is electrically connected to the bottom electrode 40 via the conductive bonding material 60.

Therefore, the electrode pad (emitter electrode) 11 on the front surface side of the IGBT chip 10 and the electrode pad (anode electrode) 21 on the front surface side of the diode chip 20 are electrically connected via the plate-shaped upper surface electrode 30. The electrode pad (collector electrode) 13 on the back surface side of the IGBT chip 10 and the electrode pad (cathode electrode) 22 on the back surface side of the diode chip 20 are electrically connected via a plate-shaped bottom electrode 40.

That is, the plate-shaped top electrode 30 is disposed on the top surfaces of the IGBT chip 10 and the diode chip 20 so as to be electrically connected to the IGBT chip 10 and the diode chip 20, respectively. As shown in FIG. 1, the upper electrode 30 includes an electrode surface (second electrode surface) 31 exposed on the surface (upper surface) of the sealing body 70.

On the other hand, the plate-shaped bottom electrode 40 is disposed on the back surface side of each of the IGBT chip 10 and the diode chip 20 so as to be electrically connected to each of the IGBT chip 10 and the diode chip 20. As shown in FIGS. 3 and 4, the bottom electrode 40 includes an electrode surface (first electrode surface) 41 exposed on the back surface (bottom surface) of the sealing body 70.

Therefore, in the MCP 100, in addition to the plurality of outer leads 80b exposed from the side surface of the sealing body 70, the electrode surface 31 of the upper electrode 30 exposed on the front surface of the sealing body 70 and the electrode surface 41 of the lower electrode 40 exposed on the back surface of the sealing body 70 serve as external connecting terminals.

The upper surface electrode 30 having the electrode surface 31 exposed on the surface of the sealing body 70 also has a function of a heat radiation plate, and transfers heat generated from the IGBT chip 10 to the upper surface electrode 30 via the spacer 14, and releases the heat to the outside from the electrode surface 31 of the upper surface electrode 30. Similarly, the bottom electrode 40 having the electrode surface 41 exposed on the back surface of the sealing body 70 also has the function of a heat radiation plate, and the heat emitted from the IGBT chip 10 is discharged to the outside from the electrode surface 41 of the bottom electrode 40.

Figure 5:
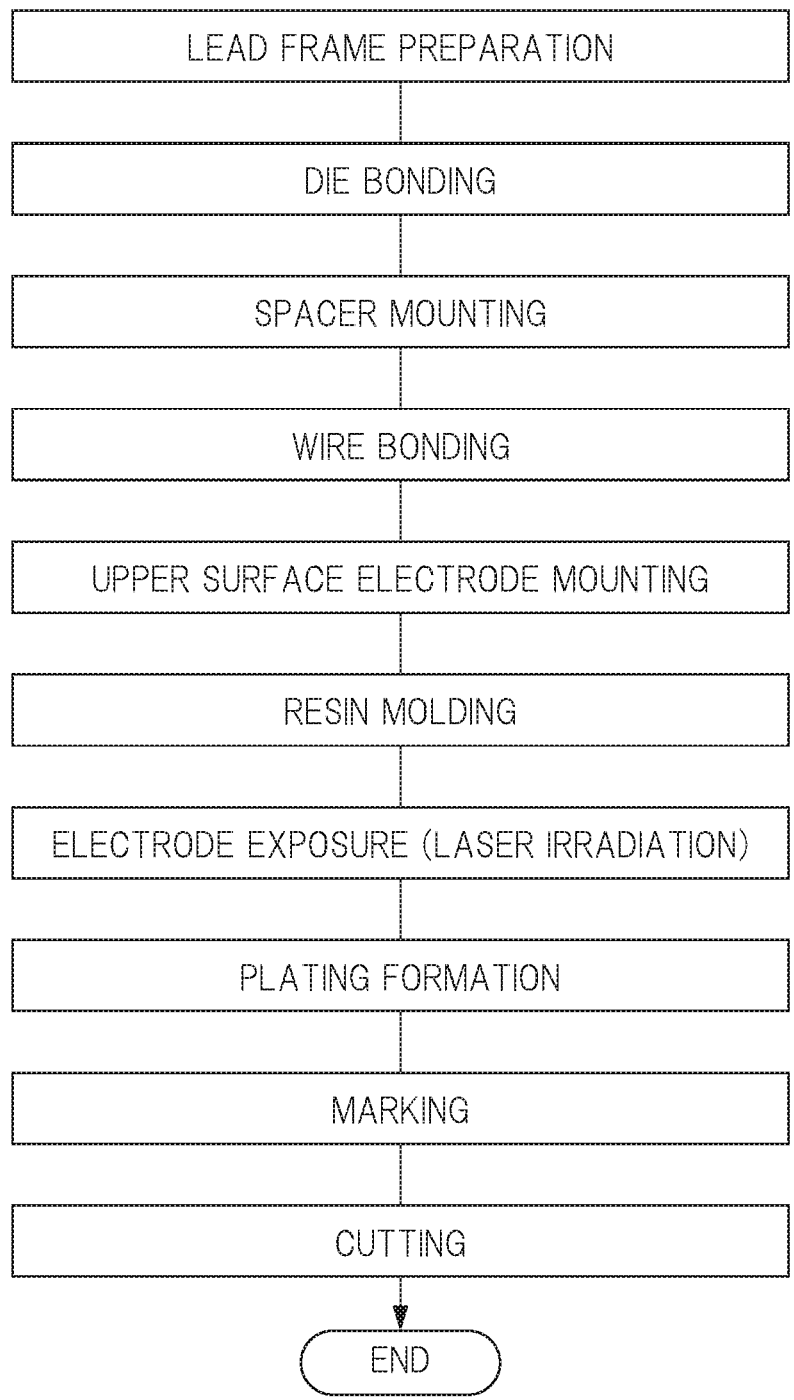
FIG. 5 is a flow diagram illustrating an example in order of assembly of the semiconductor device in FIG. 1.
Figure 6:
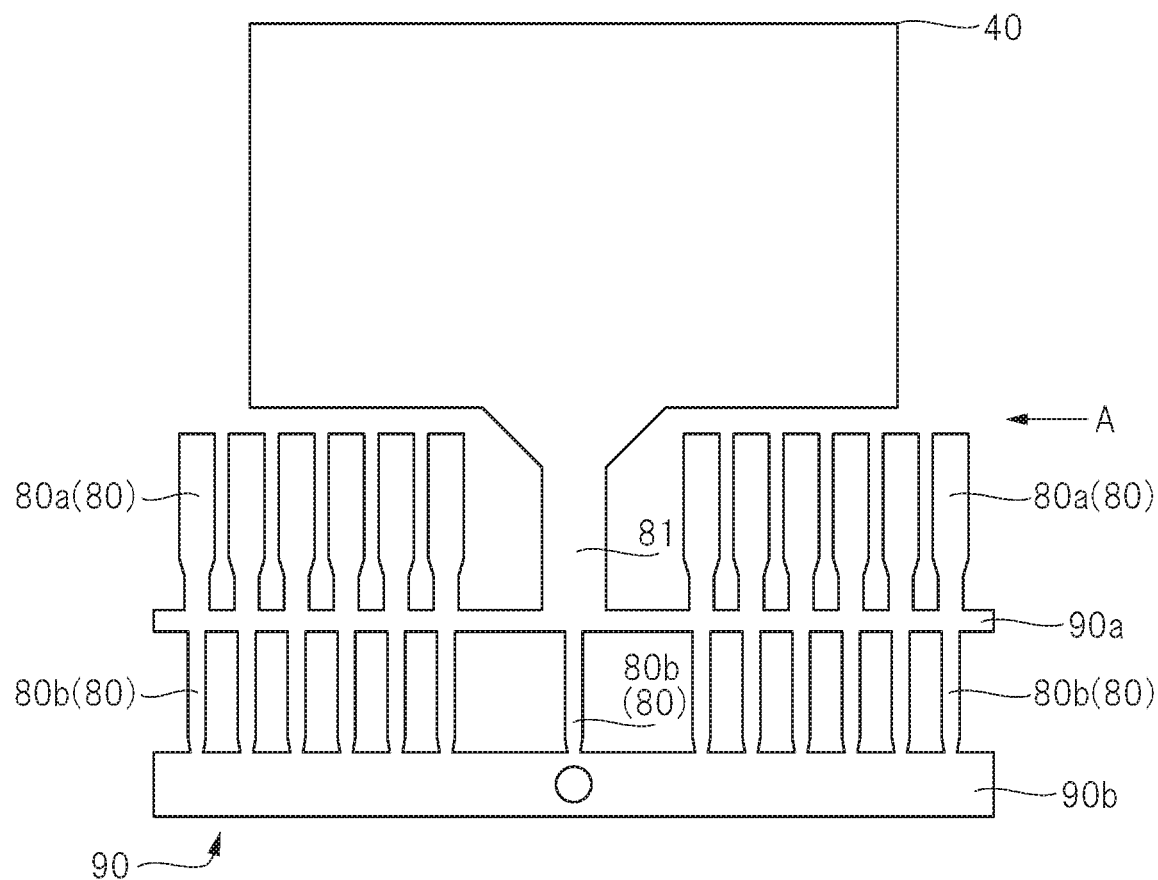
FIG. 6 is a partial plan view illustrating a structure of a lead frame used in the assembly of the semiconductor device in FIG. 5.
Figure 7:
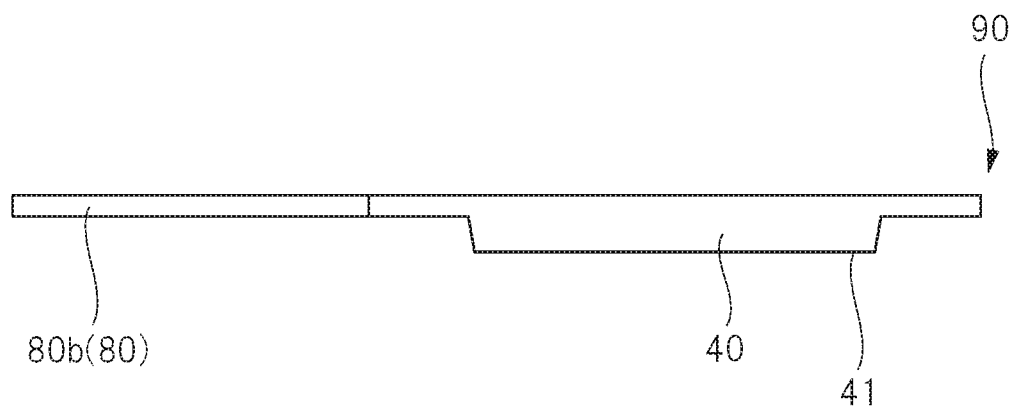
FIG. 7 is an A arrow view of the structure shown in FIG. 6.
Figure 8:
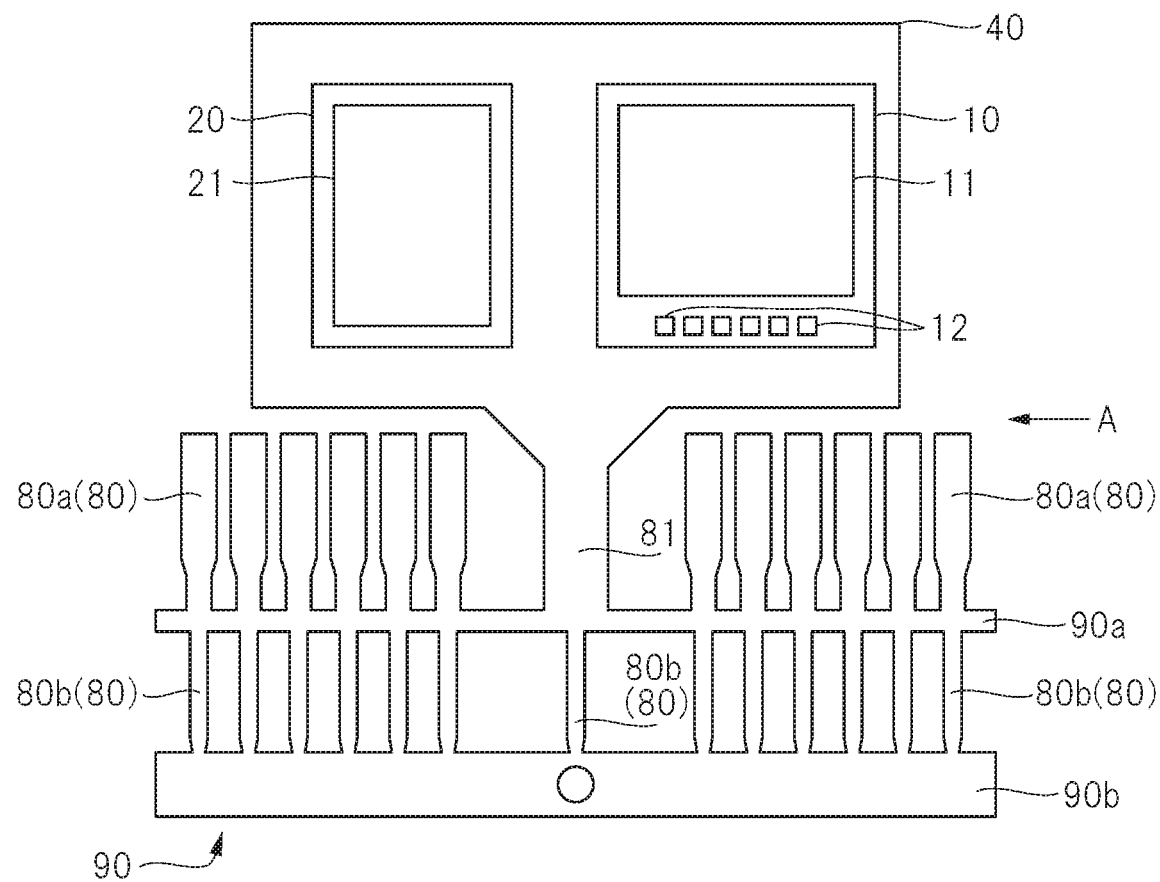
FIG. 8 is a partial plan view illustrating a structure after die bonding of the assembly of the semiconductor device in FIG. 5.
Figure 9:
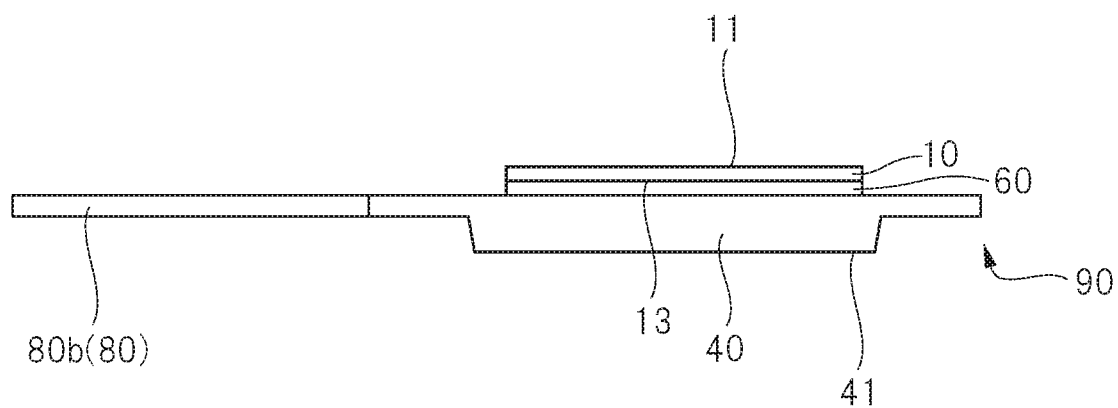
FIG. 9 is an A arrow view of the structure shown in FIG. 8.
Figure 10:
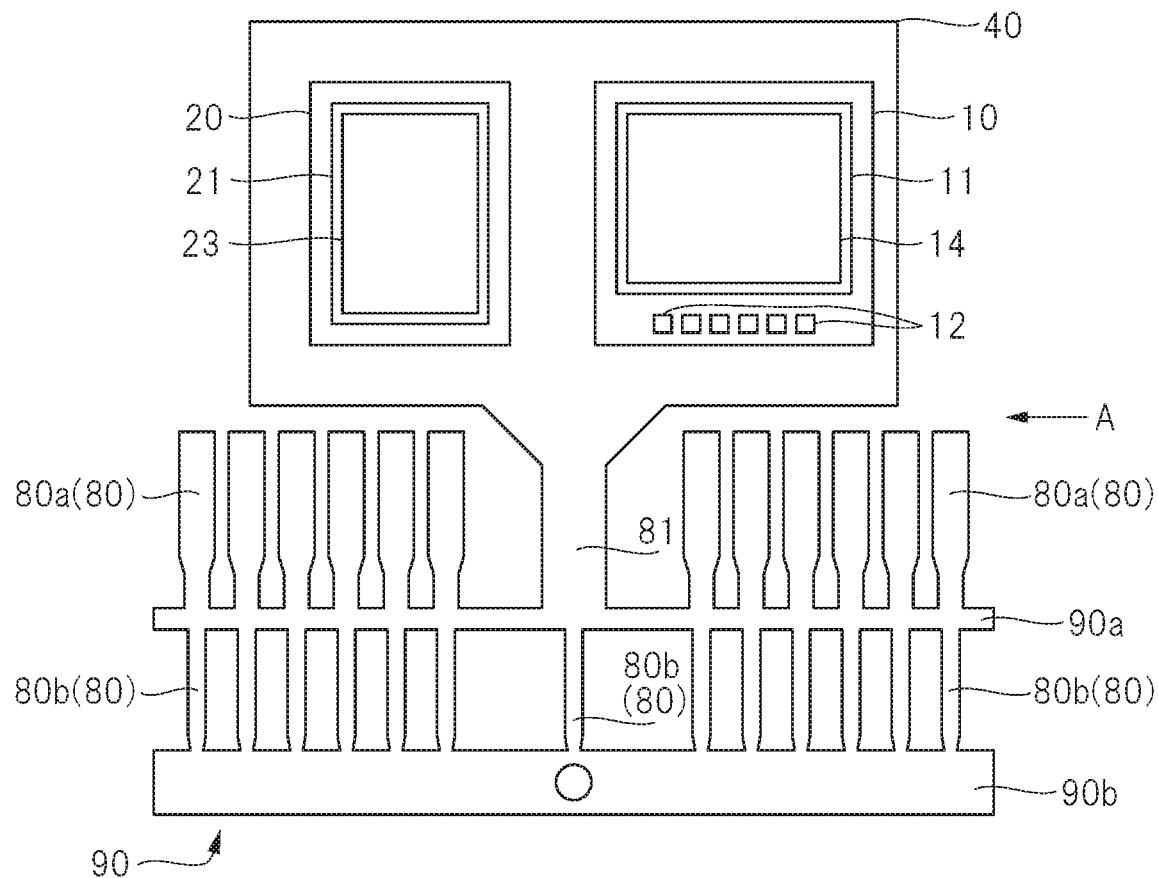
FIG. 10 is a partial plan view illustrating a structure after mounting a spacer in the assembly of the semiconductor device in FIG. 5.
Figure 11:
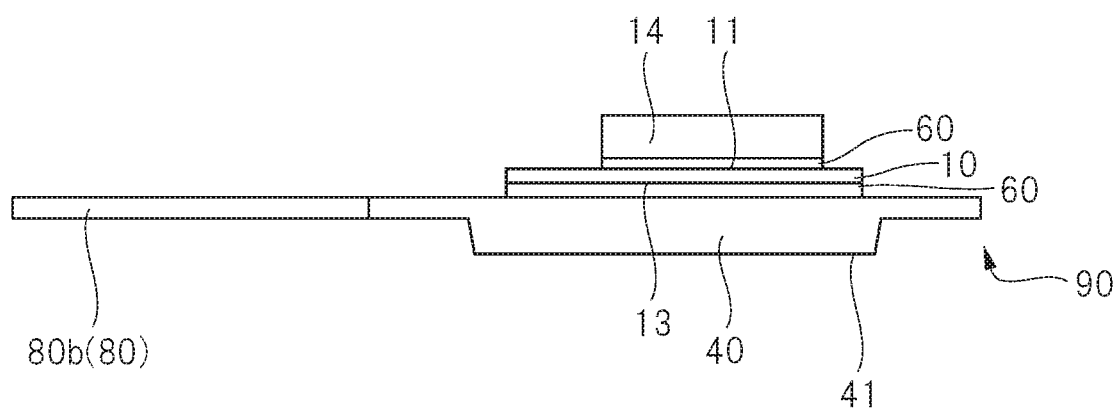
FIG. 11 is an A arrow view of the structure shown in FIG. 10.
Figure 12:
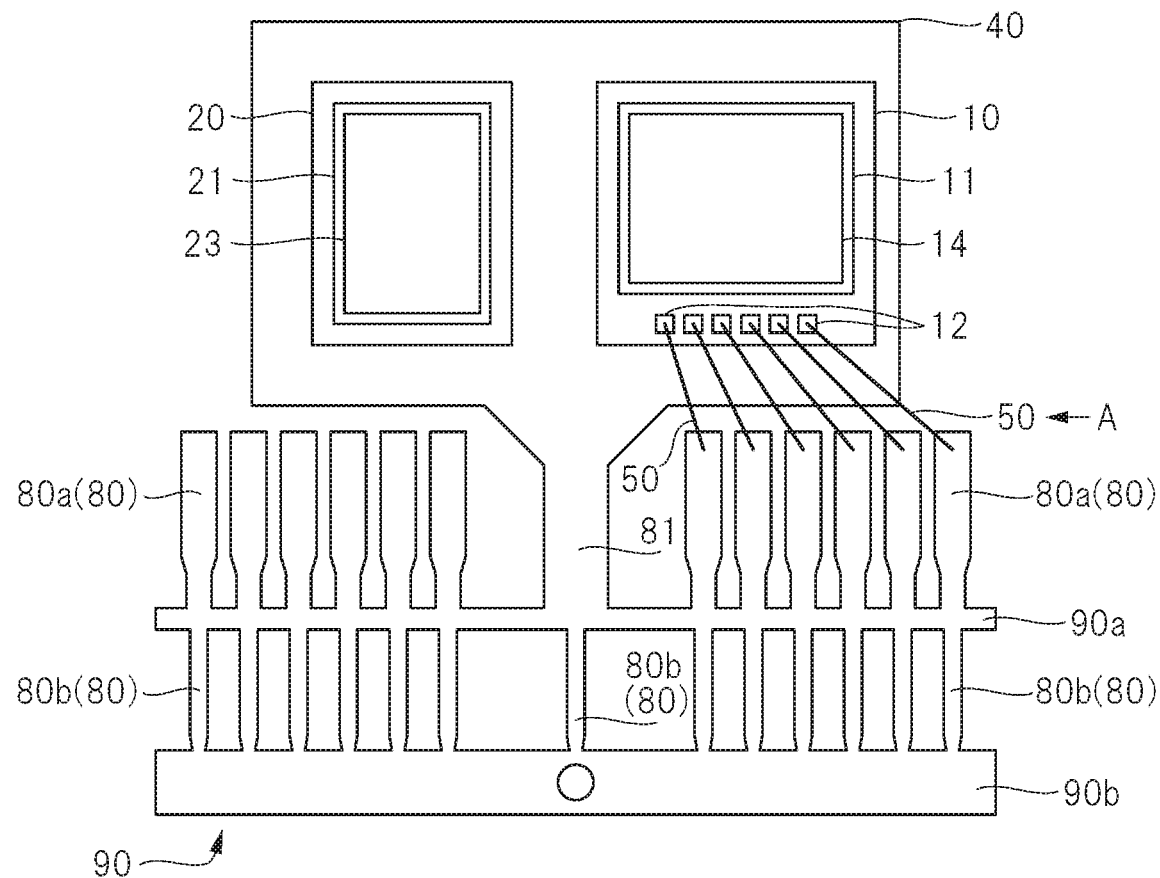
FIG. 12 is a partial plan view illustrating a structure after wire bonding of the assembly of the semiconductor device in FIG. 5.
Figure 13:
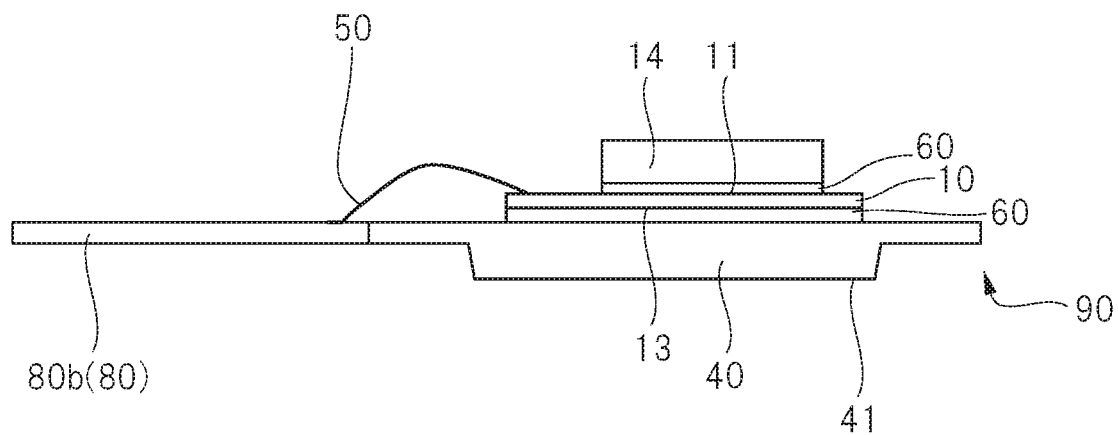
FIG. 13 is an A-arrow view of the structure shown in FIG. 12.
Figure 14:
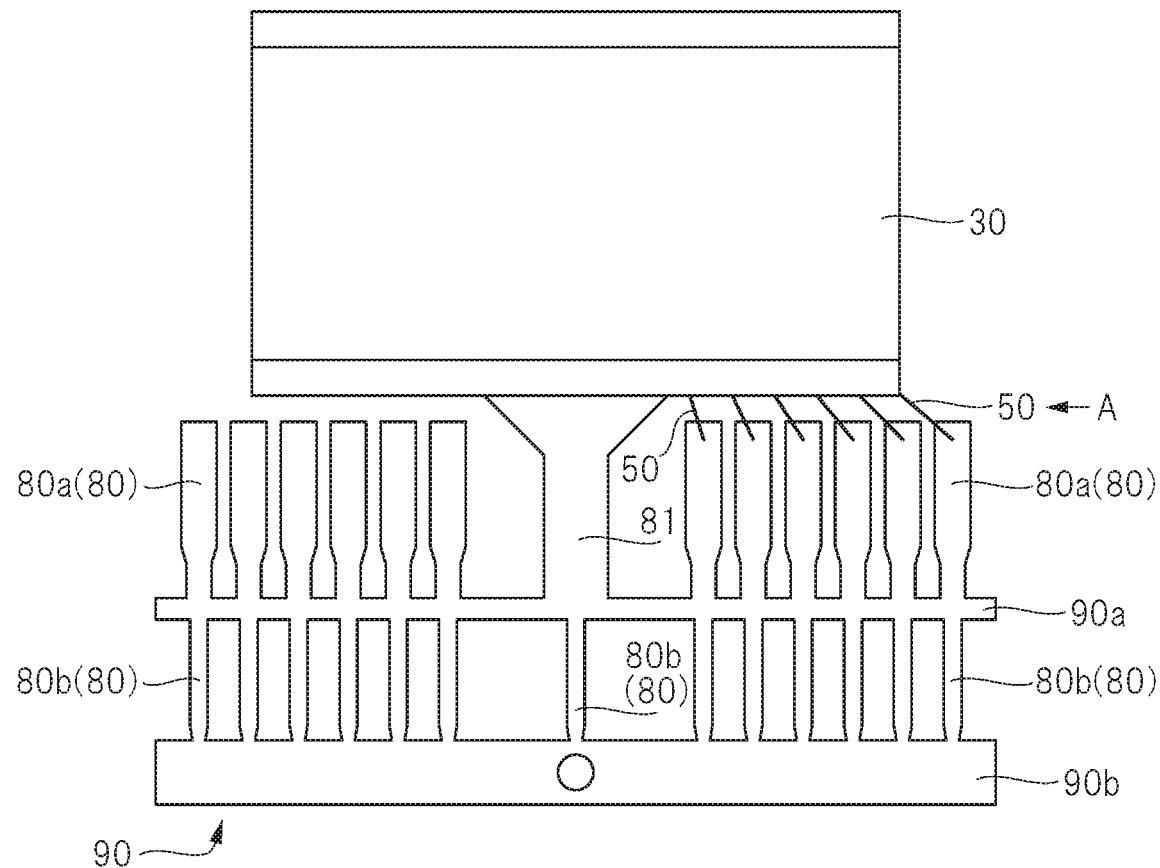
FIG. 14 is a partial plan view illustrating a structure after mounting a top electrode in the assembly of the semiconductor device in FIG. 5.
Figure 15:
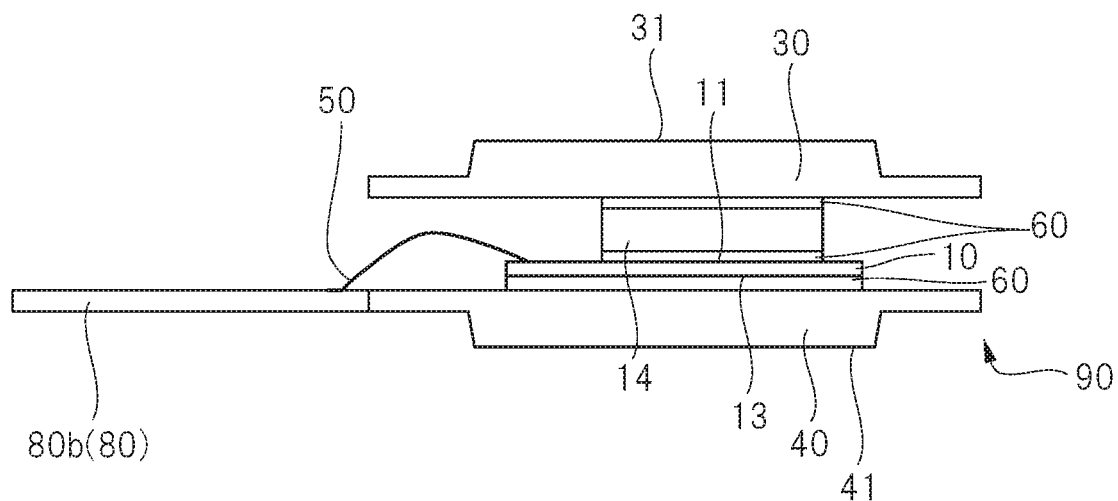
FIG. 15 is an A arrow view of the structure shown in FIG. 14.
Figure 16:
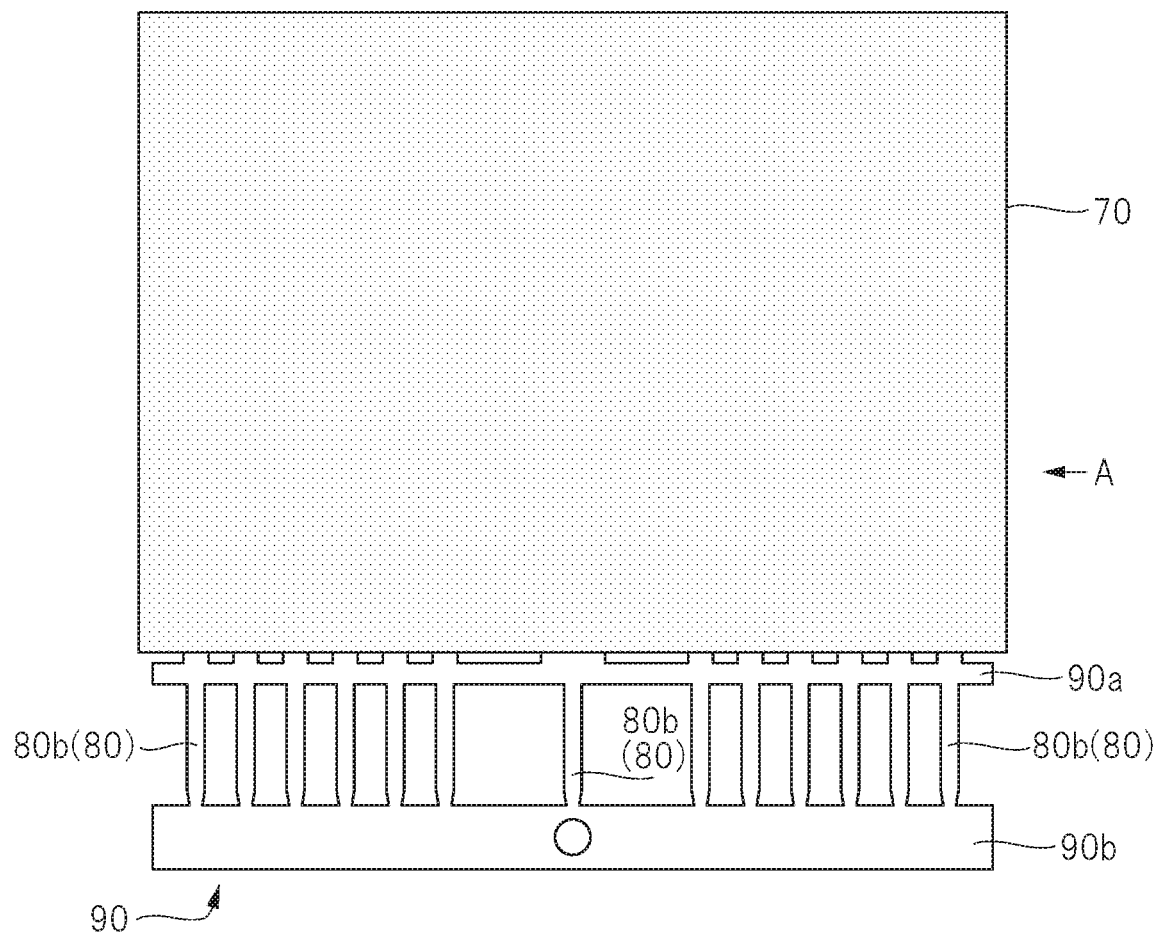
FIG. 16 is a partial plan view illustrating a structure after a resin molding of an assembly of the semiconductor device in FIG. 5.
Figure 17:
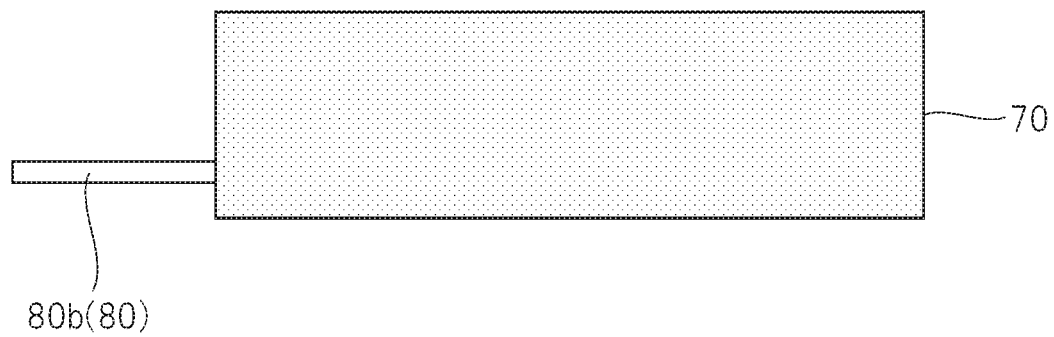
FIG. 17 is an A arrow view of the structure shown in FIG. 16.
Figure 18:
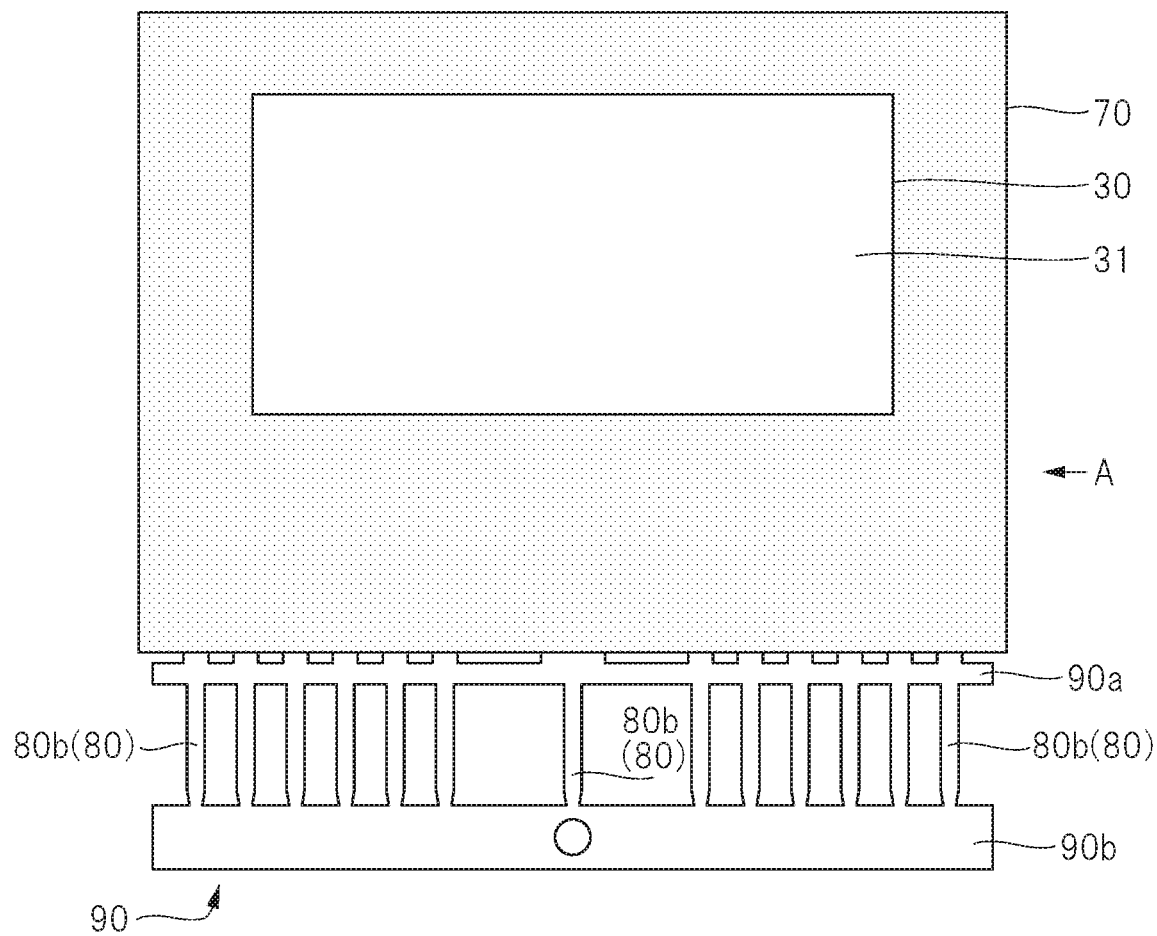
FIG. 18 is a partial plan view illustrating a structure after laser irradiation of an assembly of the semiconductor device in FIG. 5.
Figure 19:
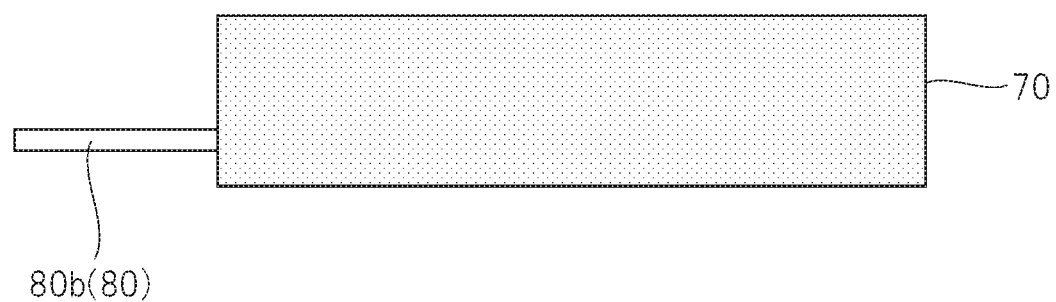
FIG. 19 is an A arrow view of the structure shown in FIG. 18.
Figure 20:
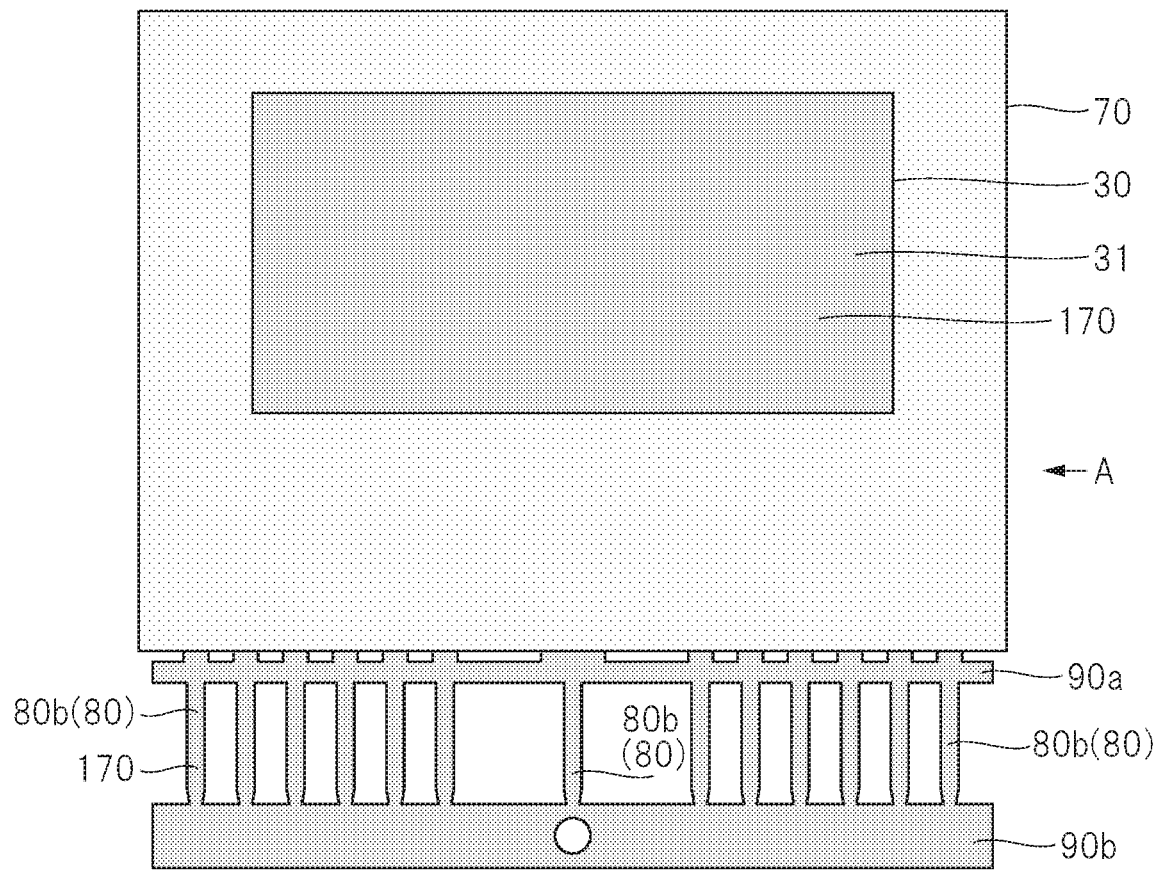
FIG. 20 is a partial plan view illustrating a structure after plating of an assembly of the semiconductor device in FIG. 5.
Figure 21:
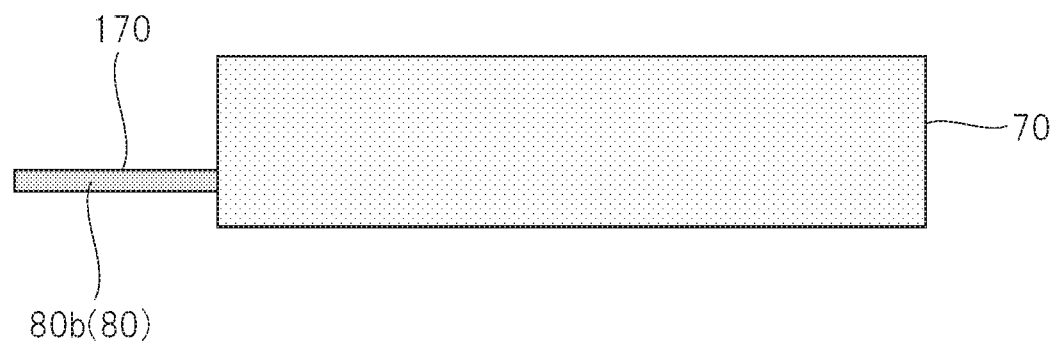
FIG. 21 is an A arrow view of the structure shown in FIG. 20.
Figure 22:
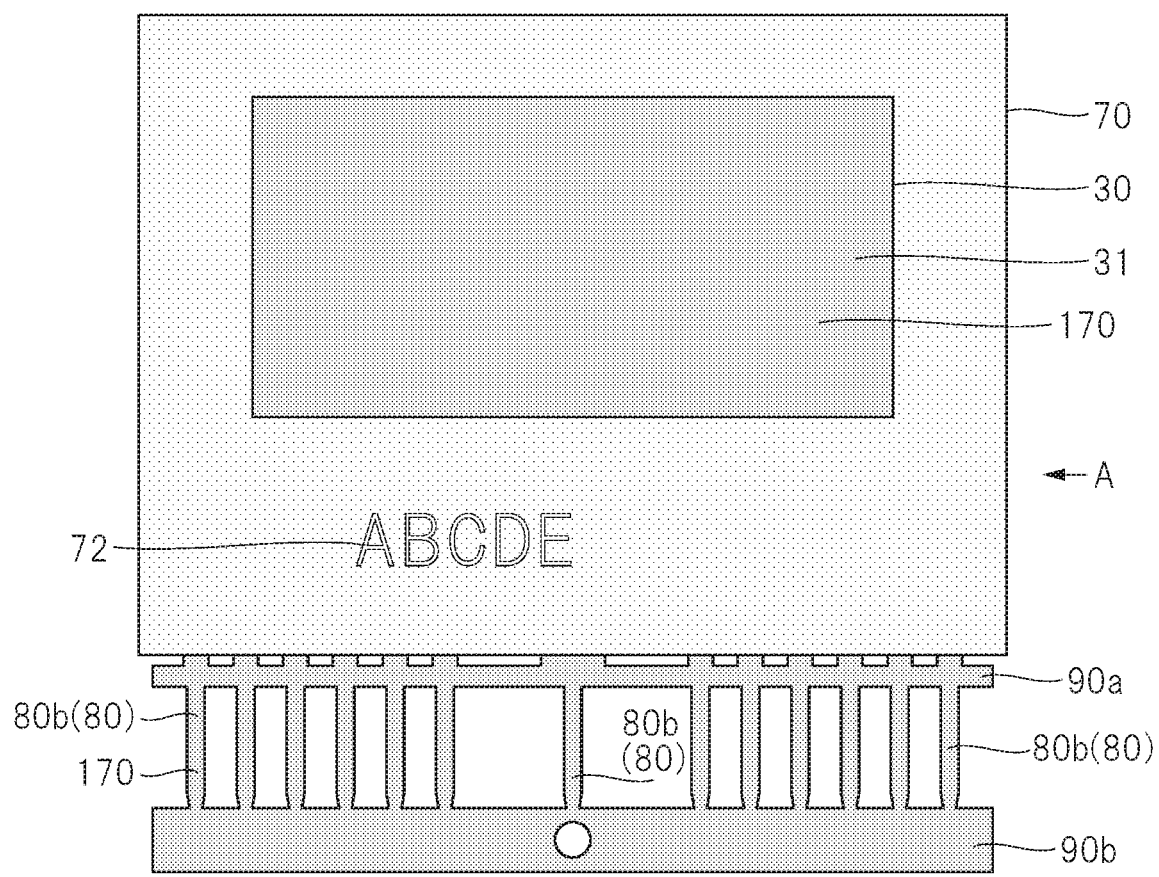
FIG. 22 is a partial plan view illustrating a structure after marking the assembly of the semiconductor device in FIG. 5.
Figure 23:
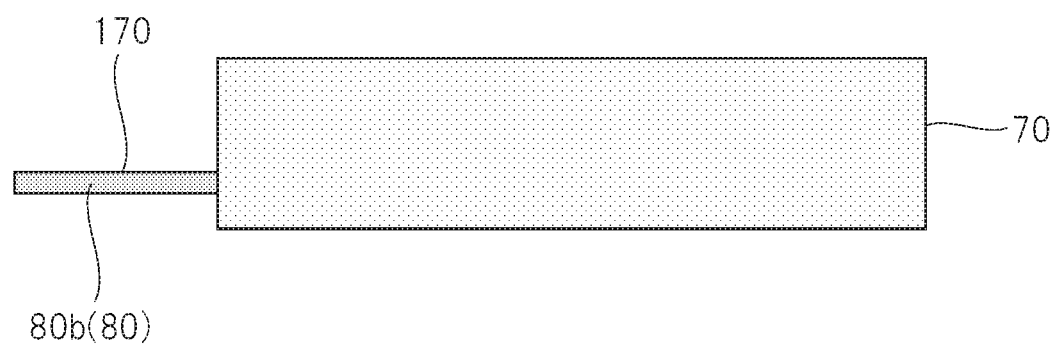
FIG. 23 is an A arrow view of the structure shown in FIG. 22.
Figure 24:
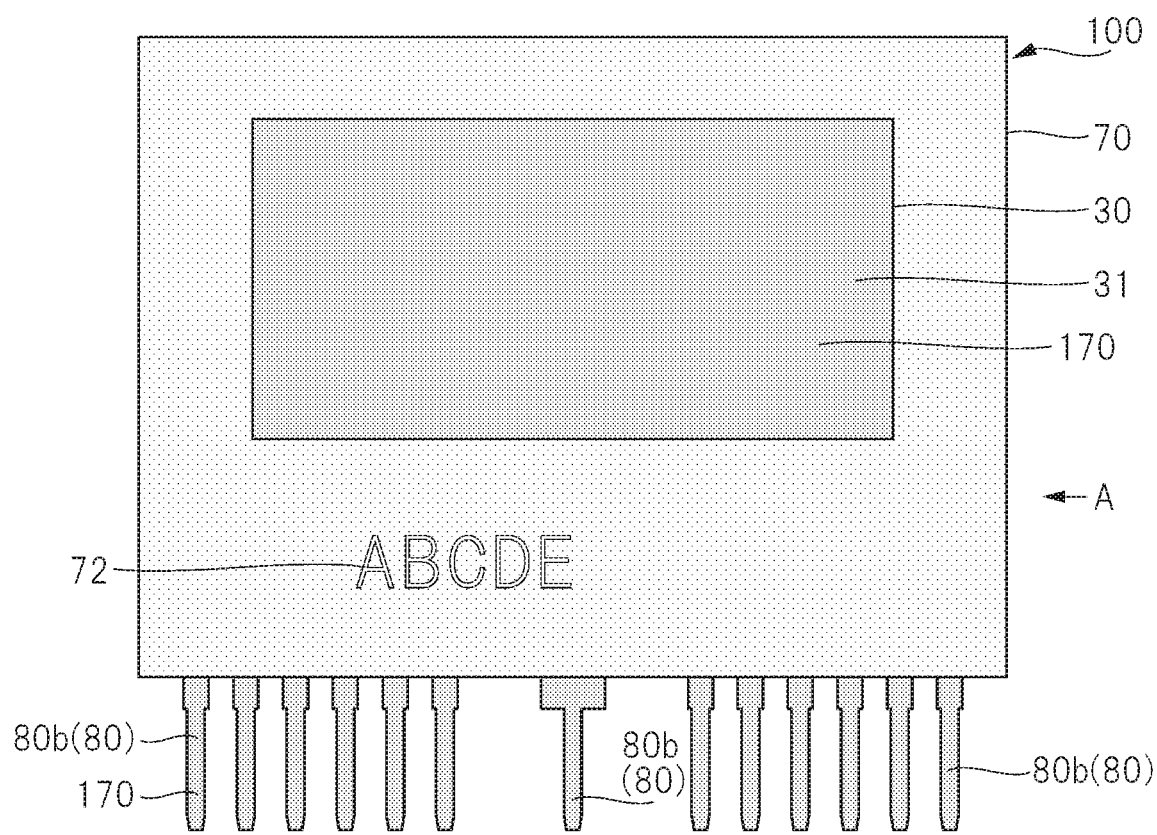
FIG. 24 is a plan view illustrating a structure after a cutting of an assembly of a semiconductor device in FIG. 5.
Figure 25:
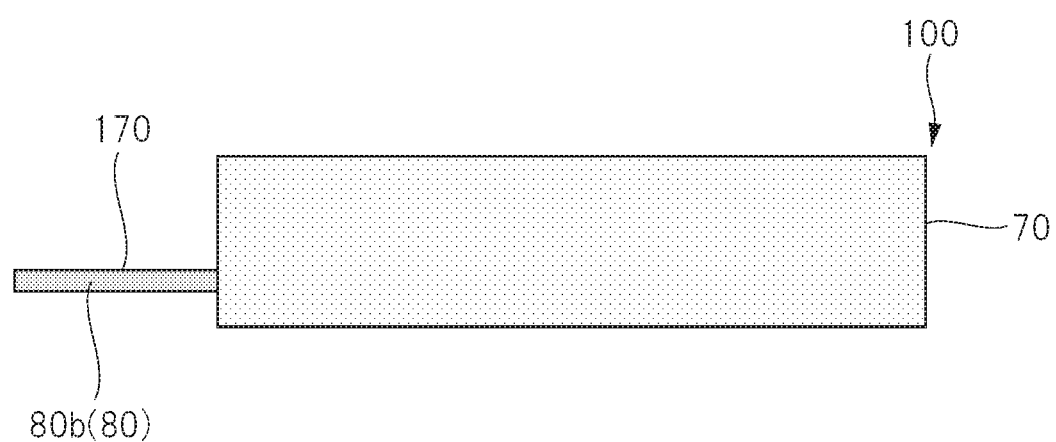
FIG. 25 is an A arrow view of the structure shown in FIG. 24.

FIG. 5 is a flow chart showing an example of the assembling sequence of the semiconductor device shown in FIG. 1, FIG. 6 is a partial plan view showing the structure of the lead frame used for assembling the semiconductor device shown in FIG. 5, FIG. 7 is a view of the structure shown in FIG. 6 along arrow A, FIG. 8 is a partial plan view showing the structure of the semiconductor device shown in FIG. 5 after die bonding, and FIG. 9 is a view of the structure shown in FIG. 8 along arrow A. FIG. 10 is a partial plan view showing the structure of the semiconductor device shown in FIG. 5 after mounting the spacer, FIG. 11 is a view of the structure shown in FIG. 10, FIG. 12 is a partial plan view showing the structure of the semiconductor device shown in FIG. 5 after wire bonding, FIG. 13 is a view of the structure shown in FIG. 12, FIG. 14 is a partial plan view showing the structure of the semiconductor device shown in FIG. 5 after mounting the upper surface electrode, and FIG. 15 is a view of the structure shown in FIG. 14. Further, FIG. 16 is a partial plan view showing the structure after resin molding of the assembly of the semiconductor device shown in FIG. 5, FIG. 17 is a view of the structure shown in FIG. 16 along the arrow A, FIG. 18 is a partial plan view showing the structure after laser irradiation of the assembly of the semiconductor device shown in FIG. 5, FIG. 19 is a view of the structure shown in FIG. 18 along the arrow A, FIG. 20 is a partial plan view showing the structure after plating of the assembly of the semiconductor device shown in FIG. 5, and FIG. 21 is a view of the structure shown in FIG. 20 along the arrow A. FIG. 22 is a partial plan view showing the structure after marking of the assembly of the semiconductor device shown in FIG. 5, FIG. 23 is a view of the structure shown in FIG. 22 taken along the arrow A, FIG. 24 is a plan view showing the structure after cutting of the assembly of the semiconductor device shown in FIG. 5, and FIG. 25 is a view of the structure shown in FIG. 24 taken along the arrow A.

The manufacturing process of the MCP 100 according to the first embodiment is described with reference to the flow chart shown in FIG. 5.

1. First, lead frame preparation shown in FIG. 5 is performed. That is, a lead frame 90 as shown in FIGS. 6 and 7 is prepared. FIG. 6 shows only a region (hereinafter also referred to as a packaging region) of the lead frame 90 used for assembling one semiconductor device (MCP 100), and the lead frame 90 is a plate-shaped member having a plurality of structures shown in FIG. 6. The package region of the lead frame 90 has a plate-shaped lower surface electrode 40 that is also a chip mounting portion, a suspended lead 81 that supports the lower surface electrode 40, a plurality of leads 80 disposed on both sides of the suspended lead 81, and a tie bar 90a and a frame portion 90b to which the suspended lead 81 and the plurality of leads 80 are connected, respectively.

The lead frame 90 is formed of, for example, a base material containing copper as a main component, and the lead pattern shown in FIG. 6 is formed by etching, pressing, or the like.

2. After preparing the die bonding lead frame, die bonding shown in FIG. 5 is performed. First, an IGBT chip 10 and a diode chip 20 as shown in FIG. 8 are prepared, and then die bonding is performed. In the first embodiment, the IGBT chip 10 and the diode chip 20 are mounted on the bottom electrode 40. Each chip is mounted on the lower electrode 40 via the conductive bonding material 60 shown in FIG. 9. The conductive bonding material 60 is, for example, a brazing material such as sintered Ag.

At the time of die bonding, for example, heat and load are applied to each chip to perform die bonding.

3. After the spacer mounting die bonding, the spacer mounting shown in FIG. 5 is performed. In the spacer mounting, as shown in FIGS. 10 and 11, the spacer 14 is mounted on the IGBT chip 10 via the conductive bonding material 60, and the spacer 23 is mounted on the diode chip 20 via the conductive bonding material 60.

4. After the wire bonding spacer is mounted, wire bonding shown in FIG. 5 is performed. In the wire bond, as shown in FIGS. 12 and 13, each of the plurality of electrode pads 12 of the IGBT chip 10 and each of the inner leads 80a of the plurality of leads 80 corresponding thereto are electrically connected by an aluminum wire 50. The aluminum wire 50 is a conductive wire containing aluminum (Al) as a main component.

5. After the wire bonding for mounting the top electrode, the top electrode shown in FIG. 5 is mounted. In the upper surface electrode mounting, as shown in FIGS. 14 and 15, the plate-shaped upper surface electrode 30 is mounted on the spacer 14 and the spacer 23 (see FIG. 12) with the conductive bonding material 60 interposed therebetween. That is, one plate-shaped upper surface electrode 30 having a size spanning the spacer 14 and the spacer 23 is mounted on the spacer 14 and the spacer 23. As a result, the spacer 14 and the spacer 23 are covered with one plate-shaped upper surface electrode 30.

6. After mounting the resin molding upper surface electrode, the resin molding shown in FIG. 5 is performed. In the resin molding, the resin sealing body 70 shown in FIGS. 16 and 17 is formed to cover the lower electrode 40, the IGBT chip 10, the diode chip 20, the spacer 14, the spacer 23, and the upper electrode 30. That is, resin molding is performed using the sealing resin, and the sealing body 70 is formed so that the lower surface electrode 40, the IGBT chip 10, the diode chip 20, the spacer 14, the spacer 23, and the upper surface electrode 30 are covered with the sealing resin.

7. After resin molding, electrode exposure (laser irradiation) shown in FIG. 5 is performed. In the above-mentioned electrode exposure (laser irradiation), as shown in FIG. 19, the front surface and the back surface of the sealing body 70 are irradiated with a laser 110 shown in FIG. 3 (to be described later), and the resin on the front surface and the back surface of the sealing body 70 is removed by scraping. That is, the laser 110 is irradiated onto the front surface and the back surface of the sealing body 70, and the resin covering the upper surface electrode 30 and the lower surface electrode 40 is removed. In the laser irradiation, the laser 110 is irradiated to the workpiece while scanning the laser 110 in the X direction and the Y direction shown in FIG. 1 or scanning the workpiece. Then, by irradiation with the laser 110, the electrode surface 31 of the upper electrode 30 is exposed on the surface of the sealing body 70, as shown in FIG. 18. On the other hand, although not shown, the electrode surface 41 of the bottom electrode 40 is exposed by laser irradiation also on the back surface side of the sealing body 70.

8. After the exposure of the plating formation electrode (laser irradiation), the plating formation shown in FIG. 5 is performed. In the plating formation, as shown in FIGS. 20 and 21, the exterior plating 170 is performed on the plurality of outer leads 80b, the electrode surface 31, and the electrode surface 41 exposed from the sealing body 70.

9. After forming the marking plating, marking shown in FIG. 5 is performed. In the marking, as shown in FIGS. 22 and 23, a desired mark 72 is applied to a region outside the electrode surface 31 of the surface of the sealing body 70. The mark 72 is performed by, for example, laser irradiation. The mark 72 may be, for example, a management character such as a serial number.

10. After the cutting marking, the cutting shown in FIG. 5 is performed. In the cutting, as shown in FIGS. 24 and 25, the plurality of leads 80 are separated from the tie bar 90a and the frame portion 90b shown in FIG. 22. That is, each of the plurality of leads 80 is cut by the tie bar 90a, and is also cut from the frame portion 90b to separate each of the leads 80.

This completes the assembly of the MCP 100.

In the assembly of the MCP 100 of the first embodiment, the sealing body 70 is formed by resin-molding as described above, and thereafter, the electrode surface 31 of the upper electrode 30 and the electrode surface 41 of the lower electrode 40 are exposed from the sealing body 70 by irradiating the front surface and the back surface of the sealing body 70 with the laser 110.

As a result, compared with the case where the upper surface electrode 30 and the lower surface electrode 40 are exposed from the sealing body 70 by cutting using a cutting blade such as a grindstone, in the case of laser irradiation, since the cutting blade is not used, the running cost in assembling the MCP 100 can be reduced, and the laser irradiation can be applied to the development of a semiconductor device such as a MCP 100.

Further, by employing laser irradiation to expose the upper surface electrode 30 and the lower surface electrode 40 from the sealing body 70, the productivity of laser irradiation is higher than that of cutting using a cutting blade such as a grindstone, so that the mass productivity of the semiconductor device can be improved.

Next, in order to further improve the electrode exposure (laser irradiation) technique, an electrode exposure technique by laser irradiation, which has been studied by the inventor of the present invention, is described.

Figure 26:
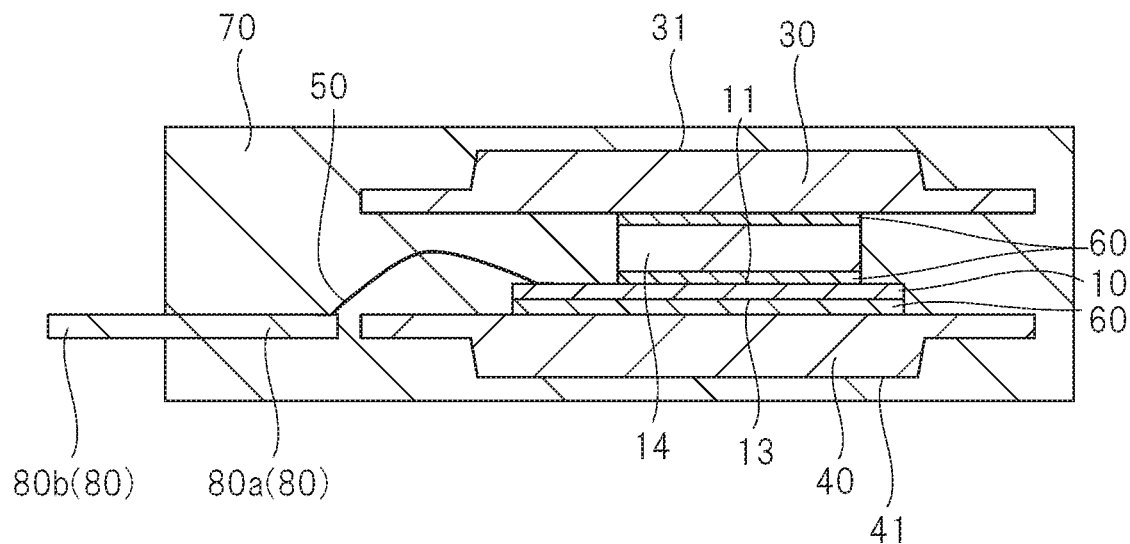
FIG. 26 is a cross-sectional view showing the shape prior to laser irradiation in the assembly of the semiconductor device compared by the present inventor.
Figure 27:
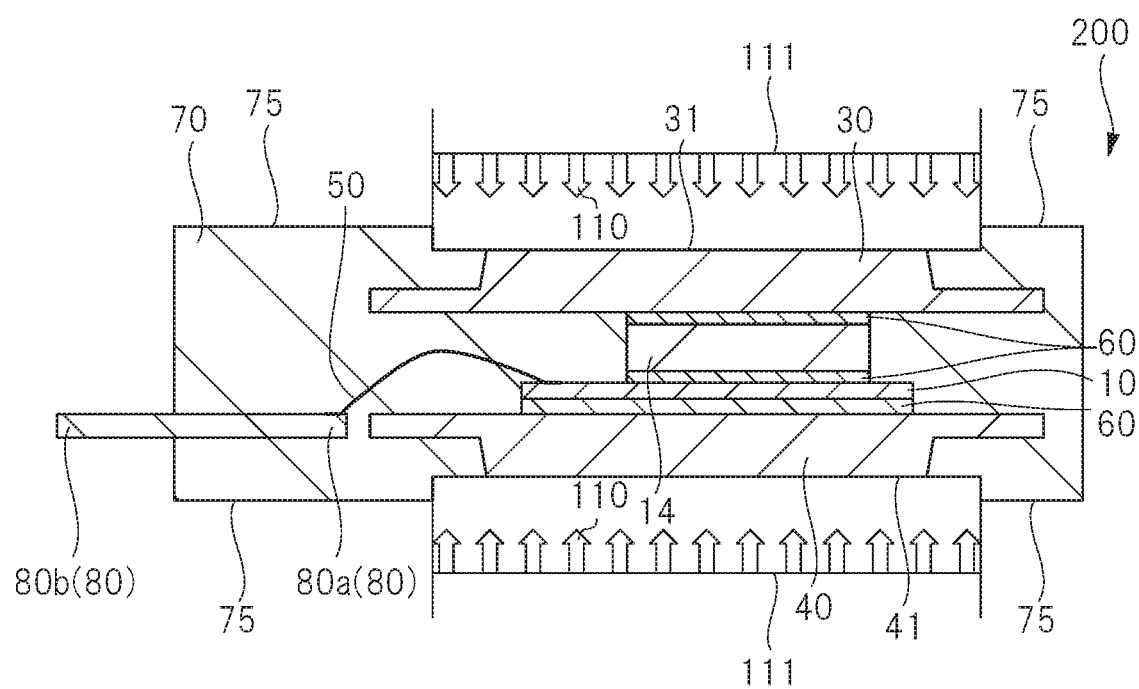
FIG. 27 is a cross-sectional view illustrating a shape after laser irradiation of the semiconductor device in FIG. 26.
Figure 28:
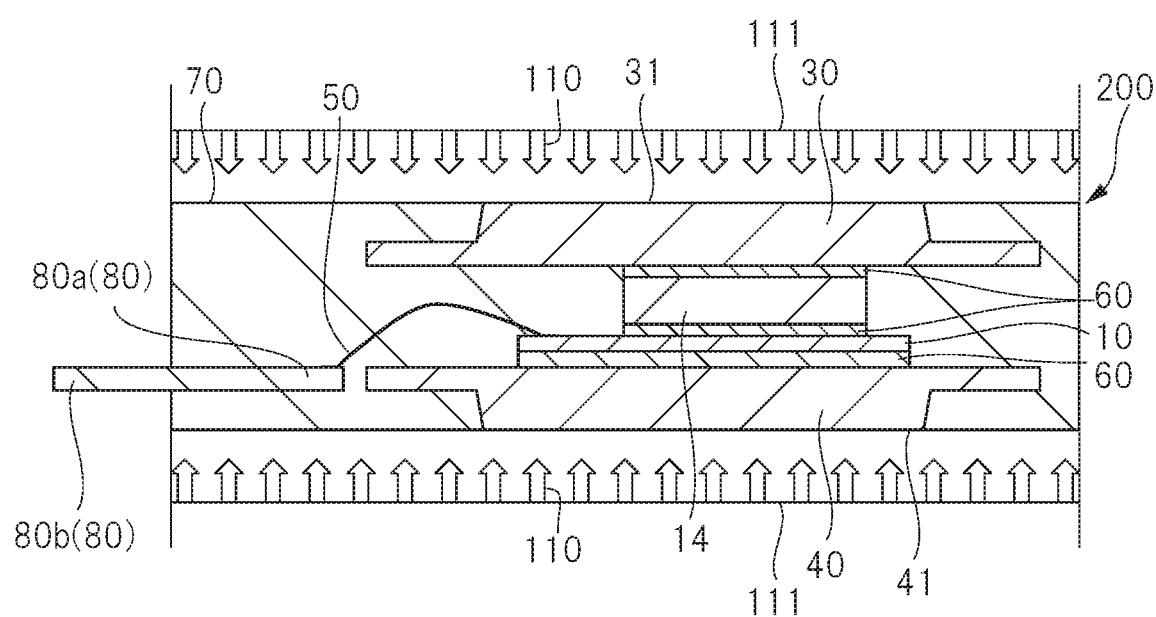
FIG. 28 is a cross-sectional view showing other shapes after laser irradiation of the semiconductor device in FIG. 26.
Figure 29:
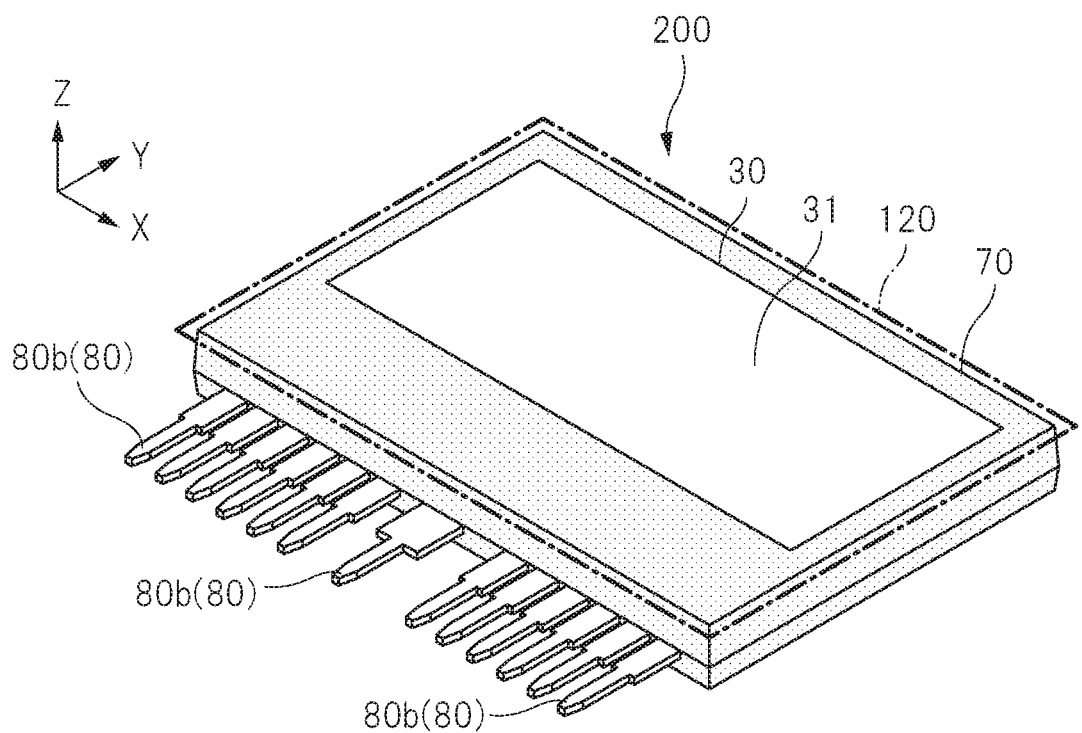
FIG. 29 is a perspective view showing the laser irradiation range in the assembly of a semiconductor device compared by the inventor.

FIG. 26 is a cross-sectional view showing a shape before laser irradiation in assembling the semiconductor device comparatively examined by the present inventor, FIG. 27 is a cross-sectional view showing a shape after laser irradiation of the semiconductor device of FIG. 26, and FIG. 28 is a cross-sectional view showing another shape after laser irradiation of the semiconductor device of FIG. 26. FIG. 29 is a perspective view showing a laser irradiation range in the assembly of the semiconductor device comparatively examined by the present inventor, and FIG. 30 is a perspective view showing a state of the semiconductor device after the laser irradiation range shown in FIG. 29 is irradiated with a laser.

In the structure after the resin molding shown in FIG. 26, when the top electrode 30 or the bottom electrode 40 made of the conductor part is exposed from the resin sealing body 70 by laser irradiation, a step difference is easily formed between the electrode surface (electrode surfaces 31 and 41) and the resin surface 75 on which the laser irradiation was not performed outside, as shown in the shape after the laser irradiation of FIG. 27. In other words, the present inventors have found that the electrode surfaces 31 and 41 are retracted from the resin surface 75, and a mounting failure is caused when the MCP 200 is mounted on a substrate or the like.

As shown in the shape after the laser irradiation in FIG. 28, it is conceivable that the laser irradiation is performed over the entire front surface and the entire back surface of the sealing body 70, but in this case, since it is necessary to perform the laser irradiation on the entire front surface and the entire back surface of the sealing body 70, the present inventor has found that the laser irradiation takes time and the efficiency is deteriorated (efficiency deterioration).

Figure 30:
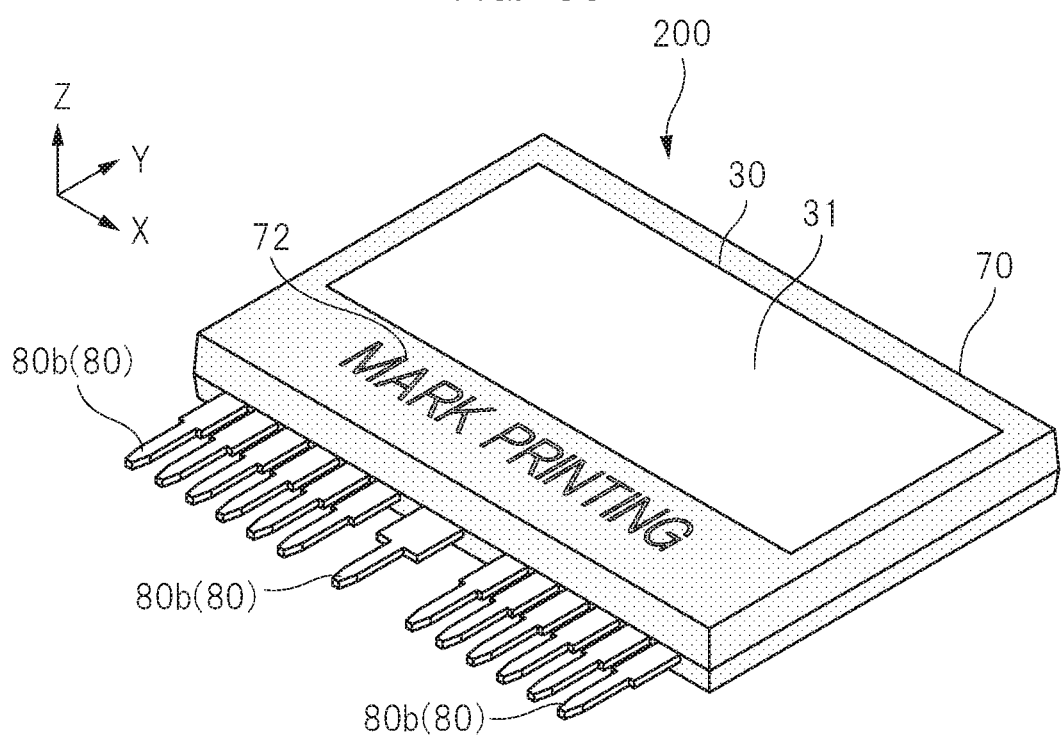
FIG. 30 is a perspective view illustrating a state of the FIG. 29's semiconductor device after irradiating a laser in a laser irradiation range.

Further, as shown in the laser irradiation range 120 of FIG. 29, when the laser irradiation is performed over the entire surface of the sealing body 70, as shown in FIG. 30, the mark 72 attached to the periphery of the electrode surface 31 exposed to the sealing body 70 is formed on the surface of the resin which has become a rough surface by the laser irradiation, and therefore, it is difficult to see (difficult to distinguish). Specifically, the present inventors have found that the contrast of the mark 72 is difficult to be obtained and difficult to be confirmed (mark visibility is poor).

Therefore, the First Embodiment which is a measure to cope with the problems of the above-mentioned mounting failure, efficiency deterioration, and mark visibility failure is described.

Figure 31:
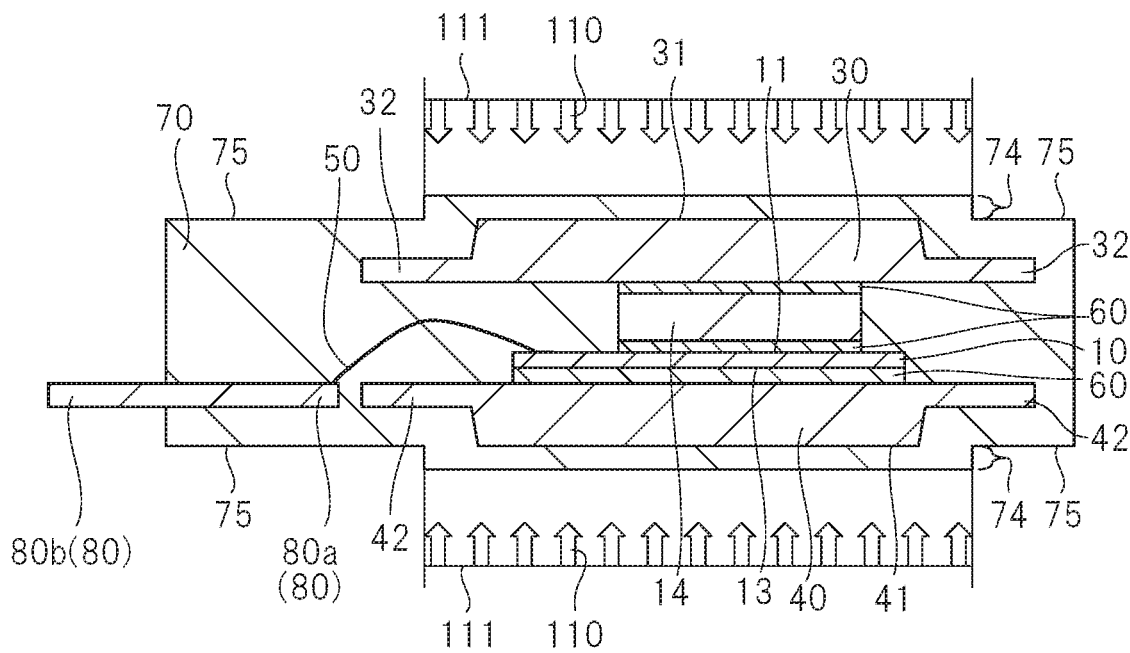
FIG. 31 is a cross-sectional view illustrating a structure prior to laser irradiation in the assembly of the semiconductor device in FIG. 5.
Figure 32:
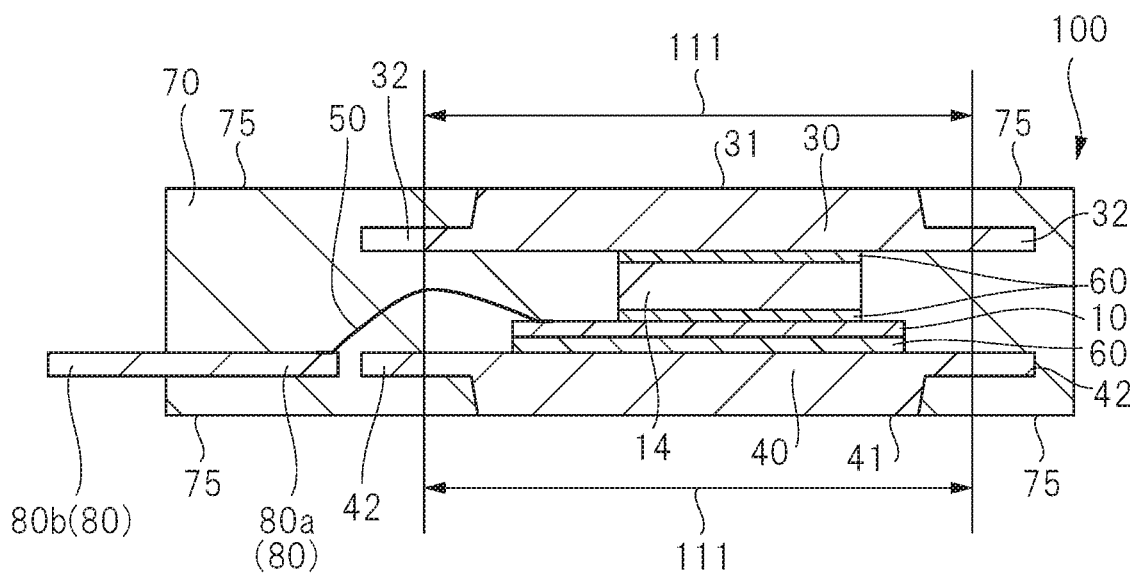
FIG. 32 is a cross-sectional view illustrating a structure after laser irradiation in the assembly of the semiconductor device in FIG. 5.
Figure 33:
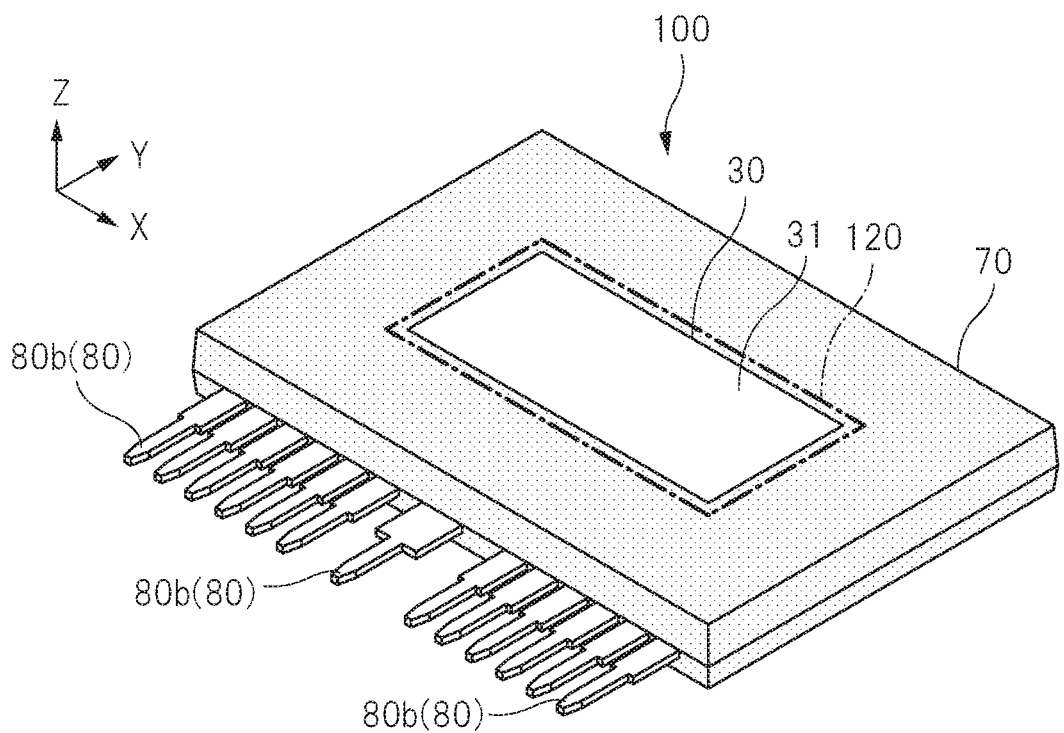
FIG. 33 is a perspective view illustrating an example of an irradiation range in laser irradiation of an assembly of the semiconductor device according to the first embodiment.
Figure 34:
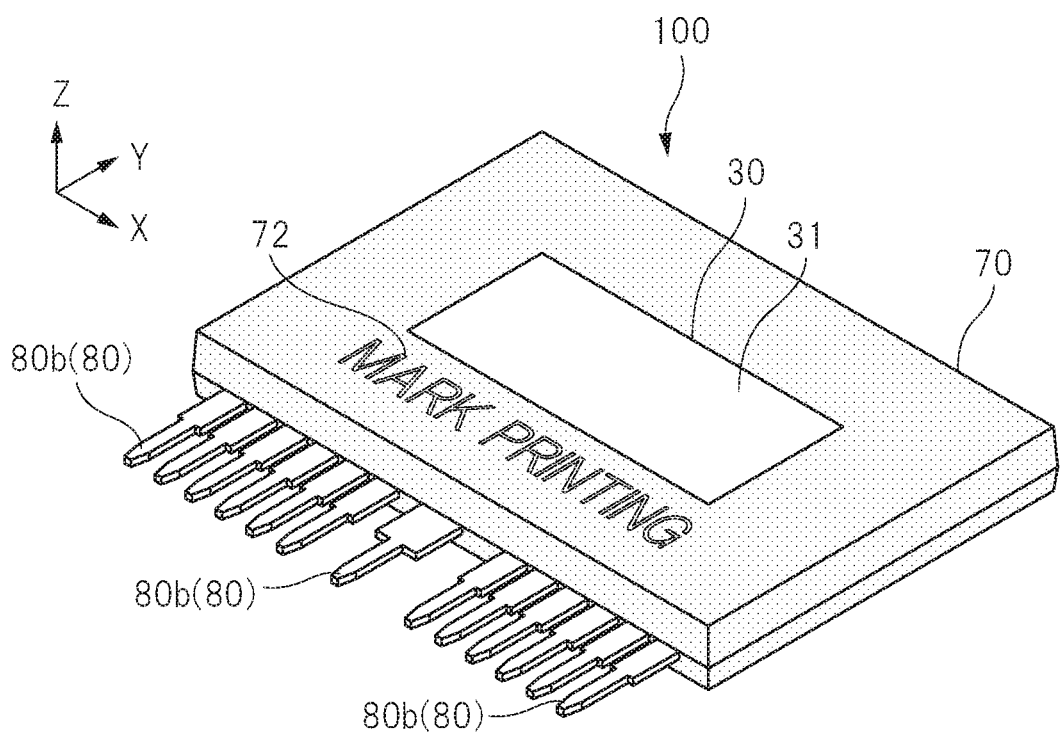
FIG. 34 is a perspective view illustrating a structure after irradiating a laser with the irradiation range in FIG. 33.

FIG. 31 is a cross-sectional view showing a structure before laser irradiation in the assembly of the semiconductor device shown in FIG. 5, FIG. 32 is a cross-sectional view showing a structure after laser irradiation in the assembly of the semiconductor device shown in FIG. 5, FIG. 33 is a perspective view showing an example of an irradiation range in laser irradiation in the assembly of the semiconductor device of the First Embodiment, and FIG. 34 is a perspective view showing a structure after laser irradiation in the irradiation range of FIG. 33.

FIG. 31 shows the structure before the laser irradiation in the electrode exposure (laser irradiation) step of the manufacturing flow of the semiconductor device shown in FIG. 5, and in the resin molding step of FIG. 5, the sealing body 70 is formed in a convex shape along the shape of the upper surface electrode 30 and the lower surface electrode 40, and the laser 110 is irradiated to the convex portion of the sealing body 70 in the electrode exposure (laser irradiation) step of FIG. 5.

That is, in the resin molding process of FIG. 5, the sealing body 70 is formed in a convex shape along the respective shapes of the upper surface electrode 30 and the lower surface electrode 40. Specifically, when the sealing body 70 is formed, the convex portion 74 is formed as the laser irradiation region 111 which is a region to be irradiated with the laser 110. The convex portion 74 is a resin portion removed by laser irradiation in the electrode exposure step, and is a portion of the sealing body 70 formed by a sealing resin in the resin molding step. Note that the laser irradiation region 111 in which the convex portion 74 is formed is a region slightly protruding from the upper surface electrode 30 and the lower surface electrode 40 to the outside thereof, and is a region wider than the upper surface electrode 30 and the lower surface electrode 40.

As described above, in the electrode exposing step of the manufacturing flow of the semiconductor device shown in FIG. 5, the convex portions 74 on the front surface and the rear surface of the sealing body 70 are irradiated with the laser 110 to remove the resin of the convex portions 74, thereby exposing the upper surface electrode 30 and the lower surface electrode 40, whereby the height of the electrode surface 31 of the upper surface electrode 30 and the height of the resin surface 75 can be made the same as shown in FIG. 32. In addition, the height of the electrode surface 41 of the lower electrode 40 and the height of the resin surface 75 can be made the same.

As a result, the above-described mounting failure can be avoided, and mounting of the MCP 100 on a board or the like can be enabled.

In addition, since the laser irradiation is performed only in a region slightly larger than the upper surface electrode 30 and the lower surface electrode 40, rather than performing the laser irradiation on the whole of the front surface and the rear surface of the sealing body 70, the irradiation area of the laser 110 can be reduced as compared with performing the laser irradiation on the whole of the front surface and the rear surface of the sealing body 70, and the efficiency of the laser irradiation can be improved (the efficiency deterioration described above can be avoided).

In addition, since the laser irradiation is performed only on the laser irradiation region 111, which is a limited region between the front surface and the back surface of the sealing body 70, the resin surface 75 on which the laser irradiation is not performed is not roughened. That is, as shown in FIG. 33, since the laser irradiation range 120 is limited on the surface of the sealing body 70, the resin surface 75 on which the laser irradiation is not performed is not roughened, the mark 72 shown in FIG. 34 attached to the resin surface 75 becomes easy to see, and the visibility of the mark 72 can be improved (the mark visibility defect can be avoided).

Note that even in the laser irradiation to the structure shown in FIG. 31, since the laser irradiation does not use the cutting edge, the running cost in assembling the MCP 100 can be reduced as compared with the laser irradiation in which the upper surface electrode 30 and the lower surface electrode 40 are exposed from the sealing body 70 by cutting using a cutting edge such as a grindstone. Further, since laser irradiation is employed to expose the upper surface electrode 30 and the lower surface electrode 40 from the sealing body 70, the productivity of laser irradiation is higher than that of cutting using a cutting blade such as a grindstone, so that the mass productivity of the semiconductor device (MCP 100) can be improved.

Figure 35:
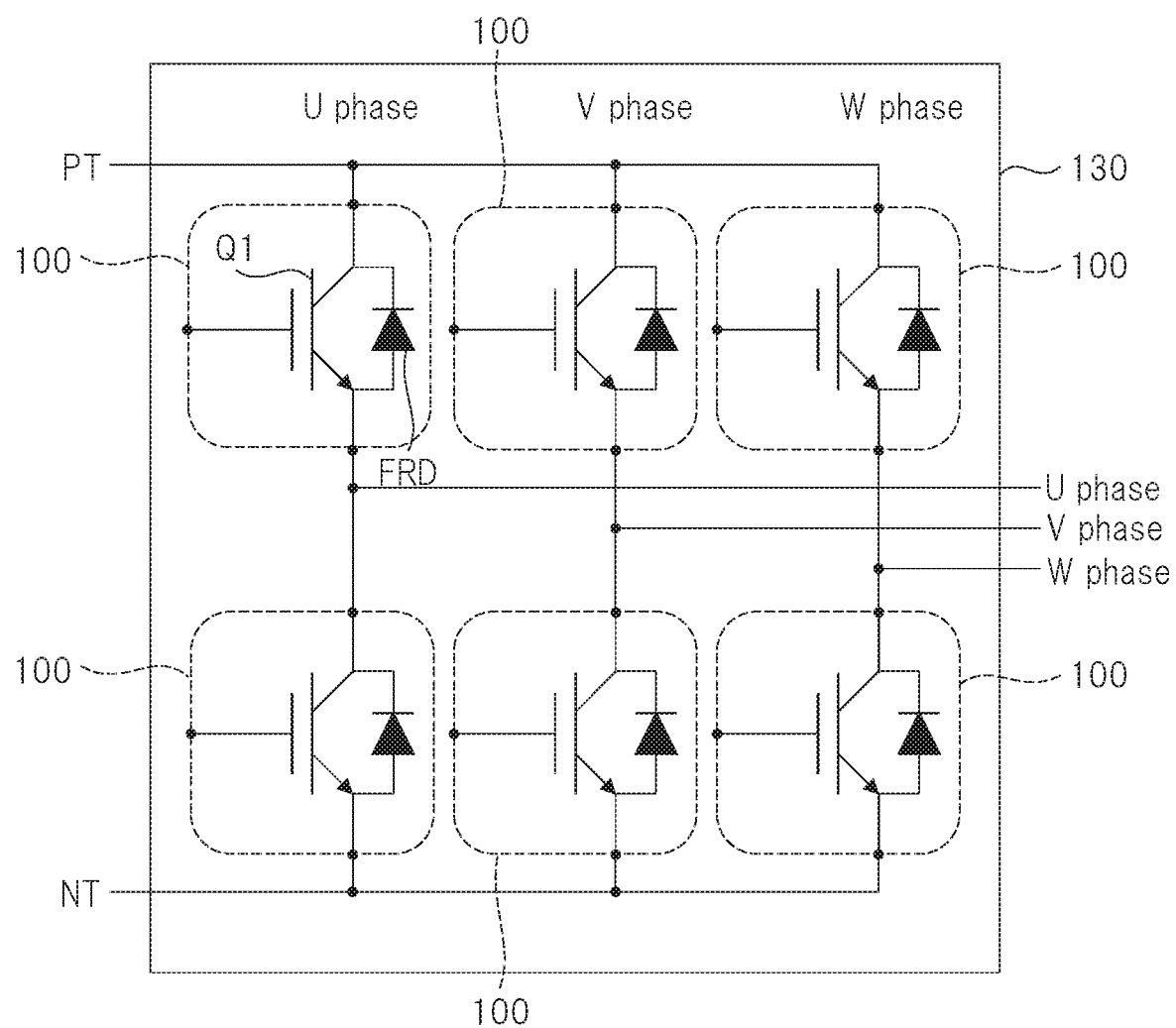
FIG. 35 is a circuit diagram illustrating a configuration in which the semiconductor device according to the first embodiment is applied to a three-phase inverter circuit.
Figure 36:
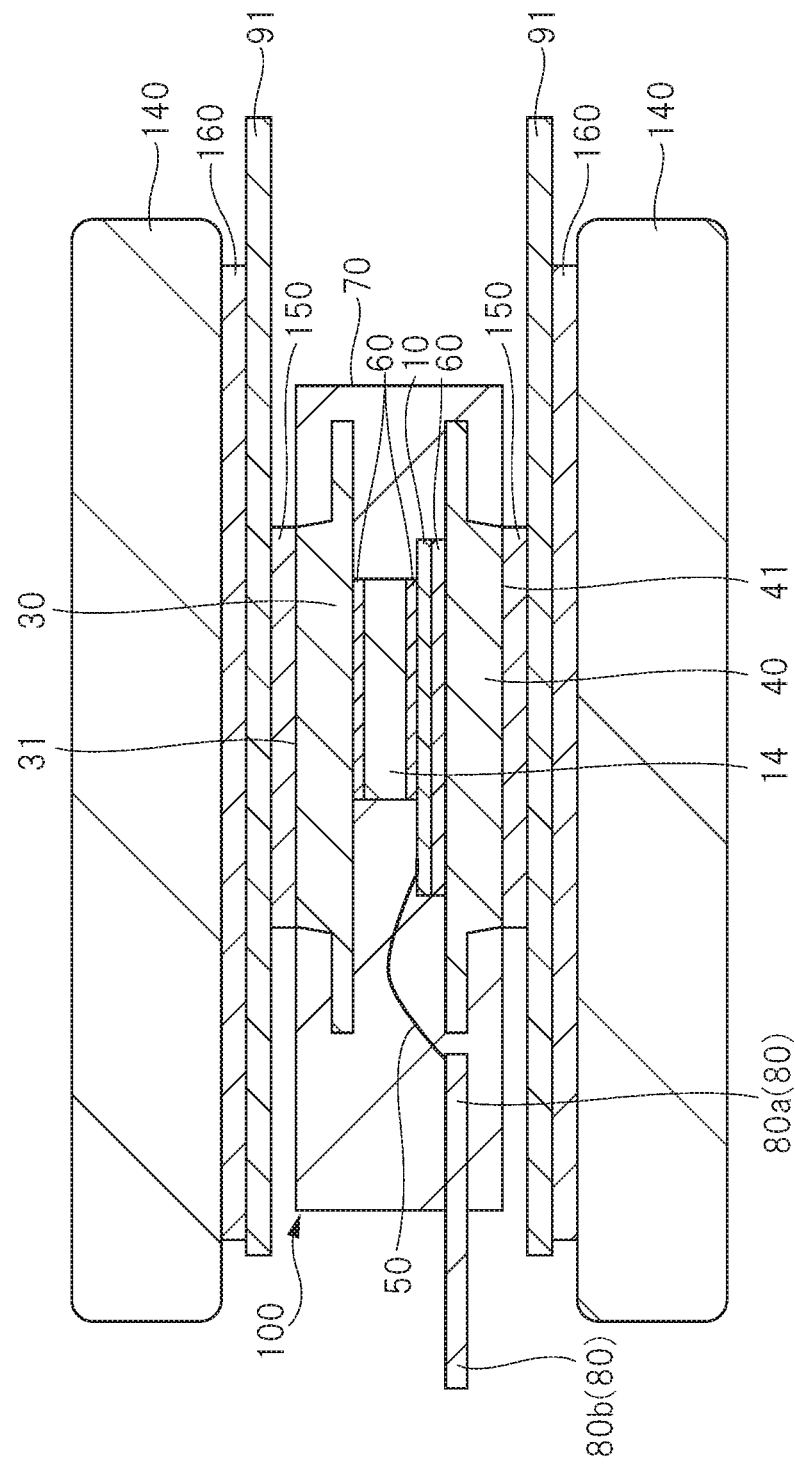
FIG. 36 is a cross-sectional view illustrating a cooling device mounting structure of a semiconductor device according to the first embodiment.

Next, the application example of the MCP 100 of the first embodiment is described. FIG. 35 is a circuit diagram showing a configuration in which the semiconductor device of the First Embodiment is applied to a three-phase inverter circuit, and FIG. 36 is a cross-sectional view showing a structure in which a cooler is mounted in the semiconductor device of the First Embodiment.

As shown in FIG. 35, the MCP 100 of the first embodiment can be applied to a three-phase inverter circuit 130 used in a three-phase induction motor (not shown) or the like. Six MCP 100 are mounted on the three-phase inverter circuit 130 shown in FIG. 35.

In addition, the three-phase inverter circuitry 130 shown in FIG. 35 is provided with a IGBT Q1 diode FRD corresponding to three phases. In other words, the IGBT Q1 and the diodes FRDs are connected in anti-parallel, thereby realizing the switching elements which are the constituent elements of the three-phase inverters 130.

In other words, in the three-phase inverter circuit 130, the IGBT Q1 and the diode FRD are connected in anti-parallel between the positive potential terminal PT and each phase (U phase, V phase, W phase) of the three-phase induction motor, and the IGBT Q1 and the diode FRD are also connected in anti-parallel between each phase of the three-phase induction motor and the negative potential terminal NT. That is, two IGBT Q1 and two diodes FRDs are provided for each single phase. As a result, the three-phase inverter circuit 130 includes six IGBT Q1 and six diodes FRDs. In the three-phase inverter circuit 130, the DC power is converted into three-phase AC power by the IGBT Q1 switching operation, and the three-phase AC power is supplied to the three-phase induction motor.

The structure shown in FIG. 36 shows a mounting structure when the MCP 100 of the first embodiment is incorporated in inverter circuits. For example, the cooler 140 on the upper surface side and the cooler 140 on the lower surface side are mounted across a plurality of MCP 100. The cooler 140 is, for example, a water-cooled type.

In addition, bus bars 91 for electrically connecting the upper surface electrodes 30 and the lower surface electrodes 40 of the plurality of MCP 100 are provided on the upper surface side and the lower surface side, respectively. Each of the upper surface electrodes 30 and the bus bar 91 on the upper surface side, and each of the lower surface electrodes 40 and the bus bar 91 on the lower surface side are bonded to each other via a mounting solder 150.

In addition, the bus bar 91 on the upper surface side and the cooler 140 on the upper surface side, and the bus bar 91 on the lower surface side and the cooler 140 on the lower surface side are joined by a heat radiation grease 160, respectively.

As described above, the MCP 100 of the first embodiment is connected to the cooler 140, and a plurality of MCP 100 are electrically connected by the bus bar 91, so that the inverter circuit can be mounted even in the inverter circuit.

Second Embodiment

Figure 37:
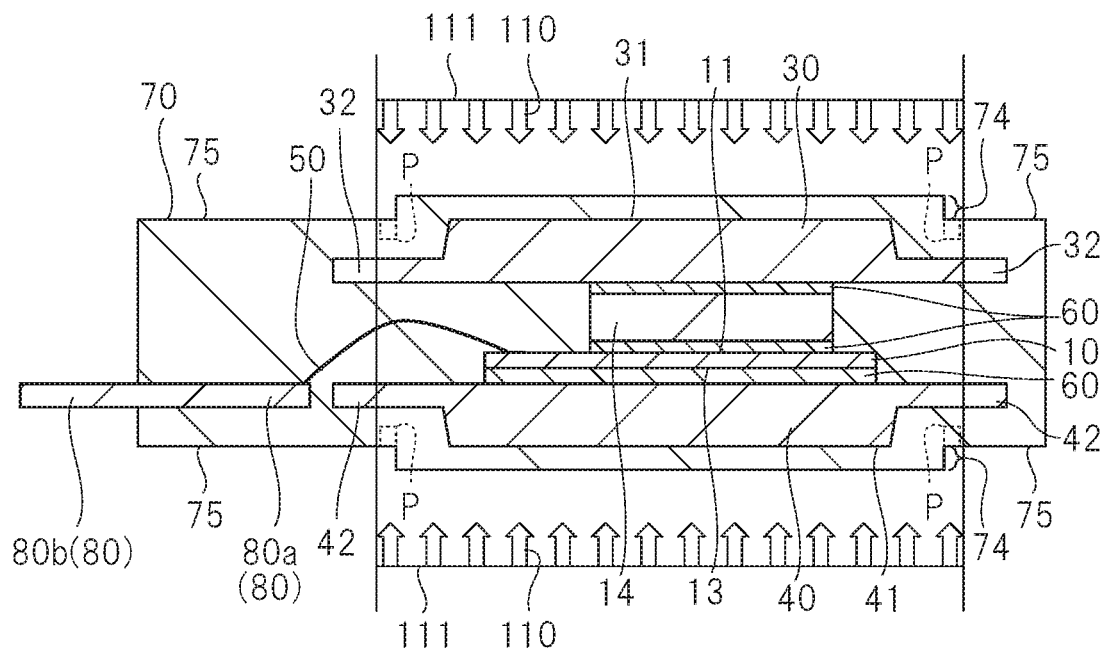
FIG. 37 is a cross-sectional view illustrating a structure prior to laser irradiation in the assembly of a semiconductor device according to the second embodiment.
Figure 38:
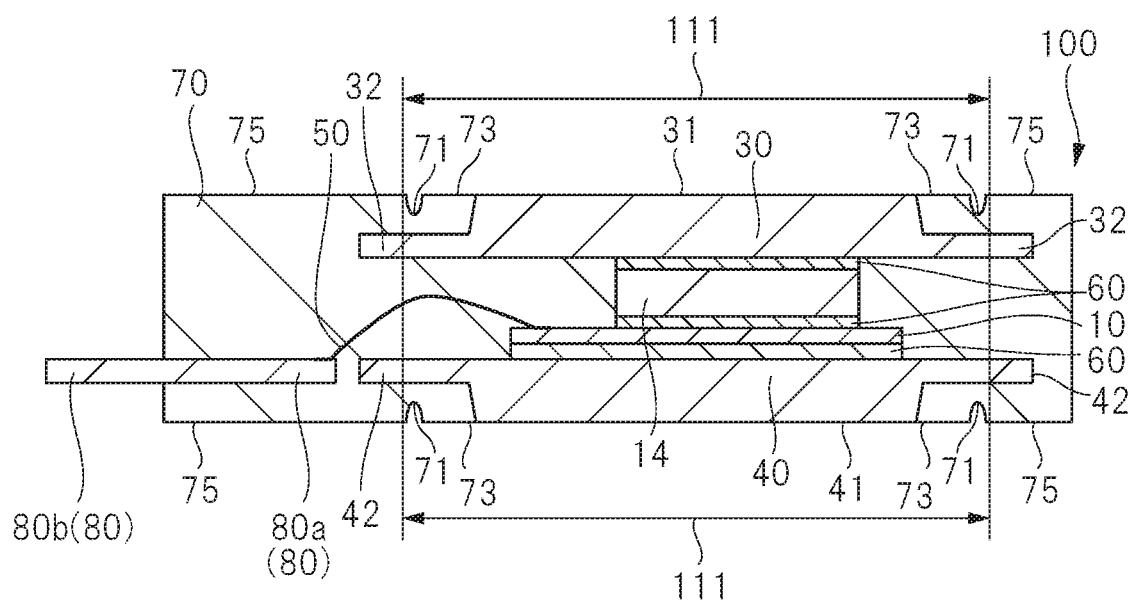
FIG. 38 is a cross-sectional view illustrating a structure after laser irradiation in the assembly of a semiconductor device according to the second embodiment.
Figure 39:
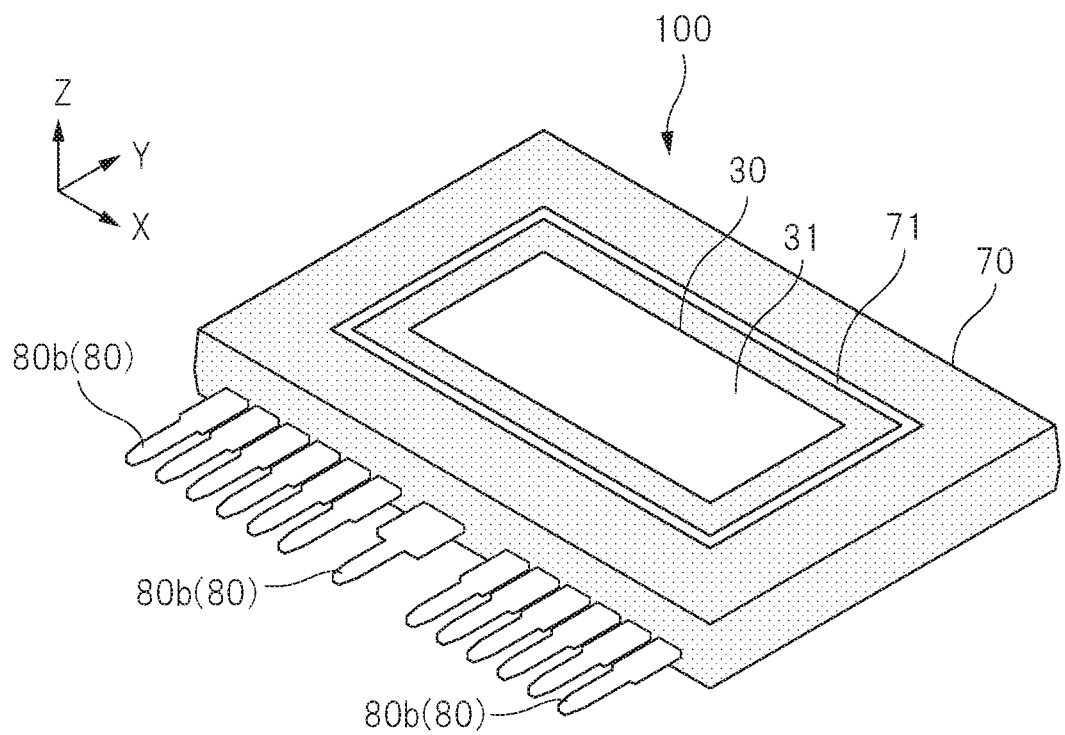
FIG. 39 is a perspective view illustrating an example of a structure of a semiconductor device according to the second embodiment.

FIG. 37 is a cross-sectional view illustrating a structure prior to laser irradiation in the assembly of a semiconductor device according to the second embodiment, FIG. 38 is a cross-sectional view illustrating a structure after laser irradiation in the assembly of a semiconductor device according to the second embodiment, and FIG. 39 is a perspective view illustrating an example of a structure of a semiconductor device according to the second embodiment.

The semiconductor device of the second embodiment is the same as the semiconductor device of the first embodiment in the MCP 100, but the semiconductor device differs from the MCP 100 of the first embodiment in that the planar size of the convex portion 74 of the sealing body 70 shown in FIG. 37 formed in the resin-molding process of FIG. 5 is smaller than that of the laser-irradiated area 111. As a result, in the electrode exposure (laser irradiation) step of the manufacturing flow of the semiconductor device shown in FIG. 5, the laser 110 is also irradiated to the convex portion 74 of the sealing body 70 and the region outside the convex portion 74.

In other words, the length in the width direction of the convex portion 74 of the sealing body 70 is made smaller than the width of the laser irradiation region 111. As a result, clearances can be formed between the edge portions of the convex portions 74 of the sealing body 70 and the end portions of the laser 110 to be irradiated in the laser irradiating step (the electrode-exposing step), and stable mass production of the MCP 100 can be improved. That is, the productivity of the MCP 100 can be improved.

In addition, when the laser irradiation region 111 shown in FIG. 37 is made larger than the width of the convex portion 74 of the sealing body 70 and the laser 110 is irradiated, the outer portion of the convex portion 74 in the sealing body 70 is shaved by the laser 110, and therefore, as shown in FIG. 38, a groove 71 is formed outside the electrode surfaces 31 and 41 on the front surface and the back surface of the sealing body 70 so as to surround the electrode surfaces 31 and 41. For example, as in the MCP 100 shown in FIG. 39, grooves 71 are formed on the surface of the sealing body 70 so as to surround the electrode surface 31 of the upper electrode 30 in plan view. Similarly to the upper surface side, a groove 71 is formed on the rear surface side of the sealing body 70 shown in FIG. 38 so as to surround the electrode surface 41 of the lower electrode 40.

In the laser irradiation step, the laser 110 is irradiated on the front surface and the back surface of the sealing body 70 to remove the resin covering the upper surface electrode 30 and the lower surface electrode 40. At this time, the laser 110 is irradiated to the workpiece a plurality of times while scanning the laser 110 or scanning the workpiece in the X direction and the Y direction shown in FIG. 1. In the laser irradiation shown in FIG. 37, the laser 110 is irradiated so that the laser irradiation region 111 is slightly larger than the width of the convex portion 74 of the sealing body 70. As a result, the resin of the convex portion 74 on the surface of the sealing body 70 is scraped off, so that the electrode surface 31 of the upper electrode 30 is formed and the convex portion 74 is eliminated. At this time, since the laser 110 is also irradiated to the region (P portion) slightly outside the convex portion 74, the groove 71 shown in FIG. 38 is formed in the region (P portion) at substantially the same depth as the height of the convex portion 74.

At this time, since the laser 110 has a strong directivity, when the laser 110 is irradiated while scanning in the X direction and the Y direction, the laser 110 is cut in the same manner in the X direction and the Y direction, so that the convex portion 74 is cut off and the region (P portion) around the convex portion 74 shown in FIG. 37 is also cut off, and as a result, the groove 71 is formed so as to surround the electrode surface 31 or the electrode surface 41 as shown in FIG. 38.

In the structure shown in FIG. 38, a flat surface 73 of resin is formed on the surface of the sealing body 70 on the inner side and the outer side of the groove 71. Similarly, a resin flat surface 73 is formed on the inner side and the outer side of the groove 71 on the back surface of the sealing body 70.

Further, inside the sealing body 70, the internal portion (part) 32 of the upper surface electrode 30 is disposed below the groove 71 on the upper surface side, and the projecting portion (part) 42 of the lower surface electrode 40 is disposed above the groove 71 on the lower surface side.

Also in the laser irradiation of the second embodiment, compared with the case where the upper surface electrode 30 and the lower surface electrode 40 are exposed from the sealing body 70 by cutting using a cutting blade such as a grindstone, the running cost can be reduced because the cutting blade is not used. Further, by employing laser irradiation to expose the upper surface electrode 30 and the lower surface electrode 40 from the sealing body 70, the productivity of laser irradiation is higher than that of cutting using a cutting blade such as a grindstone, so that the mass productivity of the MCP 100 can be improved.

Third Embodiment

Figure 40:
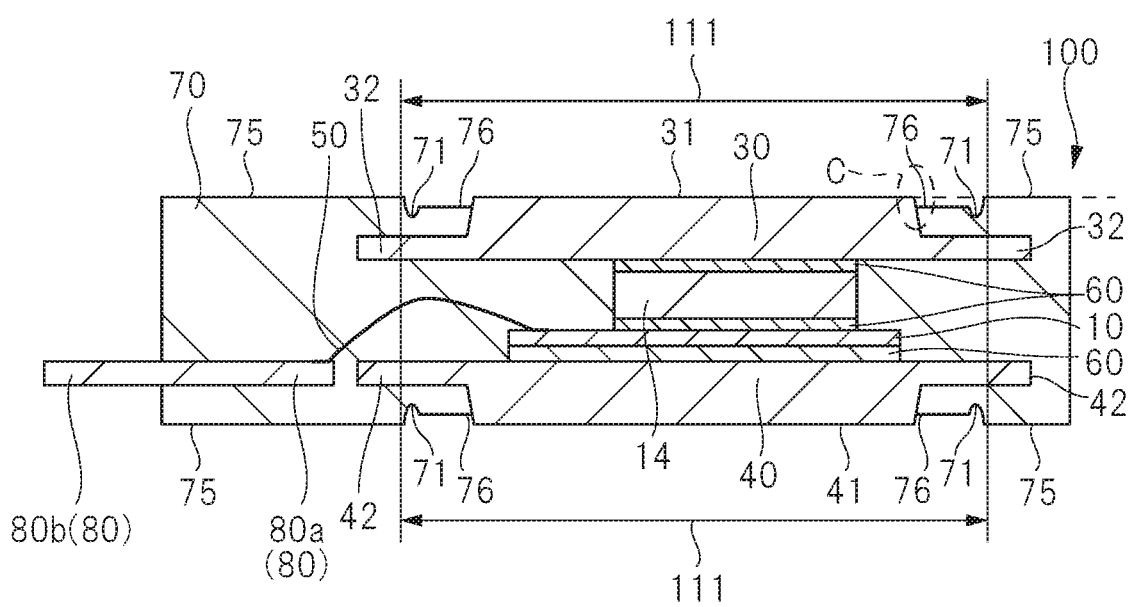
FIG. 40 is an A cross-sectional view showing the structure after laser irradiation in the assembly of a semiconductor device compared by the present inventor.
Figure 41:
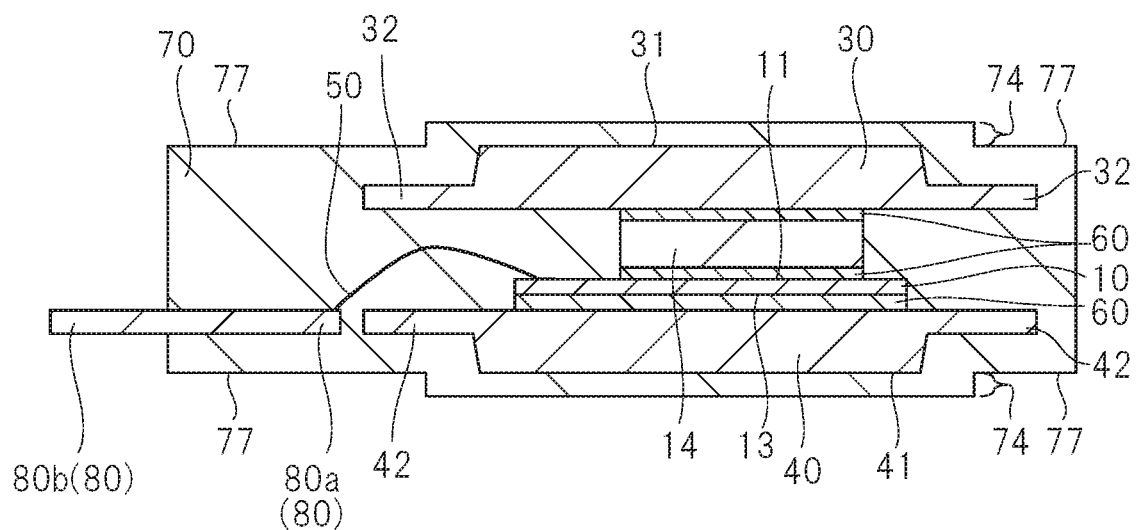
FIG. 41 is a cross-sectional view illustrating the structure prior to laser irradiation in the assembly of the semiconductor device compared by the inventors.
Figure 42:
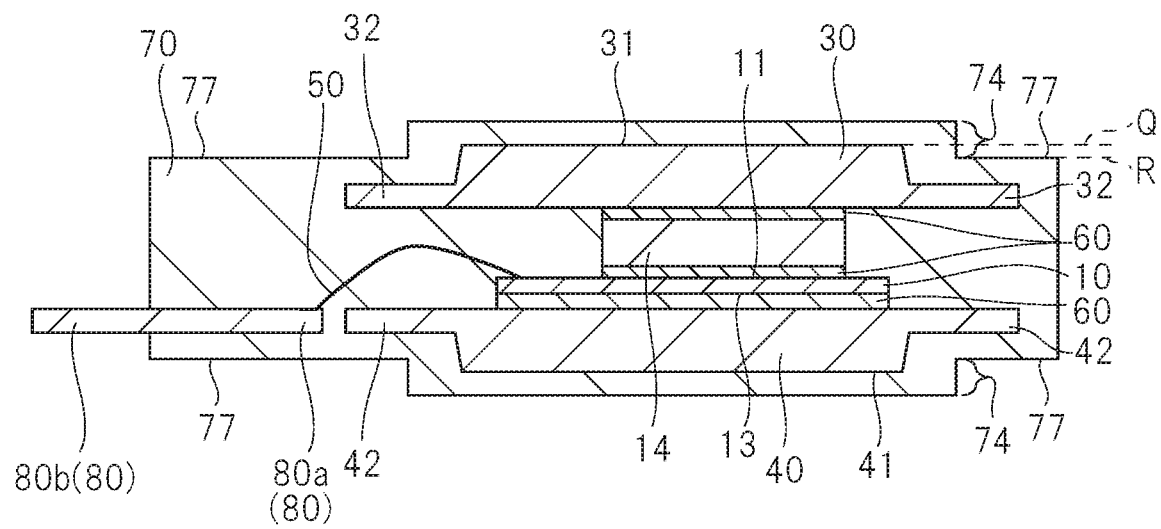
FIG. 42 is a cross-sectional view illustrating a structure prior to laser irradiation in the assembly of a semiconductor device according to the third embodiment.
Figure 43:
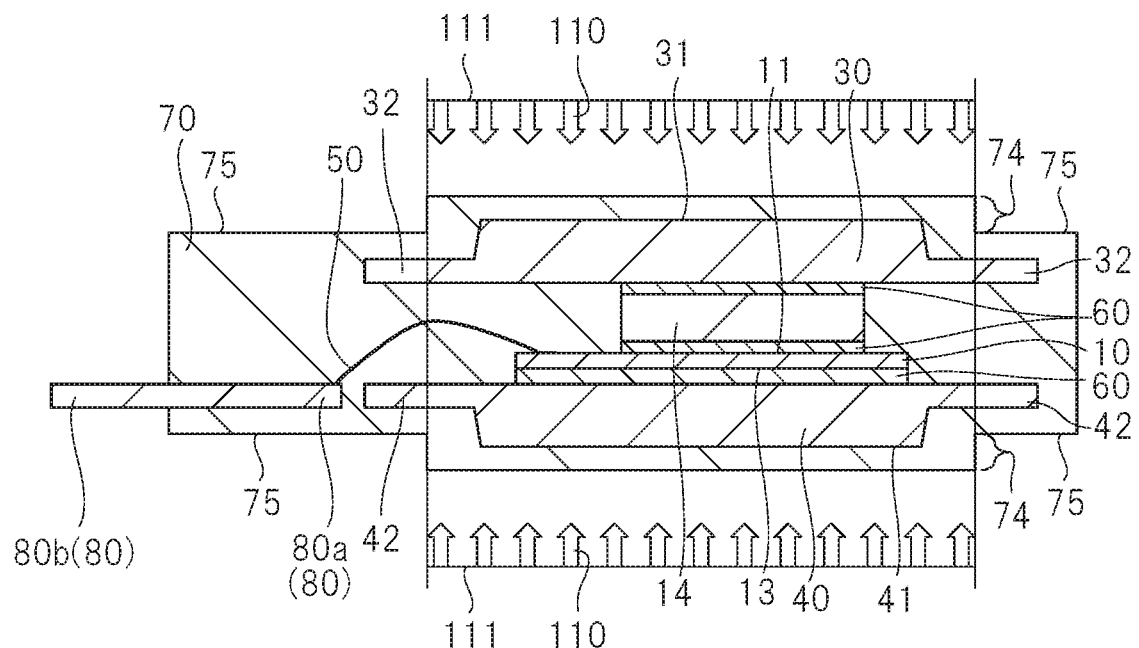
FIG. 43 is a cross-sectional view illustrating a structure prior to laser irradiation in the assembly of a semiconductor device according to the third embodiment.
Figure 44:
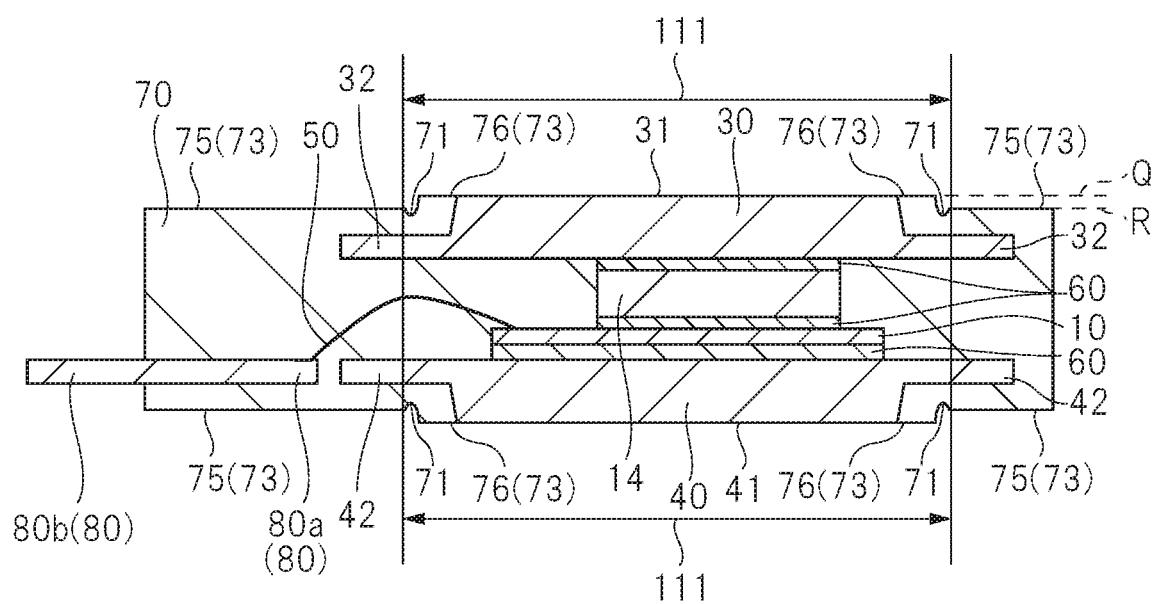
FIG. 44 is a cross-sectional view illustrating a structure after laser irradiation in the assembly of a semiconductor device according to the third embodiment.
Figure 45:
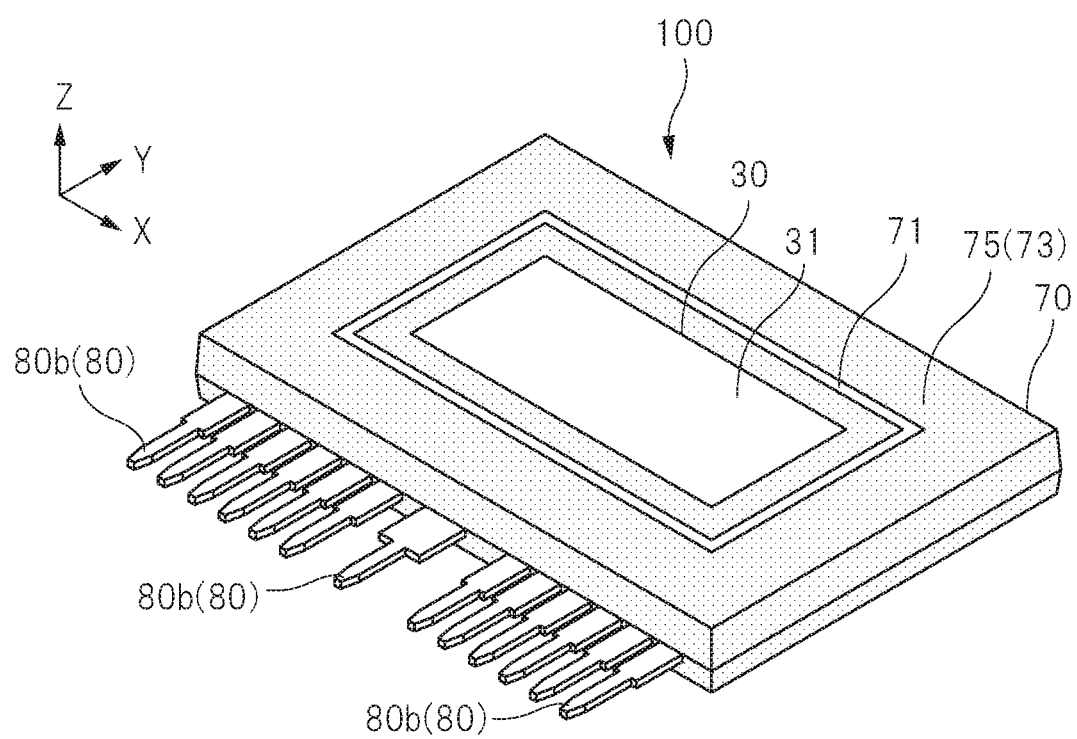
FIG. 45 is a perspective view illustrating an example of a structure of a semiconductor device according to the third embodiment.

FIG. 40 is a cross-sectional view showing the structure after laser irradiation in the assembly of the semiconductor device comparatively examined by the present inventor, and FIG. 41 is a cross-sectional view showing the structure before laser irradiation in the assembly of the semiconductor device comparatively examined by the present inventor. FIG. 42 is a cross-sectional view showing the structure before laser irradiation in the assembly of the semiconductor device of tha Third Embodiment, FIG. 43 is a cross-sectional view showing the structure before laser irradiation in the assembly of the semiconductor device of the Third Embodiment, FIG. 44 is a cross-sectional view showing the structure after laser irradiation in the assembly of the semiconductor device of the Third Embodiment, and FIG. 45 is a perspective view showing an example of the structure of the semiconductor device of the Third Embodiment.

In the laser irradiation shown in FIG. 40, when the mass productivity of assembling the semiconductor device is considered (the resin is surely removed from the electrode surface), the height of the resin surface 76 around the upper electrode 30 may become lower than that of the electrode surface 31 of the upper electrode 30, as shown in part C of FIG. 40. That is, the height of the resin surface 76 around the exposed electrode surface 31 may be lower than the height of the exposed electrode surface 31 due to the flatness of the upper electrode 30 and the manufacturing variation of the height of the electrode surface 31.

That is, since the resin surface 75 outside the groove 71 is molded by a mold (not shown), it is difficult to form the resin surface 75 at the same height as the electrode surface 31. In this case, the resin surface 75 on the outer side of the groove 71 and the resin surface 76 on the inner side of the groove 71 may form a step, and the electrode surface 31 of the upper electrode 30 may not be soldered.

Therefore, in the third embodiment, in the shape of the sealing body 70 before the laser irradiation, as shown in FIG. 42, the height R of the resin surface 77 around the convex portion 74 of the sealing body 70 is set to be lower than the height Q of the electrode surface 31 of the upper surface electrode 30 in advance. That is, in the structure of the laser irradiation which has been subjected to the comparative study shown in FIG. 41, the height of the resin surface 77 around the convex portion 74 of the sealing body 70 is the same as the height of the electrode surface 31 of the upper electrode 30, whereas in the structure of the laser irradiation of the embodiment 3 of FIG. 42, the height R of the resin surface 77 around the convex portion 74 of the sealing body 70 is formed to be lower than the height Q of the electrode surface 31 of the upper electrode 30 in advance (the height of the Q portion>the height of the R portion).

In this structure, when the sealing body 70 is formed in the resin molding process shown in FIG. 5, the sealing body 70 is formed so that the height of the resin surface 77 around the convex portion 74 of the sealing body 70 is lower than the height of the electrode surface 31 of the upper surface electrode 30.

This structure is then irradiated with a laser 110 as shown in FIG. 43. That is, the laser 110 is irradiated by making the laser irradiation region 111 shown in FIG. 43 larger than the width of the convex portion 74 of the sealing body 70. As a result, since the outer portion of the convex portion 74 of the sealing body 70 is scraped by the laser 110, as shown in FIGS. 44 and 45, a groove 71 is formed on the outer side of the electrode surfaces 31 and 41 on the front surface and the back surface of the sealing body 70 so as to surround the electrode surfaces 31 and 41.

Further, in the resin molding process, since the sealing body 70 is formed so that the height of the resin surface 77 around the convex portion 74 of the sealing body 70 is lower than the height of the electrode surface 31 of the upper electrode 30, the height of the resin surface 75 located outside the groove 71 is formed to be lower than the height of the resin surface 76 located inside the groove 71 as shown in FIG. 44 by the laser irradiation in the electrode exposure process (height of the Q portion>height of the R portion).

In other words, in the sealing body 70, the flat surface 73 located on the outside of the groove 71 is located closer to the center in the thickness direction of the sealing body 70 than the flat surface 73 located on the inside of the groove 71 in the Z direction shown in FIG. 45. In other words, in the sealing body 70, the flat surface 73 located outside the groove 71 is disposed closer to the center in the thickness direction of the sealing body 70 than the electrode surface 31 of the upper electrode 30 or the electrode surface 41 of the lower electrode 40.

In this manner, in the sealing body 70, since the height of the resin surface 75 located outside the groove 71 is formed to be lower than the height of the resin surface 76 located inside the groove 71, the resin surface 75 located outside the groove 71 is located at a position retracted from the electrode surface 31 of the upper electrode 30 or the electrode surface 41 of the lower electrode 40, so that the mounting property of the MCP 100 can be ensured (improved).

Also in the MCP 100 of the third embodiment, inside the sealing body 70, the projecting portion (some) 32 of the upper electrode 30 is disposed below the groove 71 on the upper surface side, and the projecting portion (part) 42 of the lower electrode 40 is disposed above the groove 71 on the lower surface side.

Note that also in the laser irradiation of the Third Embodiment, since the cutting edge is not used, the running cost can be reduced as compared with the case where the upper surface electrode 30 and the lower surface electrode 40 are exposed from the sealing body 70 by cutting using a cutting edge such as a grindstone. Further, by employing laser irradiation to expose the upper surface electrode 30 and the lower surface electrode 40 from the sealing body 70, the productivity of laser irradiation is higher than that of cutting using a cutting blade such as a grindstone, so that the mass productivity of the MCP 100 can be improved.

Next, effects obtained by the application of the MCP 100 of the third embodiment are described.

Figure 46:
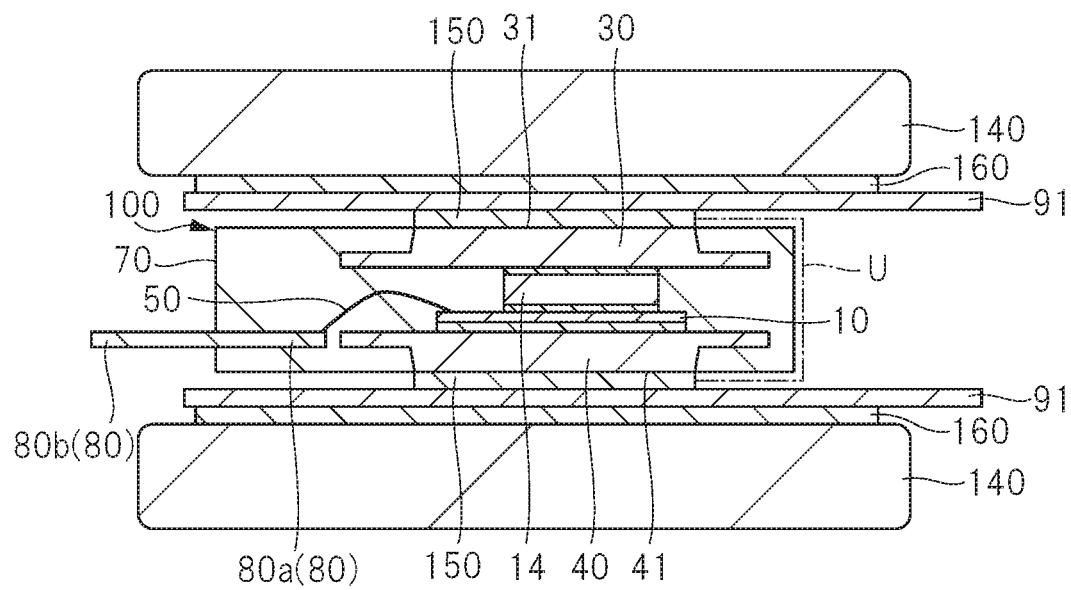
FIG. 46 is an A cross-sectional view illustrating a cooling unit mounting structure of a semiconductor device compared to which the present inventor has studied.
Figure 47:
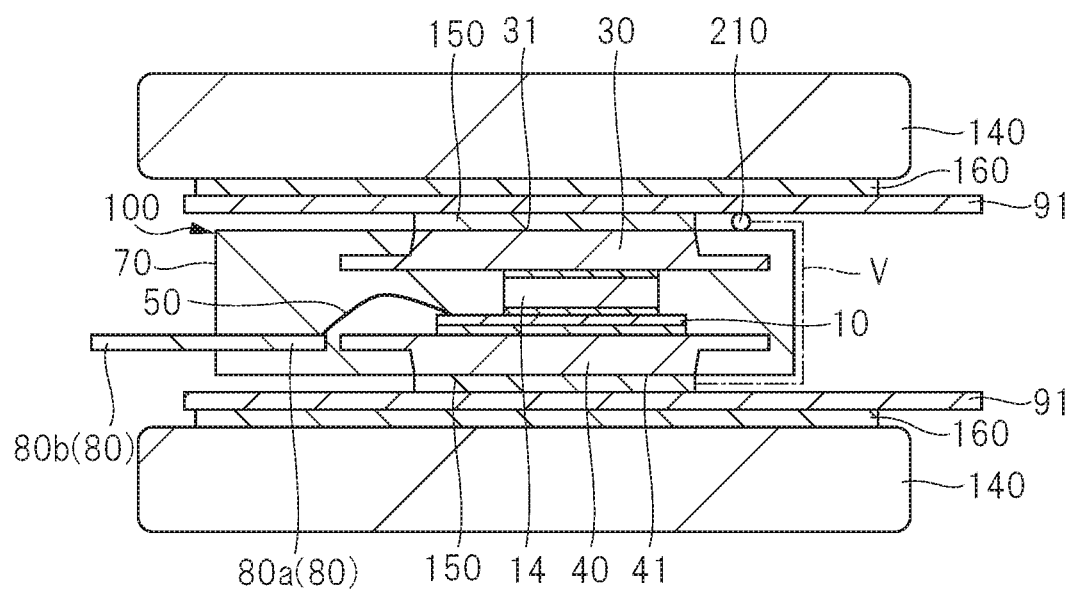
FIG. 47 is a cross-sectional view illustrating a cooling unit mounting structure of a semiconductor device compared to which the present inventor has studied.
Figure 48:
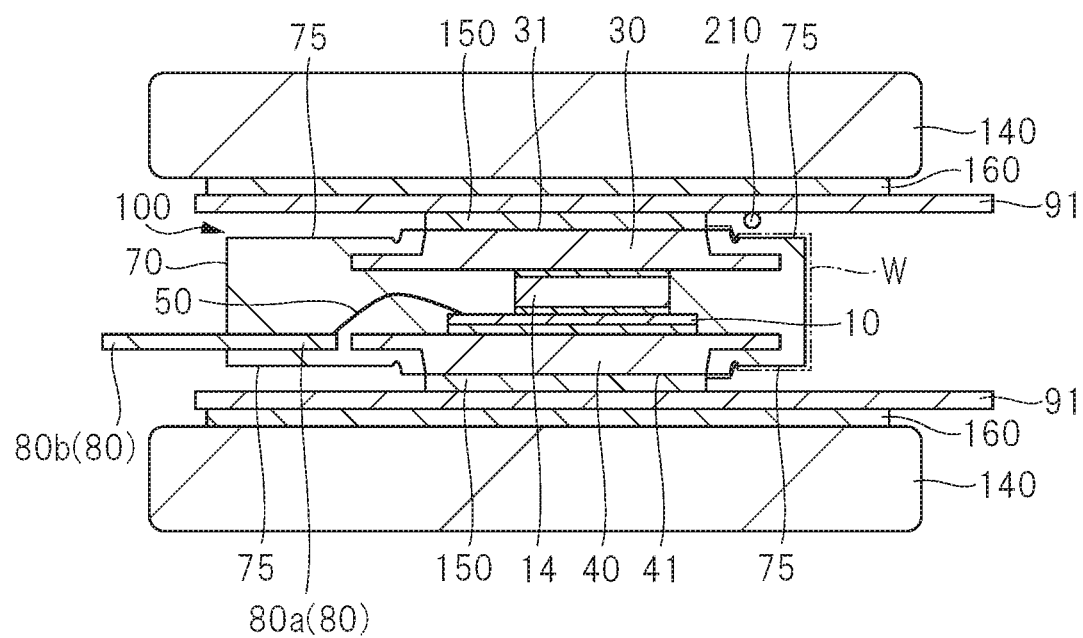
FIG. 48 is a cross-sectional view illustrating a cooling unit mounting structure of a semiconductor device according to the third embodiment.

FIGS. 46 and 47 are cross-sectional views showing a cooler mounting structure of the semiconductor device comparatively examined by the present inventor, and FIG. 48 is a cross-sectional view showing a cooler mounting structure of the semiconductor device of the Third Embodiment.

In the configuration of the MCP 100 shown in FIG. 46, the distance along the sealing body 70 between the electrode surface 31 of the upper electrode 30 and the electrode surface 41 of the lower electrode 40 is the creepage distance U. Then, as shown in FIG. 47, solder balls 210 may be formed from scattered solder, such as when the bus bar 91 is mounted on the MCP 100 using the mounting solder 150, and when the solder balls 210 are disposed on the sealing body 70, they may be sandwiched between the sealing body 70 and the bus bar 91.

In this case, the distance along the sealing body 70 between the electrode surface 31 of the upper electrode 30 and the electrode surface 41 of the lower electrode 40 is the creepage distance V, and the distance is shorter than the creepage distance U (creepage distance V<creepage distance U). That is, the occurrence of solder balls shortens the creepage distance and increases the possibility that a short circuit occurs between the upper surface electrode 30 and the lower surface electrode 40.

Accordingly, in the MCP 100 of the present the third embodiment shown in FIG. 48, since a step is provided between the electrode surfaces 31, 41 and the resin surface 75, the presence of the solder ball 210 is not affected by the solder ball 210. That is, in the MCP 100 of FIG. 48, the distance along the sealing body 70 between the electrode surface 31 of the upper electrode 30 and the electrode surface 41 of the lower electrode 40 is the creepage distance W, and short-circuiting due to generation of solder balls can be avoided.

Note that the step between the electrode surfaces 31 and 41 and the resin surface 75 is preferably equal to or greater than 0.06 mm, for example, when the withstand voltage is 600 V, and is preferably equal to or greater than 0.45 mm, for example, when the withstand voltage is 1200 V, from the viewpoint of the space distance for ensuring the insulating property.

Fourth Embodiment

Figure 49:
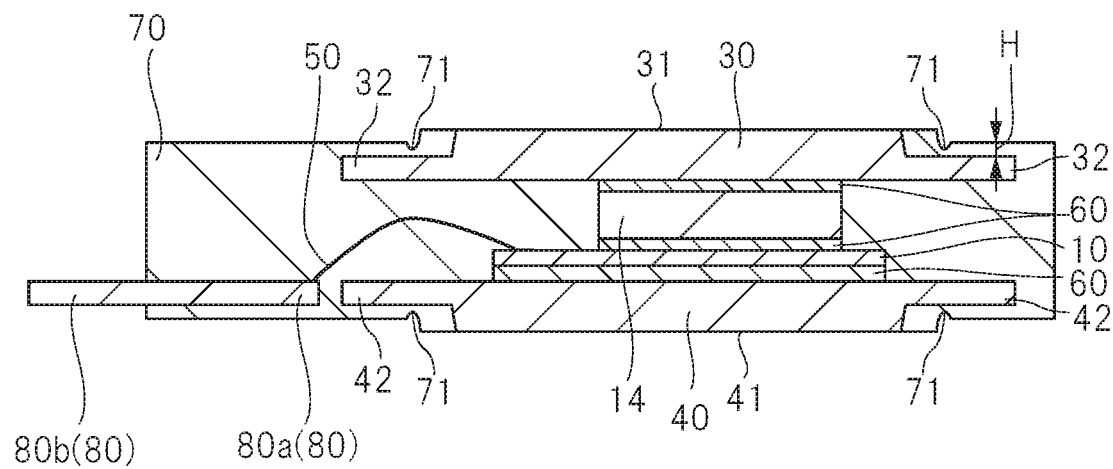
FIG. 49 is a cross-sectional view illustrating the structure after laser irradiation of a semiconductor device compared by the present inventor.
Figure 50:
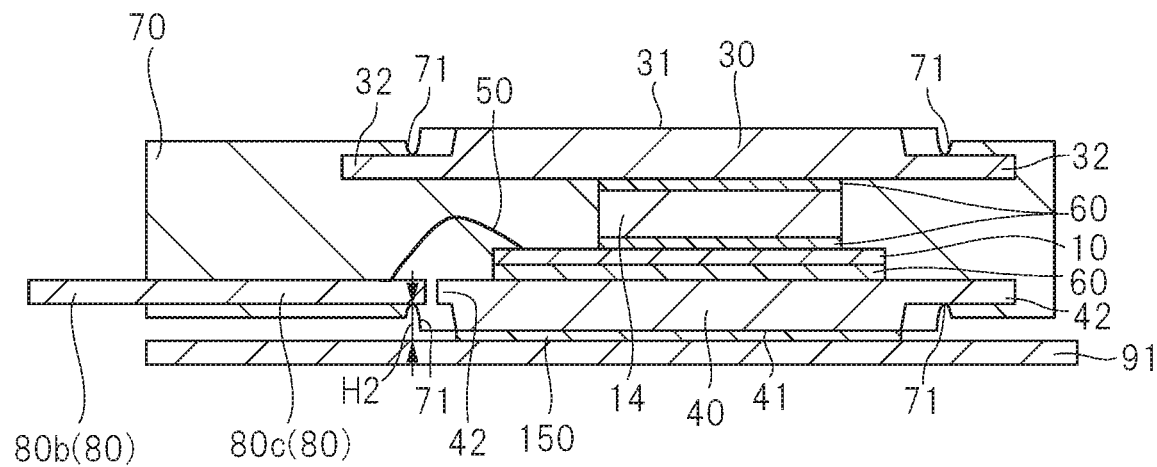
FIG. 50 is a cross-sectional view illustrating the structure after laser irradiation of a semiconductor device compared by the present inventor.
Figure 51:
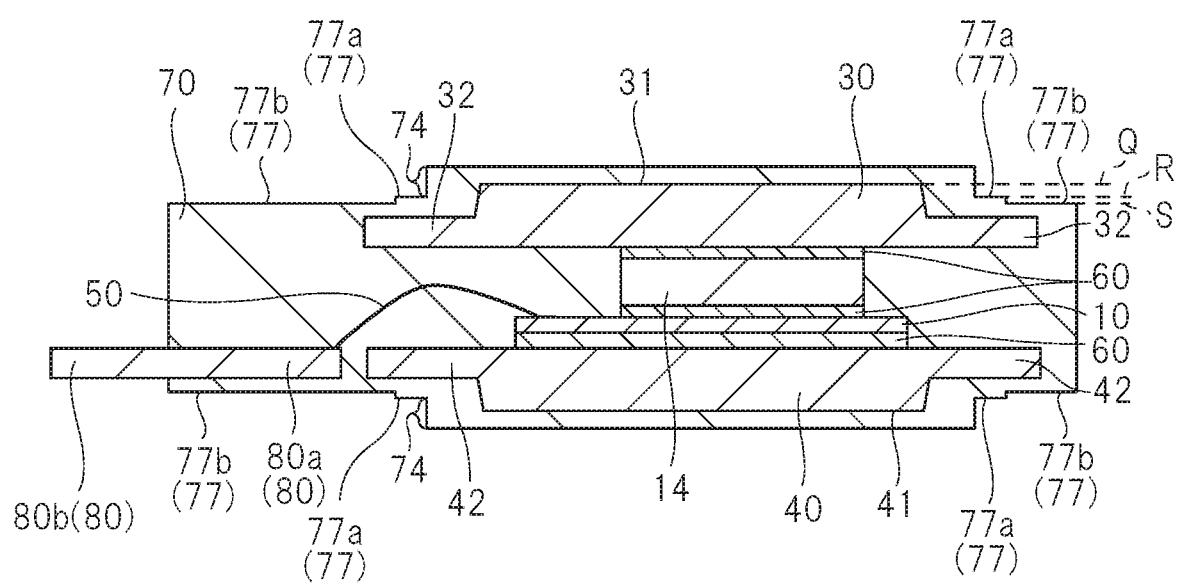
FIG. 51 is a cross-sectional view illustrating a structure prior to laser irradiation in the assembly of a semiconductor device according to an embodiment.
Figure 54:
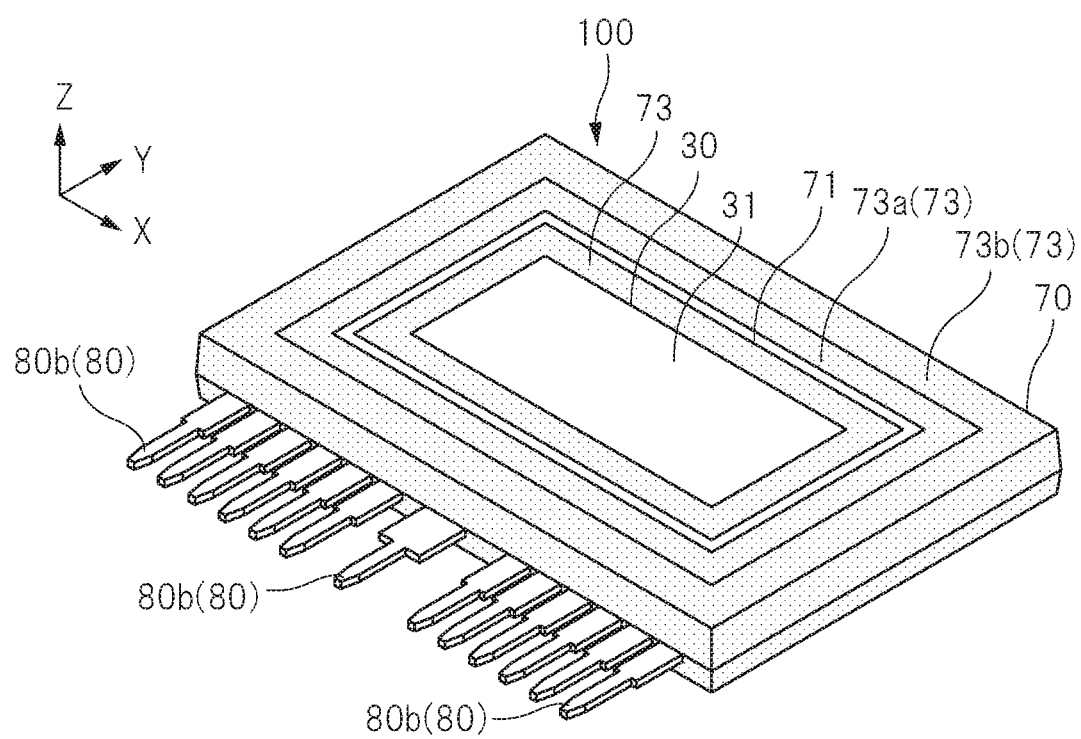
FIG. 54 is a perspective view illustrating an example of a structure of a semiconductor device according to the fourth embodiment.
Figure 55:
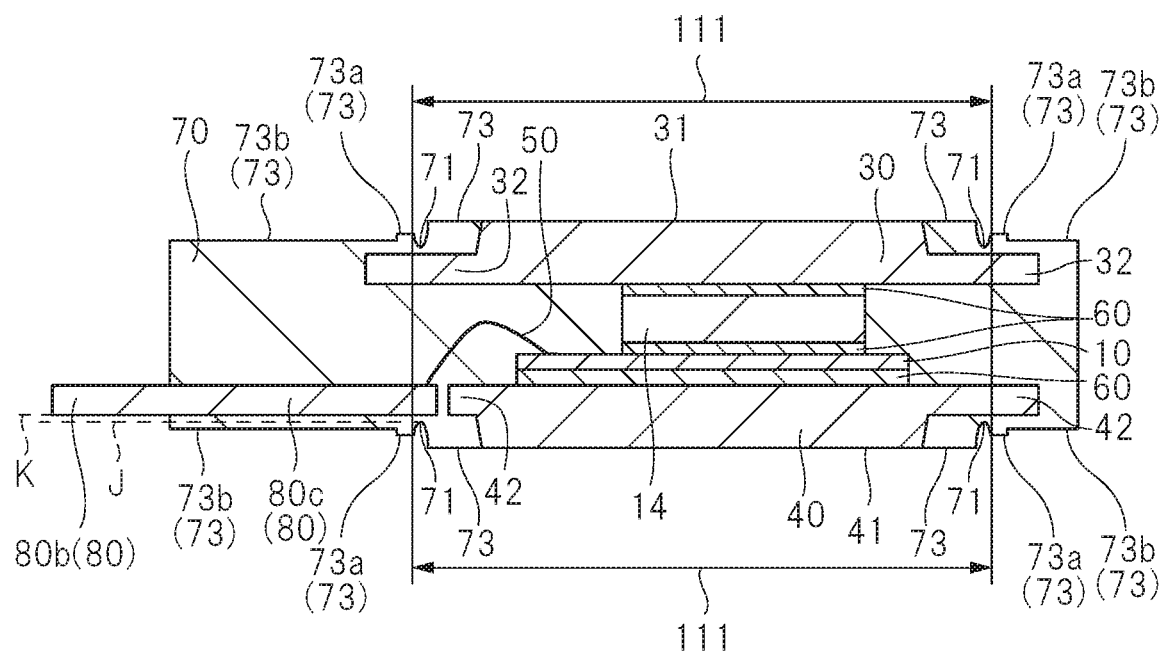
FIG. 55 is a cross-sectional view illustrating a structure after laser irradiation in the assembly of a semiconductor device according to an embodiment.

FIG. 49 is a cross-sectional view illustrating a structure after laser irradiation of a semiconductor device compared by the present inventor, FIG. 50 is a cross-sectional view illustrating a structure after laser irradiation of a semiconductor device compared by the present inventor, FIG. 51 is a cross-sectional view illustrating a structure before laser irradiation in the assembly of a semiconductor device according to the fourth embodiment, and FIG. 52 is a cross-sectional view illustrating a structure before laser irradiation in the assembly of a semiconductor device according to the fourth embodiment. FIG. 53 is a cross-sectional view showing the structure after laser irradiation in the assembly of the semiconductor device of the Fourth Embodiment, FIG. 54 is a perspective view showing an example of the structure of the semiconductor device of the Fourth Embodiment 4, and FIG. 55 is a cross-sectional view showing the structure after laser irradiation in the assembly of the semiconductor device of the Fourth Embodiment.

As shown in the structure of FIG. 49, when the thickness of the upper surface electrode 30 or the lower surface electrode 40 is reduced, the thickness of the resin portion (H 1 portion) on the projecting portion 32 of the upper surface electrode 30 (the same applies to the lower portion of the projecting portion 42 of the lower surface electrode 40) is also reduced. When the resin thickness of the H1 portion is reduced, the minimum resin thickness that can secure the dielectric breakdown voltage is not reached, and as a result, the creepage distance cannot be secured. Further, the projecting portion 32 of the upper surface electrode 30 and the projecting portion 42 of the lower surface electrode 40 are exposed from the groove 71, resulting in a decrease in moisture resistance.

Further, as shown in the structure of FIG. 50, when a lead having a potential different from that of the bottom electrode 40 such as the gate lead 80c is disposed on the bus bar 91 bonded to the bottom electrode 40, for example, a short circuit occurs between the gate lead 80c and the bus bar 91 via the groove 71 as shown in the H2 portion.

Therefore, in the fourth embodiment, in the shape of the sealing body 70 before the laser irradiation, as shown in FIG. 51, the height of the resin surface 77 in the region outside the convex portion 74 of the sealing body 70 is set to two levels. That is, a resin surface 77a having a height lower than that of the electrode surfaces 31 and 41 is formed on the outer side of the convex portion 74, and a resin surface 77b having a height lower than that of the resin surface 77a is formed on the outer side of the resin surface 77a.

In this structure, when the sealing body 70 is formed in the resin molding process shown in FIG. 5, the sealing body 70 is formed so that the height of the resin surface 77 around the convex portion 74 of the sealing body 70 becomes two steps. That is, in the resin molding process, as shown in FIG. 51, a sealing body 70 having a resin surface 77a (middle resin surface 77a) having a height lower than the electrode surfaces 31 and 41 on the outside of the convex portion 74 and a resin surface 77b having a height lower than the resin surface 77 a on the outside of the resin surface 77a is formed (height of the Q portion>height of the R portion>height of the S portion).

This structure is then irradiated with a laser 110 as shown in FIG. 52. That is, the laser 110 is irradiated by making the laser irradiation region 111 larger than the width of the convex portion 74 of the sealing body 70. As a result, since the outer portion of the convex portion 74 in the sealing body 70 (the middle resin surface 77a) is scraped by the laser 110, as shown in FIGS. 53 and 54, a groove 71 is formed at a position outside the electrode surfaces 31 and 41 on the front surface and the back surface of the sealing body 70 so as to surround the electrode surfaces 31 and 41.

Further, in the resin molding process, since the sealing body 70 is formed so that the height of the resin surface 77 around the convex portion 74 of the sealing body 70 becomes two steps, a flat surface (first flat surface) 73a having a height lower than that of the electrode surfaces 31 and 41 is formed in the outer region of the groove 71 by the laser irradiation in the electrode exposure process, as shown in FIG. 53. A second flat surface 73b having a height lower than that of the flat surface 73a is formed in a region outside the flat surface 73a.

In other words, in the sealing body 70, the flat surface 73 located outside the groove 71 has a flat surface (first flat surface) 73a located closer to the center in the thickness direction of the sealing body 70 than the electrode surface 31 or the electrode surface 41, and a flat surface (second flat surface) 73b located at a position outside the flat surface 73a and further closer to the center in the thickness direction (Z direction shown in FIG. 54) of the sealing body 70.

That is, by the laser irradiation in the electrode exposing step, a flat surface 73a having two levels of height (a flat surface 73a having a middle level of height) and a flat surface 73b are formed outside the groove 71.

Also in the MCP 100 of the fourth embodiment, inside the sealing body 70, the projecting portion (some) 32 of the upper surface electrode 30 is disposed below the groove 71 on the upper surface side, and the projecting portion (part) 42 of the lower surface electrode 40 is disposed above the groove 71 on the lower surface side.

In this manner, in the sealing body 70, since the flat surface 73a having the intermediate height is formed outside the groove 71, as shown in FIG. 53, the clearance between the bottom J of the groove 71 and the upper surface K of the protruding portion 32 of the upper surface electrode 30 can be ensured. Further, since the flat surface 73a of the middle level is formed on the upper portions of the projecting portions 32 and 42, the dielectric breakdown voltage can be secured.

In addition, as shown in the part M of FIG. 53, since the groove 71 and the flat surface 73a of the middle height form unevenness on the resin surface, the creepage distance between the upper surface electrode 30 and the lower surface electrode 40 along the sealing body 70 can also be ensured.

In addition, since the flat surface 73a having a middle height is formed outside the groove 71, the projecting portions 32 and 42 of the upper surface electrode 30 and the lower surface electrode 40 can be prevented from being exposed, and moisture resistance deterioration can be prevented.

In addition, as shown in FIG. 55, in the MCP 100, when a lead having a potential different from that of the bottom electrode 40 such as the gate lead 80c is disposed in the vicinity of the bottom electrode 40 and in the vicinity of the back surface of the sealing body 70, a short-circuit between the bus bar 91 and the gate lead 80c shown in FIG. 50 can be prevented by forming a flat surface 73a having a middle height outside the trench 71. In addition, clearance between the bottom J of the groove 71 and the lower surface K of the gate lead 80c can be ensured. Further, when the MCP 100 is mounted on the mounting substrate, short-circuiting between the gate lead 80c and the wiring of the mounting substrate can be prevented.

Note that also in the laser irradiation of the Fourth Embodiment, since the cutting edge is not used, the running cost can be reduced as compared with the case where the upper surface electrode 30 and the lower surface electrode 40 are exposed from the sealing body 70 by cutting using a cutting edge such as a grindstone. Further, by employing laser irradiation to expose the upper surface electrode 30 and the lower surface electrode 40 from the sealing body 70, the productivity of laser irradiation is higher than that of cutting using a cutting blade such as a grindstone, so that the mass productivity of the MCP 100 can be improved.

Next, a modification of the fourth embodiment is described.

Figure 56:
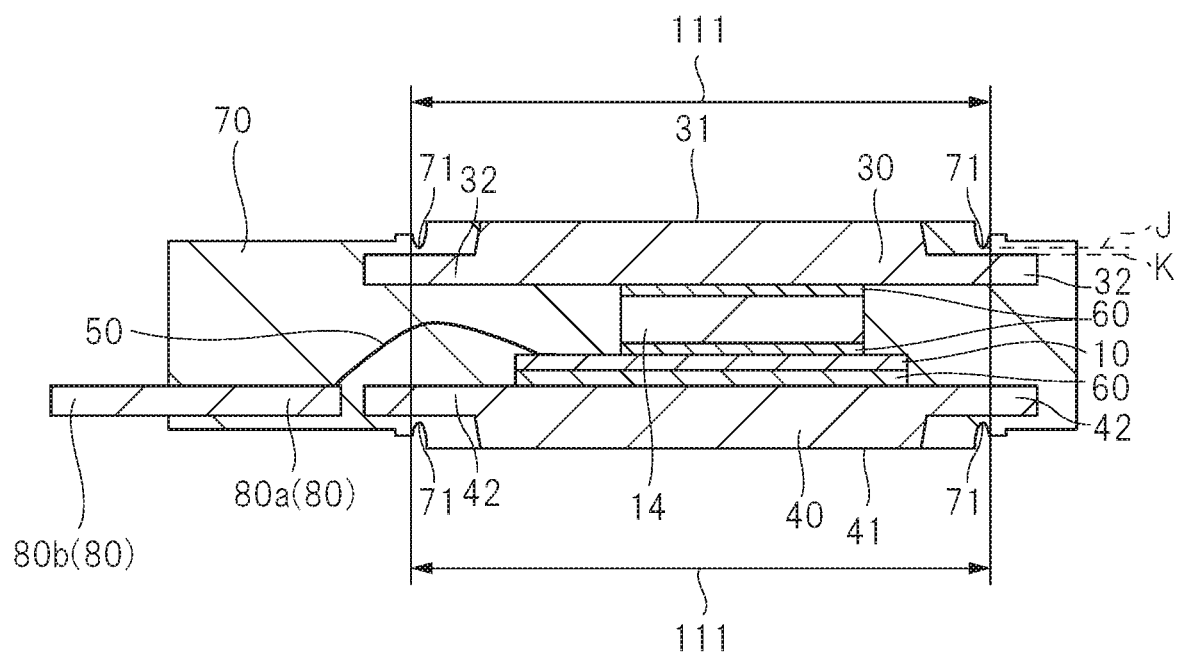
FIG. 56 is a cross-sectional view illustrating the structure after laser irradiation of a semiconductor device compared by the present inventor.
Figure 57:
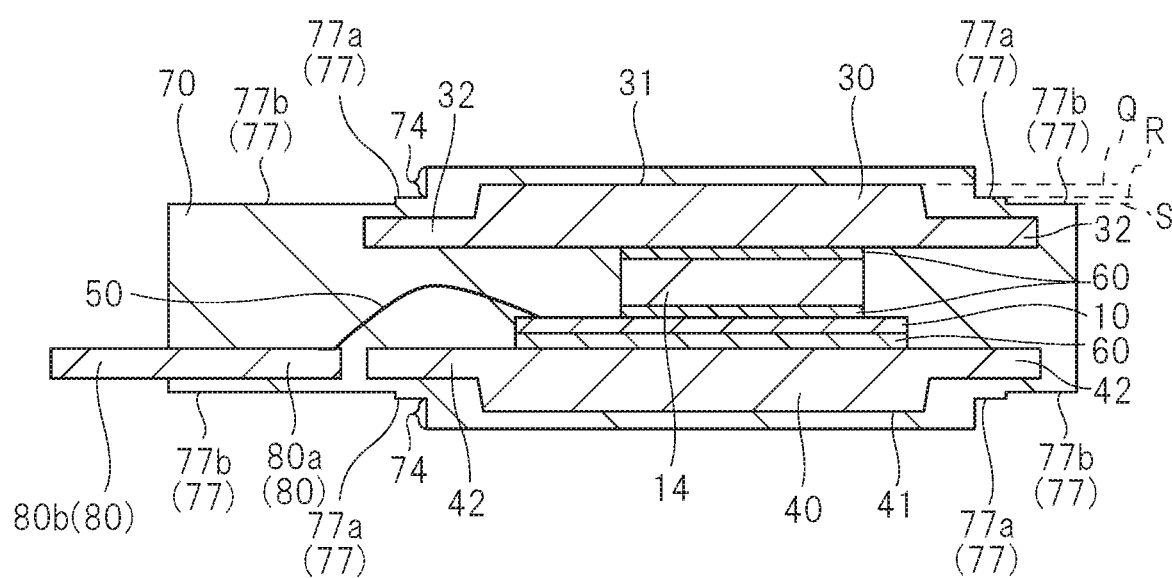
FIG. 57 is a cross-sectional view illustrating a structure prior to laser irradiation in the assembly of a semiconductor device according to a modification of the fourth embodiment 4.
Figure 58:
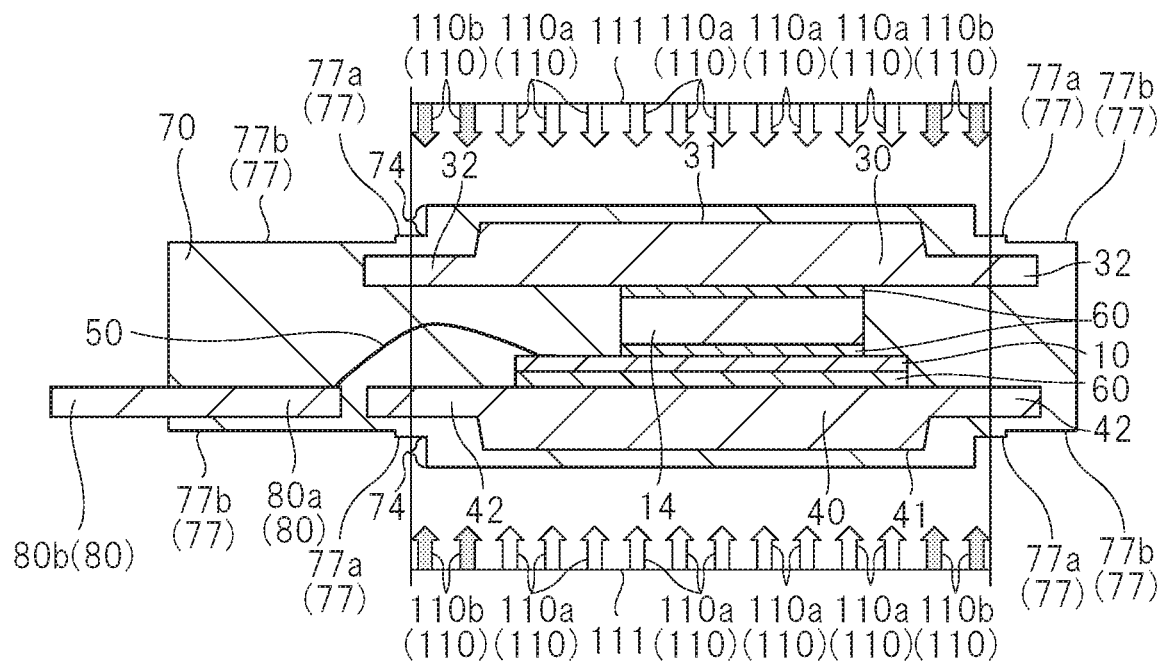
FIG. 58 is a cross-sectional view illustrating a structure prior to laser irradiation in the assembly of a semiconductor device according to a modification of the fourth embodiment.
Figure 59:
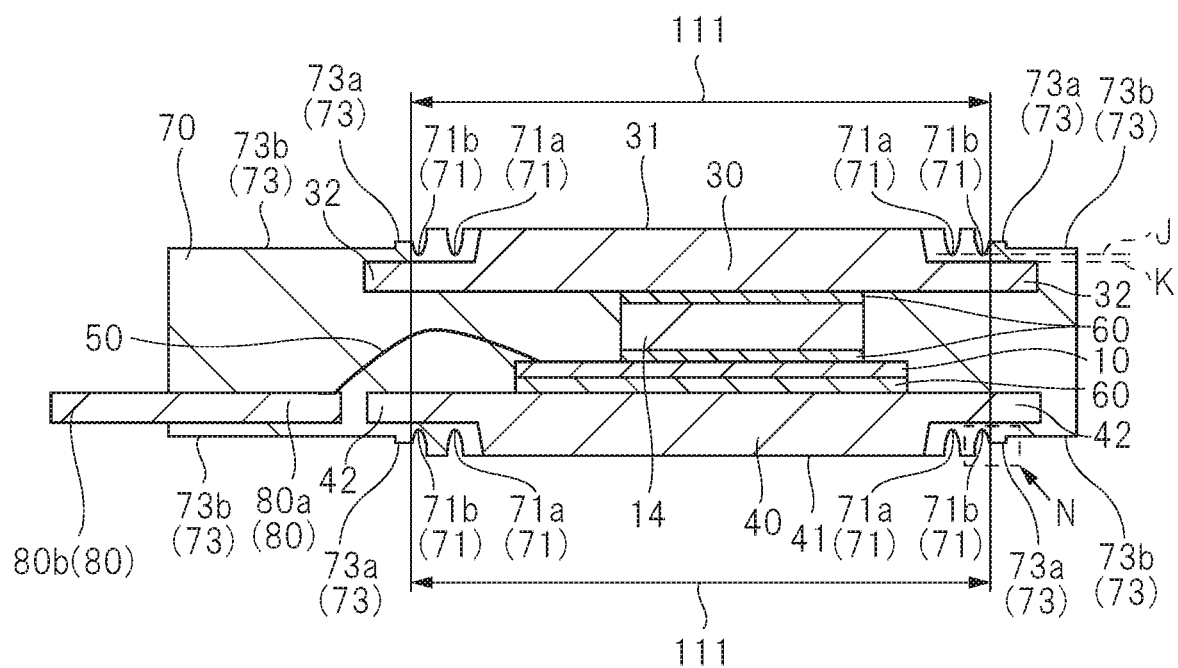
FIG. 59 is a cross-sectional view illustrating a structure after laser irradiation in the assembly of a semiconductor device according to a modification of the fourth embodiment.
Figure 60:
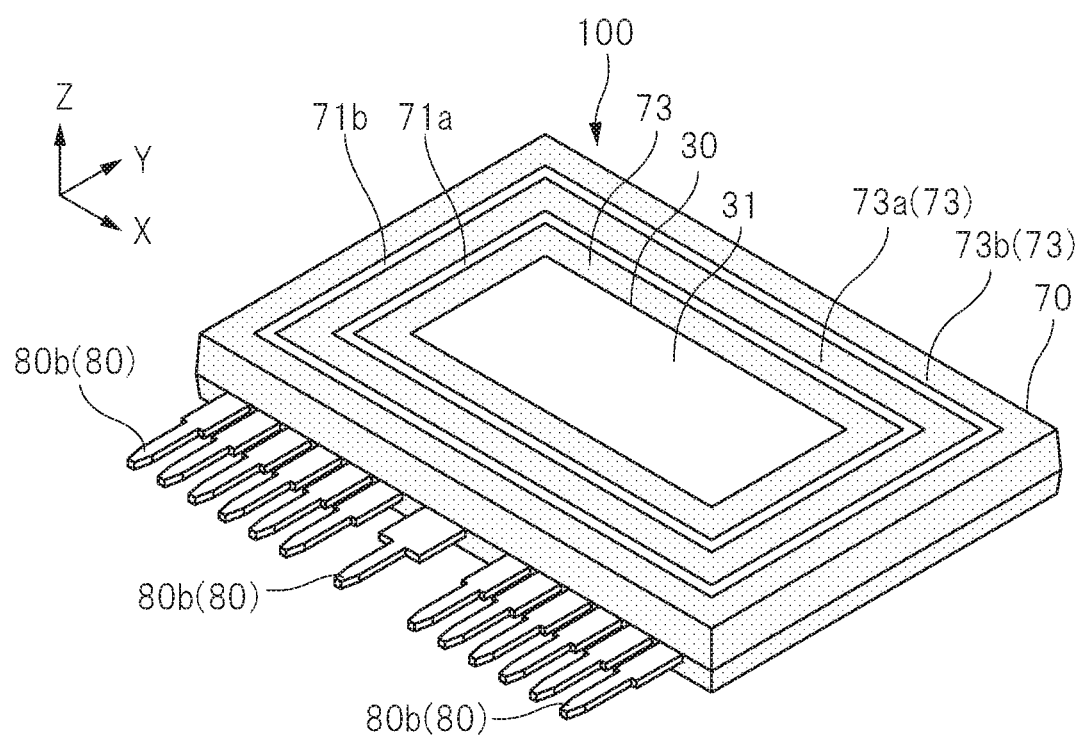
FIG. 60 is a perspective view illustrating a structure of a semiconductor device according to a modification of the fourth embodiment.

FIG. 56 is a cross-sectional view showing the structure after laser irradiation of the semiconductor device comparatively examined by the present inventor, FIG. 57 is a cross-sectional view showing the structure before laser irradiation in the assembly of the semiconductor device of the modification of the fourth embodiment, FIG. 58 is a cross-sectional view showing the structure before laser irradiation in the assembly of the semiconductor device of the modification of the fourth embodiment, and FIG. 59 is a cross-sectional view showing the structure after laser irradiation in the assembly of the semiconductor device of the modification of the fourth embodiment. FIG. 60 is a perspective view showing a structure of a semiconductor device according to a modification of the fourth embodiment.

As shown in the structure of FIG. 57, if the output of the laser 110 is increased in order to reliably remove the resin on the electrode surfaces 31 and 41 in the convex portion 74 of the sealing body 70, the amount of scraping of the resin increases, and it becomes difficult to secure the clearance between the bottom J of the groove 71 and the upper surface K of the protruding portion 32 of the upper surface electrode 30 shown in FIG. 56. In addition, it is difficult to secure the dielectric strength.

Therefore, in the modification of the fourth embodiment, in the shape of the sealing body 70 before the laser irradiation, the height of the resin surface 77 in the region outside the convex portion 74 of the sealing body 70 is set to two levels as shown in FIG. 57. That is, a resin surface 77a having a height lower than that of the electrode surfaces 31 and 41 is formed on the outer side of the convex portion 74, and a resin surface 77b having a height lower than that of the resin surface 77a is formed on the outer side of the resin surface 77a.

In this structure, when the sealing body 70 is formed in the resin molding process shown in FIG. 5, the sealing body 70 is formed so that the height of the resin surface 77 around the convex portion 74 of the sealing body 70 becomes two steps. That is, in the resin molding process, as shown in FIG. 57, a sealing body 70 having a resin surface 77a (middle resin surface 77a) having a height lower than the electrode surfaces 31 and 41 on the outside of the convex portion 74 and a resin surface 77b having a height lower than the resin surface 77a on the outside of the resin surface 77a is formed (height of the Q portion>height of the R portion>height of the S portion).

This structure is then irradiated with a laser 110 as shown in FIG. 58. That is, the laser 110 is irradiated by making the laser irradiation region 111 larger than the width of the convex portion 74 of the sealing body 70. At this time, in the modification of the fourth embodiment, the first laser 110a is irradiated to the region corresponding to the upper surface electrode 30 and the lower surface electrode 40 of the convex portion 74, and the second laser 110b having a smaller output than the first laser 110a is irradiated to the region outside the upper surface electrode 30 and the lower surface electrode 40. Alternatively, the first laser 110a is irradiated a plurality of times, and the second laser 110b is irradiated with a number of times smaller than the number of times of irradiation of the first laser 110a.

That is, the resin on the electrode surfaces 31 and 41 is irradiated with the first laser 110a at a high output. Alternatively, the first laser 110a is irradiated by increasing the number of times of irradiation. On the other hand, the resin corresponding to the outside of the electrode surfaces 31 and 41 is irradiated with the second laser 110b at an output smaller than the output of the first laser 110a. Alternatively, the second laser 110b is irradiated while the number of times of irradiation is smaller than the number of times of irradiation of the first laser 110a.

As a result, in the sealing body 70 shown in FIG. 58, the outer portion of the convex portion 74 (the middle resin surface 77a) is shaved by the laser 110, and the outer portion of the electrode surfaces 31 and 41 in the convex portion 74 is also shaved by the second laser 110b having a small output. As a result, as shown in FIGS. 59 and 60, the first groove 71a is formed at a position outside the electrode surfaces 31 and 41 on the front surface and the back surface of the sealing body 70 so as to surround the electrode surfaces 31 and 41, and the second groove 71b is formed outside the first groove 71a so as to surround the first groove 71a. That is, double grooves 71 (first groove 71a and second groove 71b) are formed around the electrode surfaces 31 and 41.

Further, in the resin molding process, since the sealing body 70 is formed so that the height of the resin surface 77 around the convex portion 74 of the sealing body 70 becomes two steps, a flat surface (first flat surface) 73a having a height lower than the electrode surfaces 31 and 41 is formed in the outer region of the second groove 71b by the laser irradiation in the electrode exposure process, as shown in FIG. 59. A second flat surface 73b having a height lower than that of the flat surface 73a is formed in a region outside the flat surface 73a.

In other words, in the sealing body 70, the flat surface 73 located outside the second groove 71 has a flat surface (first flat surface) 73a located closer to the center in the thickness direction of the sealing body 70 than the electrode surface 31 or the electrode surface 41, and a flat surface (second flat surface) 73b located further closer to the center in the thickness direction (Z direction shown in FIG. 60) of the sealing body 70 at a position outside the flat surface 73a.

That is, also in the modification of the fourth embodiment, a flat surface 73a (a flat surface 73a having a height of a middle level) and a flat surface 73b having a height of two levels are formed outside the second groove 71b by the laser irradiation in the electrode exposure step.

Also in the MCP 100 of the modification of the fourth embodiment, inside the sealing body 70, the projecting portion (part) 32 of the upper electrode 30 is disposed below the second groove 71b on the upper surface side, and the projecting portion (part) 42 of the lower electrode 40 is disposed above the second groove 71b on the lower surface side.

In this manner, in the sealing body 70, since the flat surface 73a of the middle level is formed on the outer side of the second groove 71b located on the outer side of the first groove 71a, the clearance between the bottom J of the second groove 71b and the upper surface K of the protruding portion 32 of the upper surface electrode 30 can be ensured. Further, since the flat surface 73a of the middle level is formed on the upper portions of the projecting portions 32 and 42, the dielectric breakdown voltage can be secured.

Further, as shown in the portion N of FIG. 59, since the second groove 71b and the flat surface 73a at the middle level can form unevenness on the resin surface, the creepage distance between the upper surface electrode 30 and the lower surface electrode 40 along the sealing body 70 can also be ensured.

In addition, since the flat surface 73a having a middle height is formed on the outer side of the second groove 71b, it is possible to prevent the projecting portions 32 and 42 of the upper surface electrode 30 and the lower surface electrode 40 from being exposed, and it is possible to prevent the moisture resistance from deteriorating.

In addition, as shown in FIG. 55, in the MCP 100, when a lead having a potential different from that of the bottom electrode 40 such as the gate lead 80c is disposed in the vicinity of the bottom electrode 40 and in the vicinity of the back surface of the sealing body 70, a short circuit between the bus bar 91 and the gate lead 80c shown in FIG. 50 can be prevented by forming a flat surface 73a having a middle height outside the second trench 71b as shown in FIG. 59. Further, when the MCP 100 is mounted on the mounting substrate, short-circuiting between the gate lead 80c and the wiring of the mounting substrate can be prevented.

Also in the laser irradiation of the modification of the fourth embodiment, since the cutting edge is not used, the running cost can be reduced as compared with the case where the upper surface electrode 30 and the lower surface electrode 40 are exposed from the sealing body 70 by cutting using a cutting edge such as a grindstone. Further, by employing laser irradiation to expose the upper surface electrode 30 and the lower surface electrode 40 from the sealing body 70, the productivity of laser irradiation is higher than that of cutting using a cutting blade such as a grindstone, so that the mass productivity of the MCP 100 can be improved.

Fifth Embodiment

Figure 61:
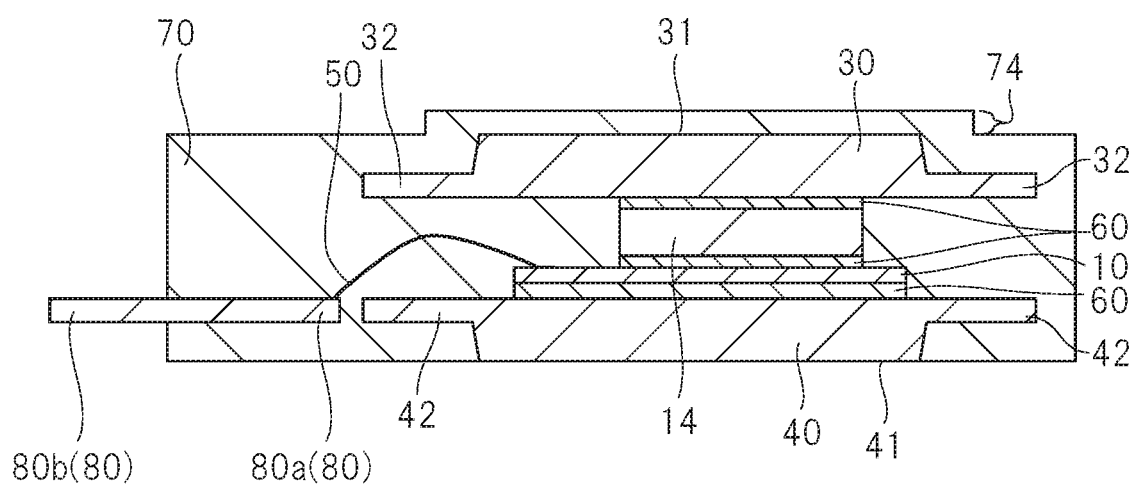
FIG. 61 is a cross-sectional view showing a structure before laser irradiation in assembling the semiconductor device of a Fifth Embodiment.
Figure 62:
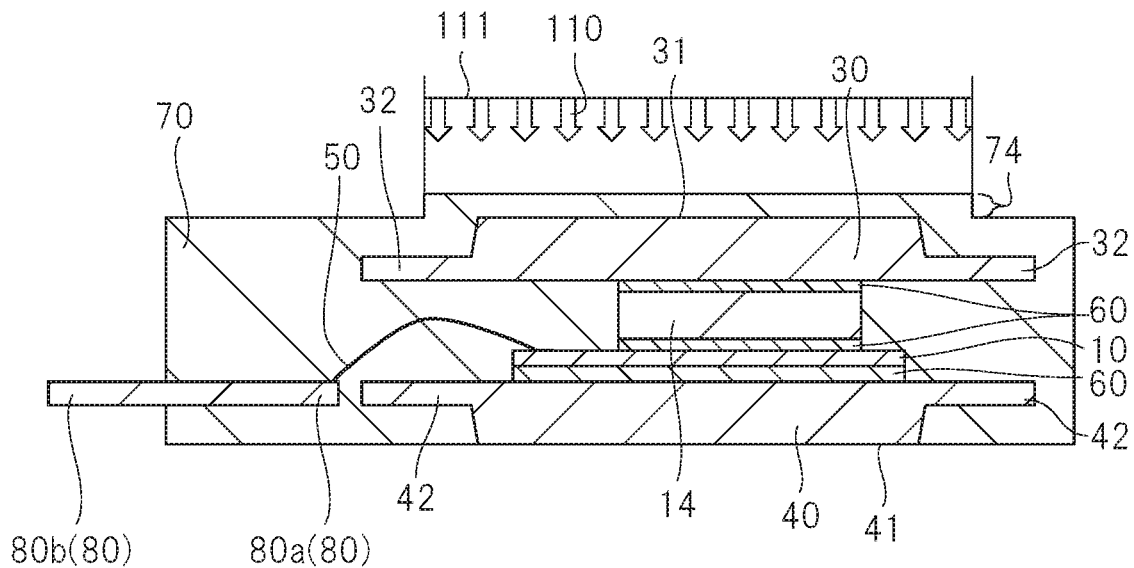
FIG. 62 is a cross-sectional view showing a structure before laser irradiation in assembling the semiconductor device of the Fifth Embodiment.
Figure 63:
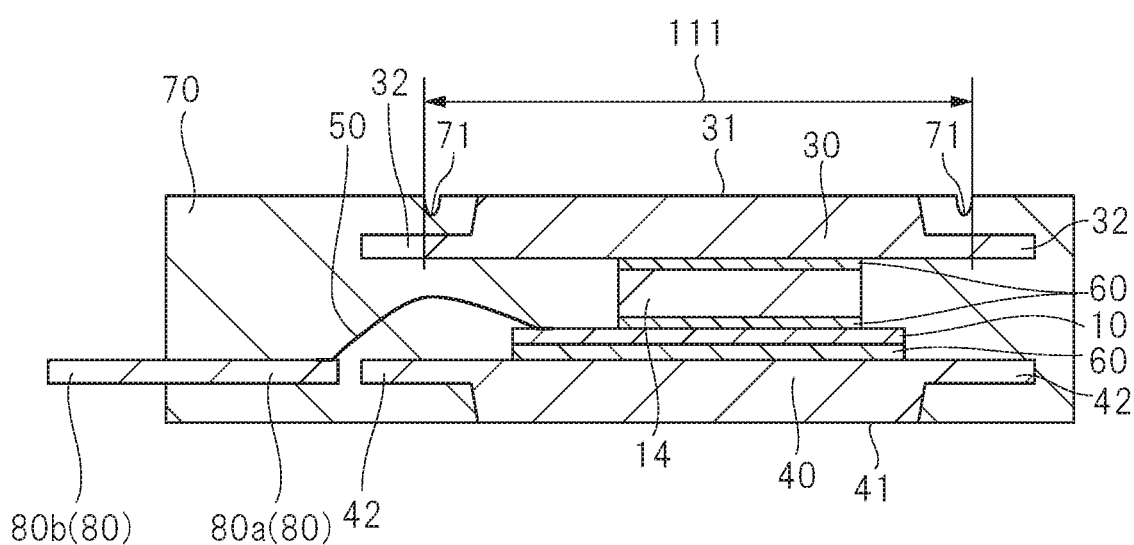
FIG. 63 is a cross-sectional view showing a structure after laser irradiation in assembling the semiconductor device of the Fifth Embodiment.

FIG. 61 is a cross-sectional view illustrating a structure prior to laser irradiation in the assembly of a semiconductor device according to the fifth embodiment; FIG. 62 is a cross-sectional view illustrating a structure prior to laser irradiation in the assembly of a semiconductor device according to the fifth embodiment; and FIG. 63 is a cross-sectional view illustrating a structure after laser irradiation in the assembly of a semiconductor device according to the fifth embodiment.

In the fifth embodiment, in the electrode exposing step, laser irradiation is performed on only one surface of the front surface or the back surface of the sealing body 70 to expose either the electrode surface 31 or the electrode surface 41. In the fifth embodiment, the case of exposing the electrode surface 31 of the upper electrode 30 by laser irradiation on the front surface of the sealing body 70 is described, but the same applies to the case of exposing only the electrode surface 41 of the lower electrode 40 on the back surface.

In the case where only the electrode surface 31 of the upper electrode 30 is exposed by laser irradiation in the electrode exposure step, when the sealing body 70 is formed in the resin molding step shown in FIG. 5, as shown in FIG. 61, the sealing body 70 is formed so that the electrode surface 41 of the lower electrode 40 is exposed on the back surface of the sealing body 70. At this time, in resin molding, resin molding is performed in a state in which a film is disposed on the back surface side of the sealing body 70, that is, the electrode surface 41 of the lower electrode 40, or in a state in which the lower electrode 40 is pressed against a cavity of a mold (not shown).

Thus, in the resin molding process, as shown in FIG. 61, the sealing body 70 can be formed so that the electrode surface 41 of the lower electrode 40 is exposed on the back surface of the sealing body 70.

In addition, in resin molding, as shown in FIG. 62, the sealing body 70 is formed so that the convex portion 74 is disposed on the upper surface electrode 30 with a size slightly wider than the size of the upper surface electrode 30 in the planar direction.

Then, in the electrode exposure step, laser irradiation is performed as shown in FIG. 62. That is, the laser 110 is irradiated onto the surface of the sealing body 70 so that the laser irradiation region 111 is slightly wider than the size of the convex portion 74 of the sealing body 70 in the planar direction. As a result, the laser 110 is also irradiated to the convex portion 74 of the sealing body 70 and the region outside the convex portion 74.

In other words, the length in the width direction of the convex portion 74 of the sealing body 70 is made smaller than the width of the laser irradiation region 111. As a result, clearances can be formed between the edge portions of the convex portions 74 of the sealing body 70 and the end portions of the laser 110 to be irradiated in the electrode-exposing step (laser irradiating step), and stable mass production of the MCP 100 can be improved. That is, the productivity of the MCP 100 can be improved.

Further, as shown in FIG. 62, when the laser irradiation region 111 is made larger than the width of the convex portion 74 of the sealing body 70 and the laser 110 is irradiated, the outer portion of the convex portion 74 of the sealing body 70 is shaved by the laser 110, and therefore, as shown in FIG. 63, a groove 71 is formed on the outer side of the electrode surface 31 on the surface of the sealing body 70 so as to surround the electrode surface 31.

In the assembly of the fifth embodiment, only one surface of the sealing body 70 is irradiated with the laser 110 to expose the electrode surface 31 or the electrode surface 41 from the sealing body 70. As a result, the processing time in the electrode exposure step can be shortened. As a result, the productivity of the MCP 100 can be improved.

Note that also in the laser irradiation of the Fifth Embodiment, since the cutting edge is not used, the running cost can be reduced as compared with the case where the upper surface electrode 30 or the lower surface electrode 40 is exposed from the sealing body 70 by cutting using a cutting edge such as a grindstone. Further, by employing laser irradiation to expose the upper surface electrode 30 or the lower surface electrode 40 from the sealing body 70, the productivity of laser irradiation is higher than that of cutting using a cutting blade such as a grindstone, so that the mass productivity of the MCP 100 can be improved.

Although the invention made by the inventor has been specifically described based on the embodiments, the present invention is not limited to the embodiments described so far, and it is needless to say that various modifications can be made without departing from the gist thereof.

In addition, each of the above-described embodiments and further modified examples can be combined and applied within a range not departing from the gist of the technical idea explained in the above-described the first embodiments to the fifth.

In the first embodiments to the fifth described above, a IGBT such as a power bipolar transistor (Bipolar Transistor) is exemplified as the power element incorporated in the semiconductor device, but a power MOSFET or the like may be used as the element incorporated in the semiconductor device.

In the first embodiments to the fourth, the case where the electrode surfaces 31 and 41 on the front and back surfaces of the sealing body 70 are exposed from the sealing body 70 by laser irradiation has been described. In the fifth embodiment, the case where either the electrode surface 31 or the electrode surface 41 is exposed by laser irradiation on one of the front surface and the back surface of the sealing body 70 has been described. That is, the electrode surface may be exposed from the sealing body 70 by laser irradiation on both the front surface and the back surface of the sealing body 70, or only one of the front surface and the back surface may be exposed.

Further, the groove 71 formed in the sealing body 70 may be both the front surface and the back surface of the sealing body 70, or may be only one of the front surface and the back surface. At this time, the groove 71 may be formed along any one side of the electrode surface, that is, the groove 71 may be formed along only a part of the electrode surface, or may be formed so as to cover the entire electrode surface.

In the first to fifth embodiments described above, the MCP 100 has two semiconductor chips, i.e., the IGBT chip 10 and the diode chip 20, but the MCP 100 may have one semiconductor chip mounted thereon as long as the electrodes are exposed on the front surface and the back surface of the sealing body 70.

Embodiments include the following modes.

1) A first and a second semiconductor chip in which connection electrodes are disposed on the front surface and the back surface, a first plate-shaped conductor portion electrically connected to the connection electrodes on the back surface side of each of the first and second semiconductor chips and disposed on the back surface side, a second plate-shaped conductor portion electrically connected to the connection electrodes on the front surface side of each of the first and second semiconductor chips and disposed on the front surface side, and a sealing body made of resin covering each of the first and second semiconductor chips and the first and the first and second plate-shaped conductor portions, wherein the first plate-shaped conductor portion comprises a first electrode surface exposed on the back surface of the sealing body, wherein the second plate-shaped conductor portion comprises a second electrode surface exposed on the front surface of the sealing body, and wherein the second plate-shaped conductor portion surrounds at least one of the front surface and the back surface of the sealing body in plan view, the first or second plate-shaped conductor portion is formed on the inner surface and the outer surface and the outer surface of the groove. The semiconductor device, wherein the flat surface on the outer side of the groove is disposed closer to the center in the thickness direction of the sealing body than the flat surface on the inner side of the groove.

(Appendix 2) The first and second semiconductor chips each having a connection electrode disposed on each of the front and back surfaces thereof, a first plate-shaped conductor portion electrically connected to the connection electrode on the back surface side of each of the first and second semiconductor chips and disposed on the back surface side, a second plate-shaped conductor portion electrically connected to the connection electrode on the front surface side of each of the first and second semiconductor chips and disposed on the front surface side, and a sealing body made of resin covering each of the first and second semiconductor chips and the first and second plate-shaped conductor portions, wherein the first plate-shaped conductor portion has a first electrode surface exposed on the back surface of the sealing body, wherein the second plate-shaped conductor portion has a second electrode surface exposed on the front surface of the sealing body, and at least one of the front surface and the back surface of the sealing body has a portion of the first or second electrode surface along a portion of the first or the second electrode surface of the groove formed in plan view A semiconductor device in which a portion of the first or second plate-shaped conductor portion is disposed.

What is claimed is:

1. A semiconductor chip having a connection electrode disposed on each of a front surface and a back surface,
a first plate-shaped conductor portion electrically connected to the connection electrode on the back surface side of the semiconductor chip and disposed on the back surface side,
a second plate-shaped conductor portion electrically connected to the connection electrode on the front surface side of the semiconductor chip and disposed on the front surface side, and
a sealing body made of resin covering each of the semiconductor chip and the first and second plate-shaped conductor portions, wherein the first plate-shaped conductor portion has a first electrode surface exposed on the back surface of the sealing body, wherein the second plate-shaped conductor portion has a second electrode surface exposed on the front surface of the sealing body, wherein a groove is formed on at least one of the front surface and the back surface of the sealing body so as to surround the first or second electrode surface in plan view, and the flat surfaces of the sealing body are formed on the inner side and the outer side of the groove, wherein the flat surface formed on the outer side of the groove is disposed closer to the center in the thickness direction of the sealing body than the flat surface formed on the inner side of the groove.

2. The semiconductor device according to claim 1, wherein a part of the first or second plate-shaped conductor portion is disposed below or above the groove.

3. The semiconductor device according to claim 1, wherein grooves are formed on the front surface and the back surface of the sealing body so as to each of the grooves surrounds the first or second electrode surface.

4. The semiconductor device according to claim 1, wherein, on at least one of the front surface and the back surface of the sealing body, the flat surface outside the groove is disposed closer to the center in the thickness direction of the sealing body than the first or second electrode surface.

5. The semiconductor device according to claim 4, wherein the flat surface outside the groove on at least one of the front surface and the back surface of the sealing body has a first flat surface disposed closer to the center in the thickness direction of the sealing body than the first or second electrode surface, and a second flat surface disposed closer to the center in the thickness direction of the sealing body than the first flat surface.

6. The semiconductor device according to claim 5, wherein a part of the first or second plate-shaped conductor portion is disposed below or above the groove.

7. The semiconductor device according to claim 1, wherein a first groove is formed on at least one of the front surface and the back surface of the sealing body so as to surround the first or second electrode surface in plan view, and a second groove is formed outside the first groove so as to surround the first groove.

8. The semiconductor device according to claim 7, wherein, on at least one of the front surface and the back surface of the sealing body, the flat surface outside the second groove has a first flat surface disposed closer to the center in the thickness direction of the sealing body than the first or second electrode surface, and a second flat surface disposed closer to the center in the thickness direction of the sealing body than the first flat surface.

9. A semiconductor device, comprising:

a semiconductor chip having a connection electrode disposed on each of a front surface and a back surface;

a first plate-shaped conductor portion electrically connected to the connection electrode on the back surface side of the semiconductor chip and disposed on the back surface side;

a second plate-shaped conductor portion electrically connected to the connection electrode on the front surface side of the semiconductor chip and disposed on the front surface side; and a sealing body made of resin that covers each of the semiconductor chip and the first and second plate-shaped conductor portions;

wherein the first plate-shaped conductor portion has a first electrode surface exposed on the back surface of the sealing body, the second plate-shaped conductor portion has a second electrode surface exposed on the front surface of the sealing body, a groove is formed along a portion of the first or second electrode surface of at least one of the front surface and the back surface of the sealing body in plan view, and a part of the first or second plate-shaped conductor portion is disposed on a lower portion or an upper portion of the groove.

10. The semiconductor device according to claim 9, wherein a groove is formed on the front surface and the back surface of the sealing body so as to surround the first or second electrode surface.

11. The semiconductor device according to claim 9, wherein a first groove is formed on at least one of the front surface and the back surface of the sealing body so as to surround the first or second electrode surface in plan view, and a second groove is formed outside the first groove so as to surround the first groove.

12. A method of manufacturing a semiconductor device, comprising the steps of:

(a) mounting a semiconductor chip on a first plate-shaped conductor portion;

(b) mounting a second plate-shaped conductor portion on the semiconductor chip after the step (a);

(c) forming a sealing body made of resin to cover the first plate-shaped conductor portion, the semiconductor chip, and the second plate-shaped conductor portion after the step (b);

(d) exposing a part of the second plate-shaped conductor portion on the front surface of the sealing body and exposing a part of the first plate-shaped conductor portion on the back surface of the sealing body after the step (c);

wherein in the step (d), by irradiating a laser on at least one of the front surface and the back surface of the sealing body to expose a part of at least one of the first or second plate-shaped conductor portion from the sealing body.

13. The method of manufacturing a semiconductor device according to claim 12, wherein in the step (c), the sealing body is formed in a convex shape along the shape of the first or second plate-shaped conductor portion, and the laser is irradiated to the convex portion of the sealing body in the step (d).

14. The way of manufacturing a semiconductor device according to claim 12, wherein in the step (d), the laser is irradiated onto the front surface and the back surface of the sealing body, a part of the second plate-shaped conductor portion is exposed on the front surface of the sealing body, and a part of the first plate-shaped conductor portion is exposed on the back surface of the sealing body.

15. The method of manufacturing a semiconductor device according to claim 12, wherein, in the step (d), at least one of the front surface and the back surface of the sealing body is irradiated with a first laser in a region corresponding to the first or second plate-shaped conductor portion, and is irradiated with a second laser to with a smaller output than the first laser in a region outside the first or second plate-shaped conductor portion, or with the second laser whose number of times of irradiation is reduced compared to the first laser.

* * * * *